(12) United States Patent
Takeoka

(10) Patent No.: US 7,475,378 B2
(45) Date of Patent: Jan. 6, 2009

(54) METHOD OF DESIGNING SEMICONDUCTOR INTEGRATED CIRCUIT IN WHICH FAULT DETECTION CAN BE EFFECTED THROUGH SCAN-IN AND SCAN-OUT

(75) Inventor: Sadami Takeoka, Osaka (JP)

(73) Assignee: Panasonic Corporation, Osaka (JP)

( * ) Notice: Subject to any disclaimer, the term of this patent is extended or adjusted under 35 U.S.C. 154(b) by 391 days.

(21) Appl. No.: 11/079,292

(22) Filed: Mar. 15, 2005

(65) Prior Publication Data

US 2005/0188340 A1 Aug. 25, 2005

Related U.S. Application Data

(60) Division of application No. 09/843,687, filed on Apr. 30, 2001, now Pat. No. 7,017,135, which is a continuation of application No. 08/803,145, filed on Feb. 19, 1997, now Pat. No. 6,282,506.

(30) Foreign Application Priority Data

Feb. 20, 1996 (JP) .................................. 8-032152

(51) Int. Cl.
*G06F 17/50* (2006.01)
(52) U.S. Cl. .................... 716/13; 716/4; 716/6; 716/11
(58) Field of Classification Search ...................... 716/4, 716/6, 11, 13
See application file for complete search history.

(56) References Cited

U.S. PATENT DOCUMENTS

| 4,063,080 A | * | 12/1977 | Eichelberger et al. ....... 714/815 |
| 4,703,435 A | | 10/1987 | Darringer et al. |
| 4,860,290 A | | 8/1989 | Daniels et al. |
| 5,043,986 A | | 8/1991 | Agrawal et al. |
| 5,299,136 A | | 3/1994 | Babakanian et al. |
| 5,461,573 A | | 10/1995 | Chakradhar et al. |

(Continued)

FOREIGN PATENT DOCUMENTS

| JP | 07-271845 | 10/1995 |
| JP | 08-087538 | 2/1996 |

OTHER PUBLICATIONS

Steenoma et al.; Partial Scan at the Register-Transfer Level; IEEE; c. 1993; pp. 486-497.

*Primary Examiner*—Thuan Do
(74) *Attorney, Agent, or Firm*—McDermott Will & Emery LLP

(57) ABSTRACT

A method of designing a semiconductor integrated circuit includes steps of selecting a pair of scan registers to be connected as a scan chain and calculating a beeline distance on hardware from each output terminal of the scan register at the front stage to a scan data input terminal of the scan register at the rear stage. The method further includes steps of selecting the output terminal of the scan register at the front stage having a minimum beeline distance on the basis of the above calculation; determining to connect the selected output terminal with the scan data input terminal of the scan register at the rear stage; and forming the scan chain by connecting each pair of scan registers by using the output terminal determined in the previous step.

1 Claim, 26 Drawing Sheets

U.S. PATENT DOCUMENTS

| | | |
|---|---|---|
| 5,513,118 A | 4/1996 | Dey et al. |
| 5,550,749 A | 8/1996 | Dey et al. |
| 5,602,855 A | 2/1997 | Whetsel, Jr. |
| 5,631,911 A | 5/1997 | Whetsel, Jr. |
| 5,684,721 A | 11/1997 | Swoboda et al. |
| 5,761,215 A | 6/1998 | McCarthy et al. |
| 5,852,364 A | 12/1998 | Whetsel |
| 5,884,023 A | 3/1999 | Swoboda et al. |
| 5,987,635 A | 11/1999 | Kishi et al. |
| 2001/0021990 A1* | 9/2001 | Takeoka et al. ........... 716/1 |

* cited by examiner

METHOD OF DESIGNING SEMICONDUCTOR INTEGRATED CIRCUIT IN WHICH FAULT DETECTION CAN BE EFFECTED THROUGH SCAN-IN AND SCAN-OUT

RELATED APPLICATION

This application is a divisional of application Ser. No. 09/843,687, filed Apr. 30. 2001, now U.S. Pat. No. 7,017,135 which is a continuation of application Ser. No. 08/803,145, filed Feb. 19, 1997 and is now U.S. Pat. No. 6,282,506.

BACKGROUND OF THE INVENTION

The present invention relates to a method of designing a semiconductor integrated circuit in which fault detection can be efficiently effected through scan-in and scan-out.

For a scan test for detecting a fault in a semiconductor integrated circuit, the semiconductor integrated circuit is required to be designed so that scan registers, that is, memory elements having a scan test function, are connected with one another to form a scan chain, and the scan chain functions as a shift register in a scan test mode.

In connecting two scan registers for forming a scan chain through the connection of the scan registers, when the scan register at the front stage has two output terminals for positive logic and negative logic, the scan registers are conventionally connected, for example, as follows: The positive logic output terminal alone of the scan register at the front stage is always connected with the scan data input terminal of the scan register at the rear stage; or alternatively, the negative logic output terminal alone of the scan register at the front stage is always connected with the scan data input terminal of the scan register at the rear stage.

Furthermore, as another conventional connection method, when one of the positive and negative logic output terminals of the scan register at the front stage is unconnected, the unconnected output terminal is used for the connection with the scan data input terminal of the scan register at the rear stage. When the two output terminals are both connected with other elements, the positive logic output terminal or the negative logic output terminal is always connected with the scan data input terminal of the scan register at the rear stage.

Now, a conventional method of designing a semiconductor integrated circuit will be described with reference to the accompanying drawings.

FIG. 20 is a circuit diagram of a scan register. In FIG. 20, a reference numeral 10 denotes a scan register for fault detection by the scanning method, a reference numeral 11 denotes a data input terminal for receiving a data in a normal operation mode, a reference numeral 12 denotes a scan data input terminal for receiving a scan data in a scan operation mode, a reference numeral 13 denotes a clock input terminal for synchronizing the scan register 10, a reference numeral 14 denotes an input switch terminal for switching between the normal operation mode and the scan operation mode, a reference numeral 15 denotes a positive logic output terminal for outputting a data having the same value as a data received at the data input terminal 11 or the scan data input terminal 12, and a reference numeral 16 denotes a negative logic output terminal for outputting a data having a value obtained by inverting a data received at the data input terminal 11 or the scan data input terminal 12. When "0" or "1" is input through the input terminal 14, the scan register 10 outputs the data received at the data input terminal 11 and the scan data input terminal 12 through the positive logic output terminal 15 synchronously with a clock signal, and simultaneously outputs, through the negative logic output terminal 16, an inverted signal of the signal output through the positive logic output terminal 15.

In the scan register 10 shown in each drawing herein referred to, the scan data input terminal 12 is indicated as SI, the positive logic output terminal 15 is indicated as Q, and the negative logic output terminal 16 is indicated as NQ for convenience, and the scan data input terminal SI, the positive logic output terminal Q and the negative logic output terminal NQ alone are shown in the drawing.

FIG. 25 is a flow chart for showing interconnecting procedures in the conventional method of designing a semiconductor integrated circuit. In the flow chart of FIG. 25, in step SZ1, connecting order of scan registers is specified; in step SZ2, a pair of scan registers adjacent to each other in the scan chain is selected; in step SZ3, it is discriminated whether or not any of the scan registers has an unconnected output terminal; in step SZ4, a positive logic output terminal is selected when there is no unconnected output terminal; in step SZ5, the unconnected output terminal is selected when there is an unconnected output terminal; in step SZ6, the selected output terminal is connected with the scan data input terminal of a scan register at the rear stage; and in step SZ7, it is discriminated whether or not all the pairs in the scan chain have been processed.

FIG. 21 is a circuit diagram of a semiconductor integrated circuit before connecting scan registers. In FIG. 21, a reference numeral 20B denotes an area for forming the semiconductor integrated circuit before the formation of a scan chain, reference numerals 21 through 25 denote scan registers working as shift registers during the scan test, reference numerals 26 through 32 denote AND gates for outputting "1" merely when two input signals are both "1", reference numerals 33 through 35 are inverters each for outputting an inverted signal of an input signal, a reference numeral 36 denotes a scan-in terminal for receiving a signal for the scan test, and a reference numeral 37 denotes a scan-out terminal for outputting the signal for the scan test. The negative logic output terminal NQ of the scan register 22 and the positive logic output terminal Q of the scan register 25 are not used in the normal operation mode and are unconnected.

FIG. 26 is a circuit diagram obtained by conducting the allocating and interconnecting procedures of FIG. 25 on the semiconductor integrated circuit of FIG. 21. In FIG. 26, a reference numeral 20A denotes an area for allocating the semiconductor integrated circuit after the formation of the scan chain, wherein the positions and the dimensions of respective elements and wires reflect those of actual hardware. Reference numerals 21 through 37 are used to refer to the same composing elements shown in FIG. 21 and the description is omitted. A reference numeral 41Z denotes a wire for connecting the scan register 21 and the scan register 22, a reference numeral 42Z denotes a wire for connecting the scan register 22 and the scan register 23, a reference numeral 43Z denotes a wire for connecting the scan register 23 and the scan register 24, a reference numeral 44Z denotes a wire for connecting the scan register 24 and the scan register 25, and a reference numeral 45Z denotes a wire for connecting the scan register 25 and the scan-out terminal 37.

Now, specific procedures for connecting the respective scan registers by conducting the respective steps of FIG. 25 on the semiconductor integrated circuit before the formation of the scan chain shown in FIG. 21 will be described. First, in step SZ1, it is specified that the scan registers are connected in the order of the scan register 21, the scan register 22, the scan register 23, the scan register 24, the scan register 25 and the scan-out terminal 37.

Next, in step SZ2, the scan register 21 and the scan register 22 are selected as a first pair.

Then, in step SZ3, it is discriminated whether or not the positive logic output terminal Q or the negative logic output terminal NQ of the scan register 21 is unconnected. In this case, there is no unconnected terminal, and hence, the procedure proceeds to step SZ4.

Next, in step SZ4, the positive logic output terminal Q is selected, and in subsequent step SZ6, the selected positive output terminal Q is connected with the scan data input terminal SI of the scan register 22 through the wire 41Z.

Then, in step SZ7, since there remain other pairs of the scan registers, the procedure returns to step SZ2.

Subsequently, in step SZ2, the scan register 22 and the scan register 23 are selected as a next pair. In step SZ3, the negative logic output terminal NQ of the scan register 22 is discriminated to be unconnected, and hence, the procedure proceeds to step SZ5, where the negative logic output terminal NQ is selected.

Then, in step SZ6, the selected negative logic output terminal NQ is connected with the scan data input terminal SI of the scan register 23 through the wire 42Z.

The similar procedures are conducted on the remaining pairs of the scan registers, so that the positive logic output terminal Q of the scan register 23 is connected with the scan data input terminal SI of the scan register 24 through the wire 43Z, that the positive logic output terminal Q of the scan register 24 is connected with the scan data input terminal SI of the scan register 25 through the wire 44Z, and that the positive logic output terminal Q of the scan register 25 is connected with the scan data input terminal SI of the scan-out terminal 37 through the wire 45Z. Thus, the formation of the scan chain is completed.

The conventional method of designing a semiconductor integrated circuit, however, has the following problems: For example, the negative logic output terminal NQ of the scan register 22 shown in FIG. 26 is connected with the scan data input terminal SI of the scan register 23 through the wire 42z. However, a beeline distance between the negative logic output terminal NQ of the scan register 22 and the scan data input terminal SI of the scan register 23 is larger than a beeline distance between the positive logic output terminal Q of the scan register 22 and the scan data input terminal SI of the scan register 23. Therefore, the wire 42Z is elongated as compared with the case for connecting the positive logic output terminal Q of the scan register 22 with the scan data input terminal SI of the scan register 23. Thus, the length of the wire is disadvantageously increased.

Furthermore, the positive logic output terminal Q of the scan register 24 is connected with a larger number of elements than the negative logic output terminal NQ thereof. However, the scan registers 24 and 25 are connected via the positive logic output terminal Q of the scan register 24 uniformly without taking fan-out into consideration. Therefore, a larger load is applied to the positive logic output terminal Q. This results in a problem that delay of a signal from the positive logic output terminal Q of the scan register 24 to the other elements is largely increased in the normal operation mode.

Moreover, for example, in the case where a design margin corresponding to a difference between one cycle time of a clock signal at the positive logic output terminal Q of the scan register 24 and propagation time of a signal from the output terminal of the scan register 24 to the scan data input terminal SI of the scan register 25 is very small, the design margin of the positive logic output terminal Q is further decreased by connecting the positive logic output terminal Q with the scan register 25. This can result in a timing problem that the propagation of the signal cannot be finished within one clock.

Additionally, the conventional method of designing a semiconductor integrated circuit has still another problem that malfunction is caused when there is fluctuation (i.e., time skew) in time of a clock signal arriving at the clock input terminals of the respective scan registers. This problem will now be described with reference to FIGS. 26 through 28.

In FIG. 26, it is assumed that a macrocell A is used as the scan register 22 and macrocells B are used as the scan registers 23 and 24. Each of the macrocells A and B is logically identical to a scan register shown in FIG. 20. In the macrocell A, delay time required of signals entering the SI terminal to reach the Q terminal and the NQ terminal are 3 ns and 1 ns, respectively. In the macrocell B, delay time required of signals entering the SI terminal to reach the Q terminal and the NQ terminal are 1 ns and 3 ns, respectively. Description will be herein made assuming that each wire has no delay time for convenience.

FIGS. 27 and 28 are timing charts for showing the change of signals at the respective terminals of the scan registers 22, 23 and 24 in the circuit diagram of FIG. 26 obtained by the conventional method of designing a semiconductor integrated circuit. In these charts, the change of a signal at the scan data input terminal SI of the scan register 22 is shown as 22.SI, the change of signals at the clock input terminals of the scan registers 22, 23 and 24 are shown as 22.CK, 23.CK and 24.CK, respectively, the change of signals at the negative logic output terminals NQ of the scan registers 22, 23 and 24 are shown as 22.NQ, 23.NQ and 24.NQ, respectively, and the change of signals at the positive logic output terminals Q of the scan registers 22, 23 and 24 are shown as 22.Q, 23.Q and 24.Q, respectively.

FIG. 27 is an ideal timing chart where there is no fluctuation in the time of a clock signal reaching at the clock input terminals of the scan registers 22 through 24. It is assumed that data of 1, 0 and 1 in this order are input to the scan data input terminal SI of the scan register 22 from the positive logic output terminal Q of the scan data 21 at the previous stage synchronously with the clock signal. Each of the negative logic output terminal NQ of the scan register 22 and the positive logic output terminals Q of the scan registers 23 and 24 outputs a data, fetched 1 ns after the input of the clock signal, to the scan data input terminal SI of the scan register at the subsequent stage. Accordingly, the input data is shifted by the scan registers 22, 23 and 24 in accordance with the clock signal, so that the signals at the negative logic output terminal NQ of the scan register 22 and the positive logic output terminals Q of the scan registers 23 and 24 attain values of 0, 1 and 0, respectively after three cycles of the clock signal.

FIG. 28 is a timing chart where the time of the clock signal reaching the scan register 23 is delayed by 2 ns as compared with that reaching the scan registers 22 and 24. In this case, since the clock signal of the scan register 23 is input ins later than the change of the signal input to the scan data input terminal SI of the scan register 23, a new signal obtained immediately after the change at the scan data input terminal SI of the scan register 23, i.e., a signal subsequent to a signal inherently to be fetched, is fetched. Accordingly, the signals at the negative logic output terminal NQ of the scan register 22 and the positive logic output terminals Q of the scan registers 23 and 24 attain values of 0, 0 and 1, respectively after three cycles of the clock signal. Thus, the signal values are different from the expected values obtained in the ideal timing chart of FIG. 27, and hence, malfunction can be caused.

SUMMARY OF THE INVENTION

The present invention was devised to overcome the aforementioned problems. The first object is, in formation of a scan chain of a semiconductor integrated circuit, preventing increase of an interconnection amount, the second object is preventing increase of delay time of a signal, and the third object is preventing data damage due to fluctuation of a clock signal.

For the purpose of achieving the first object, the method of designing a semiconductor integrated circuit of this invention comprises a step of connecting one of plural output terminals of a first memory element with a scan data input terminal of a second memory element having a scan test function, on the basis of layout information.

According to this method, one of the plural output terminals of the first memory element is connected with the scan data input terminal of the second memory element having the scan test function on the basis of the layout information, and hence, the layout of the memory elements as well as wires between the memory elements can be optimized to be shortened. Thus, the increase of the interconnection amount can be prevented.

For the purpose of achieving the first object, the method of designing a semiconductor integrated circuit of this invention comprises an element connecting step of connecting one of plural output terminals of a first memory element with a scan data input terminal of a second memory element having a scan test function, and the element connecting step includes steps of calculating a beeline distance on a substrate from each of the output terminals of the first memory element to the scan data input terminal of the second memory element; and connecting one of the output terminals of the first memory element having a minimum beeline distance to the scan data input terminal of the second memory element with the scan data input terminal of the second memory element.

According to this method, one of the output terminals of the first memory element having the minimum beeline distance on the substrate to the scan data input terminal of the second memory element is connected with the scan data input terminal of the second memory element. Therefore, wires between the first and second memory elements can be shortened, resulting in decreasing the interconnecting area.

For the purpose of achieving the first and second objects, the method of designing a semiconductor integrated circuit of this invention comprises an element connecting step of connecting one of plural output terminals of a first memory element with a scan data input terminal of a second memory element having a scan test function, and the element connecting step includes steps of calculating beeline distances on a substrate from the output terminals of the first memory elements to the scan data input terminal of the second memory element; obtaining a minimum beeline distance among the calculated beeline distances and comparing the minimum beeline distance with another beeline distance; in the case where a difference between the minimum beeline distance and another beeline distance is equal to or smaller than a predetermined value, calculating fan-out of one of the output terminals of the first memory element having the minimum beeline distance and fan-out of another output terminal of the first memory element having the beeline distance with the difference equal to or smaller than the predetermined value; and connecting one of the output terminals of the first memory element having minimum fan-out calculated in the previous step with the scan data input terminal of the second memory element.

According to this method, the fan-out of the output terminal of the first memory element having the minimum beeline distance on the substrate and that of another output terminal having the beeline distance with the difference equal to or smaller than a predetermined value are calculated, so that the output terminal of the first memory element having the minimum fan-out can be connected with the scan data input terminal of the second memory element. Therefore, not only wires between the first and second memory elements can be shortened, but also the load capacitance of the circuit in a normal operation mode can be prevented from increasing, resulting in suppressing the increase of delay time of a signal.

For the purpose of achieving the first and second objects, the method of designing a semiconductor integrated circuit of this invention comprises an element connecting step of connecting one of plural output terminals of a first memory element with a scan data input terminal of a second memory element having a scan test function, and the element connecting step includes steps of calculating beeline distances on a substrate from the output terminals of the first memory element to the scan data input terminal of the second memory element; obtaining a minimum beeline distance among the calculated beeline distances and comparing the minimum beeline distance with another beeline distance; in the case where a difference between the minimum beeline distance and another beeline distance is equal to or smaller than a predetermined value, load capacitances of one of the output terminals of the first memory element having the minimum beeline distance and another output terminal of the first memory element having the beeline distance with the difference equal to or smaller than the predetermined value; and connecting one of the output terminals of the first memory element having a minimum load capacitance calculated in the previous step with the scan data input terminal of the second memory element.

According to this method, the load capacitances of the output terminal of the first memory element having the minimum beeline distance on the substrate and another output terminal having the beeline distance with the difference equal to or smaller than a predetermined value are calculated, so that the output terminal of the first memory element having the minimum load capacitance can be connected with the scan data input terminal of the second memory element. Therefore, not only wires between the first and second memory elements can be shortened, but also the load capacitance of the circuit in a normal operation mode can be prevented from increasing, resulting in suppressing the increase of delay time of a signal.

For the purpose of achieving the first object, the method of designing a semiconductor integrated circuit of this invention comprises an element connecting step of connecting one of plural output terminals of a first memory element with a scan data input terminal of a second memory element having a scan test function, and the element connecting step includes steps of calculating wire lengths to be laid from the output terminals of the first memory element to the scan data input terminal of the second memory element; and connecting one of the output terminals of the first memory element having a minimum wire length with the scan data input terminal of the second memory element.

According to this method, one of the output terminals of the first memory element having the minimum actual wire length to be laid to the scan data input terminal of the second memory element can be connected with the scan data input terminal of the second memory element. Therefore, the wires between the first and second memory elements can be definitely shortened, resulting in further decreasing the interconnecting area.

For the purpose of achieving the first and second objects, the method of designing a semiconductor integrated circuit of this invention comprises an element connecting step of connecting one of plural output terminals of a first memory element with a scan data input terminal of a second memory element having a scan test function, and the element connecting step includes steps of calculating wire lengths to be laid from the output terminals of the first memory element to the scan data input terminal of the second memory element; obtaining a minimum wire length among the calculated wire lengths and comparing the minimum wire length with another wire length; in the case where a difference between the minimum wire length and another wire length is equal to or smaller than a predetermined value, calculating fan-out of one of the output terminals of the first memory element having the minimum wire length and fan-out of another output terminal of the first memory element having the wire length with the difference equal to or smaller than the predetermined value; and connecting one of the output terminals of the first memory element having minimum fan-out calculated in the previous step with the scan data input terminal of the second memory element.

According to this method, the fan-out of the output terminal of the first memory element having the minimum actual wire length and that of another output terminal having the wire length with the difference equal to or smaller than a predetermined value are calculated, so that the output terminal of the first memory element having the minimum fan-out can be connected with the scan data input terminal of the second memory element. Therefore, not only wires between the first and second memory elements can be definitely shortened, but also the load capacitance of the circuit in a normal operation mode can be prevented from increasing, resulting in suppressing the increase of delay time of a signal.

For the purpose of achieving the first and second objects, the method of designing a semiconductor integrated circuit of this invention comprises an element connecting step of connecting one of plural output terminals of a first memory element with a scan data input terminal of a second memory element having a scan test function, and the element connecting step includes steps of calculating wire lengths to be laid from the output terminals of the first memory element and to scan data input terminal of the second memory element; obtaining a minimum wire length among the calculated wire lengths and comparing the minimum wire length with another wire length; in the case where a difference between the minimum wire length and another wire length is equal to or smaller than a predetermined value, calculating load capacitances of one of the output terminals of the first memory element having the minimum wire length and another output terminal of the first memory element having the wire length with the difference equal to or smaller than the predetermined value; and connecting one of the output terminals of the first memory element having a minimum load capacitance calculated in the previous step with the scan data input terminal of the second memory element.

According to this method, the load capacitances of the output terminal of the first memory element having the minimum actual wire length and another output terminal having the wire length with the difference equal to or smaller than a predetermined value are calculated, so that the output terminal of the first memory element having the minimum load capacitance can be connected with the scan data input terminal of the second memory element. Therefore, not only wires between the first and second memory elements can be definitely shortened, but also the load capacitance of the circuit in a normal operation mode can be prevented from increasing, resulting in suppressing the increase of delay time of a signal.

For the purpose of achieving the second object, the method of designing a semiconductor integrated circuit of this invention comprises an element connecting step of connecting one of plural output terminals of a first memory element with a scan data input terminal of a second memory element having a scan test function, and the element connecting step includes steps of calculating fan-out of the output terminals of the first memory element; and connecting one of the output terminals having minimum fan-out with the scan data input terminal of the second memory element.

According to this method, one of the output terminals of the first memory element having the minimum fan-out can be connected with the scan data input terminal of the second memory element. Therefore, the load capacitance of the circuit in a normal operation mode can be prevented from increasing, and hence, the increase of delay time of a signal can be suppressed.

For the purpose of achieving the first and second objects, the method of designing a semiconductor integrated circuit of this invention comprises an element connecting step of connecting one of plural output terminals of a first memory element with a scan data input terminal of a second memory element having a scan test function, and the element connecting step includes steps of calculating fan-out of the output terminals of the first memory element; obtaining minimum fan-out among the calculated fan-out and comparing the minimum fan-out with another fan-out; in the case where a difference between the minimum fan-out and another fan-out is equal to or smaller than a predetermined value, calculating beeline distances on a substrate from one of the output terminals of the first memory element having the minimum fan-out and from another output terminal of the first memory element having the fan-out with the difference equal to or smaller than the predetermined value to the scan data input terminal of the second memory element; and connecting one of the output terminals of the first memory element having a minimum beeline distance calculated in the previous step with the scan data input terminal of the second memory element.

According to this method, the beeline distances on the substrate from the output terminal of the first memory element having the minimum fan-out and another output terminal having the fan-out with the difference equal to or smaller than a predetermined value are calculated, so that the output terminal of the first memory element having the minimum beeline distance can be connected with the scan data input terminal of the second memory element. Therefore, not only wires between the first and second memory elements can be shortened, but also the load capacitance of the circuit in a normal operation mode can be prevented from increasing. Accordingly, the interconnecting area can be decreased as well as the increase of the delay time of a signal can be suppressed.

For the purpose of achieving the first and second objects, the method of designing a semiconductor integrated circuit of this invention comprises an element connecting step of connecting one of plural output terminals of a first memory element with a scan data input terminal of a second memory element having a scan test function, and the element connecting step includes steps of calculating fan-out of the output terminals of the first memory element; obtaining minimum fan-out among the calculated fan-out and comparing the minimum fan-out with another fan-out; in the case where a difference between the minimum fan-out and another fan-out is equal to or smaller than a predetermined value, calculating wire lengths to be laid from one of the output terminals of the first memory element having the minimum fan-out and from another output terminal of the first memory element having the fan-out with the difference equal to or smaller than the predetermined value to the scan data input terminal of the second memory element; and connecting one of the output terminals of the first memory element having a minimum wire length calculated in the previous step with the scan data input terminal of the second memory element.

According to this method, the actual wire length to be laid to the scan data input terminal of the second memory element from the output terminal of the first memory element having the minimum fan-out and another output terminal having the fan-out with the difference equal to or smaller than a predetermined value are calculated, so that the output terminal of the first memory element having the minimum wire length can be connected with the scan data input terminal of the second memory element. Therefore, not only wires between the first and second memory elements can be shortened, but also the load capacitance of the circuit in a normal operation mode can be prevented from increasing. Accordingly, the interconnecting area can be definitely decreased as well as the increase of the delay time of a signal can be suppressed.

For the purpose of achieving the second objects, the method of designing a semiconductor integrated circuit of this invention comprises a step of connecting one of plural output terminals of a first memory element with a scan data input terminal of a second memory element having a scan test function, on the basis of timing information.

According to this method, one of the output terminals of the first memory element can be connected with the scan data input terminal of the second memory element on the basis of the timing information. Therefore, the propagation time of a signal between the memory elements to be connected can be optimized to be shortened, resulting in avoiding the increase of the delay time of a signal.

For the purpose of achieving the second object, the method of designing a semiconductor integrated circuit of this invention comprises an element connecting step of connecting one of plural output terminals of a first memory element with a scan data input terminal of a second memory element having a scan test function, and the element connecting step includes steps of calculating load capacitances of the output terminals of the first memory element; and connecting one of the output terminals of the first memory element having a minimum load capacitance with the scan data input terminal of the second memory element.

According to this method, one of the output terminals of the first memory element having the minimum load capacitance can be connected with the scan data input terminal of the second memory element. Therefore, the increase of the load capacitance of the circuit in a normal operation mode can be prevented, resulting in suppressing the delay time of a signal from increasing.

For the purpose of achieving the first and second objects, the method of designing a semiconductor integrated circuit of this invention comprises an element connecting step of connecting one of plural output terminals of a first memory element with a scan data input terminal of a second memory element having a scan test function, and the element connecting-step includes steps of calculating load capacitances of the output terminals of the first memory element; obtaining a minimum load capacitance among the calculated load capacitances and comparing the minimum load capacitance with another load capacitance; in the case where a difference between the minimum load capacitance and another load capacitance is equal to or smaller than a predetermined value, calculating beeline distances on a substrate from one of the output terminals of the first memory element having the minimum load capacitance and another output terminal of the first memory element having the load capacitance with the difference equal to or smaller than the predetermined value to the scan data input terminal of the second memory element; and connecting one of the output terminals having a minimum beeline distance calculated in the previous step with the scan data input terminal of the second memory element.

According to this method, the beeline distances on the substrate to the scan data input terminal of the second memory element from the output terminal of the first memory element having the minimum load capacitance and another output terminal having the load capacitance with the difference equal to or smaller than a predetermined value are calculated, so that the output terminal of the first memory element having the minimum beeline distance can be connected with the scan data input terminal of the second memory element. Therefore, not only wires between the first and second memory elements can be shortened, but also the load capacitance of the circuit in a normal operation mode can be prevented from increasing. Accordingly, the interconnecting area can be decreased as well as the increase of the delay time of a signal can be suppressed.

For the purpose of achieving the first and second objects, the method of designing a semiconductor integrated circuit of this invention comprises an element connecting step of connecting one of plural output terminals of a first memory element with a scan data input terminal of a second memory element having a scan test function, and the element connecting step includes steps of calculating load capacitances of the output terminals of the first memory element; obtaining a minimum load capacitance among the calculated load capacitances and comparing the minimum load capacitance with another load capacitance; in the case where a difference between the minimum load capacitance and another load capacitance is equal to or smaller than a predetermined value, calculating wire lengths to be laid from one of the output terminals of the first memory element having the minimum load capacitance and another output terminal of the first memory element having the load capacitance with the difference equal to or smaller than the predetermined value to the scan data input terminal of the second memory element; and connecting one of the output terminals of the first memory element having a minimum wire length calculated in the previous step with the scan data input terminal of the second memory element.

According to this method, the actual wire lengths to be laid to the scan data input terminal of the second memory element from the output terminal of the first memory element having the minimum load capacitance and another output terminal having the load capacitance with the difference equal to or smaller than a predetermined value are calculated, so that the output terminal of the first memory element having the minimum wire length can be connected with the scan data input terminal of the second memory element. Therefore, not only wires between the first and second memory elements can be definitely shortened, but also the load capacitance of the circuit in a normal operation mode can be prevented from increasing. Accordingly, the interconnecting area can be definitely decreased as well as the increase of the delay time of a signal can be definitely suppressed.

For the purpose of achieving the second object, the method of designing a semiconductor integrated circuit of this invention comprises an element connecting step of connecting one of plural output terminals of a first memory element with a scan data input terminal of a second memory element having a scan test function, and the element connecting step includes a step of selecting one of the output terminals of the first memory element having a maximum driving ability and connecting the selected output terminal with the scan data input terminal of the second memory element.

According to this method, one of the output terminals of the first memory element having the maximum driving ability is selected to be connected with the scan data input terminal of the second memory element. Therefore, even when the output terminals have the same load capacitance, the delay time can be shortened, resulting in suppressing the increase of the delay time of a signal.

In one aspect of the method of designing a semiconductor integrated circuit, the element connecting step preferably further includes a step of discriminating whether or not there exist any unconnected output terminals among the output terminals of the first memory element, and in the case where unconnected output terminals exist, selecting one of the unconnected output terminals having a maximum driving ability. In such a case, one of the output terminals of the first memory element having the maximum driving ability can be selected to be connected, and additionally, an unconnected output terminal can be priorly selected. Accordingly, the delay time of a signal can be definitely suppressed from increasing.

For the purpose of achieving the second object, the method of designing a semiconductor integrated circuit of this invention comprises an element connecting step of connecting one of plural output terminals of a first memory element with a scan data input terminal of a second memory element having a scan test function, and the element connecting step includes a step of connecting one of the output terminals of the first memory element having a design margin larger than a predetermined value with the scan data input terminal of the second memory element, the design margin being obtained as a difference between one cycle time of a clock signal and propagation time required for a signal to travel from each of the output terminals of the first memory element to another memory element or an external output port.

According to this method, one of the output terminals of the first memory element having the maximum design margin can be connected with the scan data input terminal of the second memory element. Therefore, the delay time of a signal can be suppressed from increasing, resulting in decreasing possibility of occurrence of a problem in operation timing.

For the purpose of achieving the second object, the method of designing a semiconductor integrated circuit of this invention comprises an element connecting step of connecting one of plural output terminals of a first memory element with a scan data input terminal of a second memory element having a scan test function, and the element connecting step includes steps of on the assumption that each of the output terminals of the first memory element is connected with the scan data input terminal of the second memory element, calculating a design margin of each of the output terminals of the first memory element as a difference between one cycle time of a clock signal and propagation time required for a signal to travel from each of the output terminals of the first memory element to another memory element or an external output port; and connecting one of the output terminals of the first memory element having a design margin calculated in the previous step larger than a predetermined value with the scan data input terminal of the second memory element.

According to this method, each of the output terminals of the first memory element is assumed to be connected with the scan data input terminal of the second memory element, and the design margin of each output terminal of the first memory element is calculated, so that the output terminal of the first memory element having the maximum design margin can be connected with the scan data input terminal of the second memory element. Therefore, the delay time of a signal can be definitely suppressed from increasing, resulting in further decreasing the possibility of the occurrence of a problem in operation timing.

For the purpose of achieving the third object, the method of designing a semiconductor integrated circuit of this invention comprises an element connecting step of connecting one of plural output terminals of a first memory element having a scan data input terminal with a scan data input terminal of a second memory element having a scan test function, and the element connecting step includes a step of selecting one of the output terminals of the first memory element having maximum delay time of a signal received at the scan data input terminal of the first memory element and connecting the selected output terminal with the scan data input terminal of the second memory element.

According to this method, one of the output terminals of the first memory element having the maximum delay time of a signal received at the scan data input terminal of the first memory element can be connected with the scan data input terminal of the second memory element. Therefore, the scan data input terminal of the second memory element receives a data at delayed timing. As a result, the data can be prevented from being damaged due to clock skew in the scan chain.

DETAILED DESCRIPTION OF THE INVENTION

EMBODIMENT 1

Figure 20:
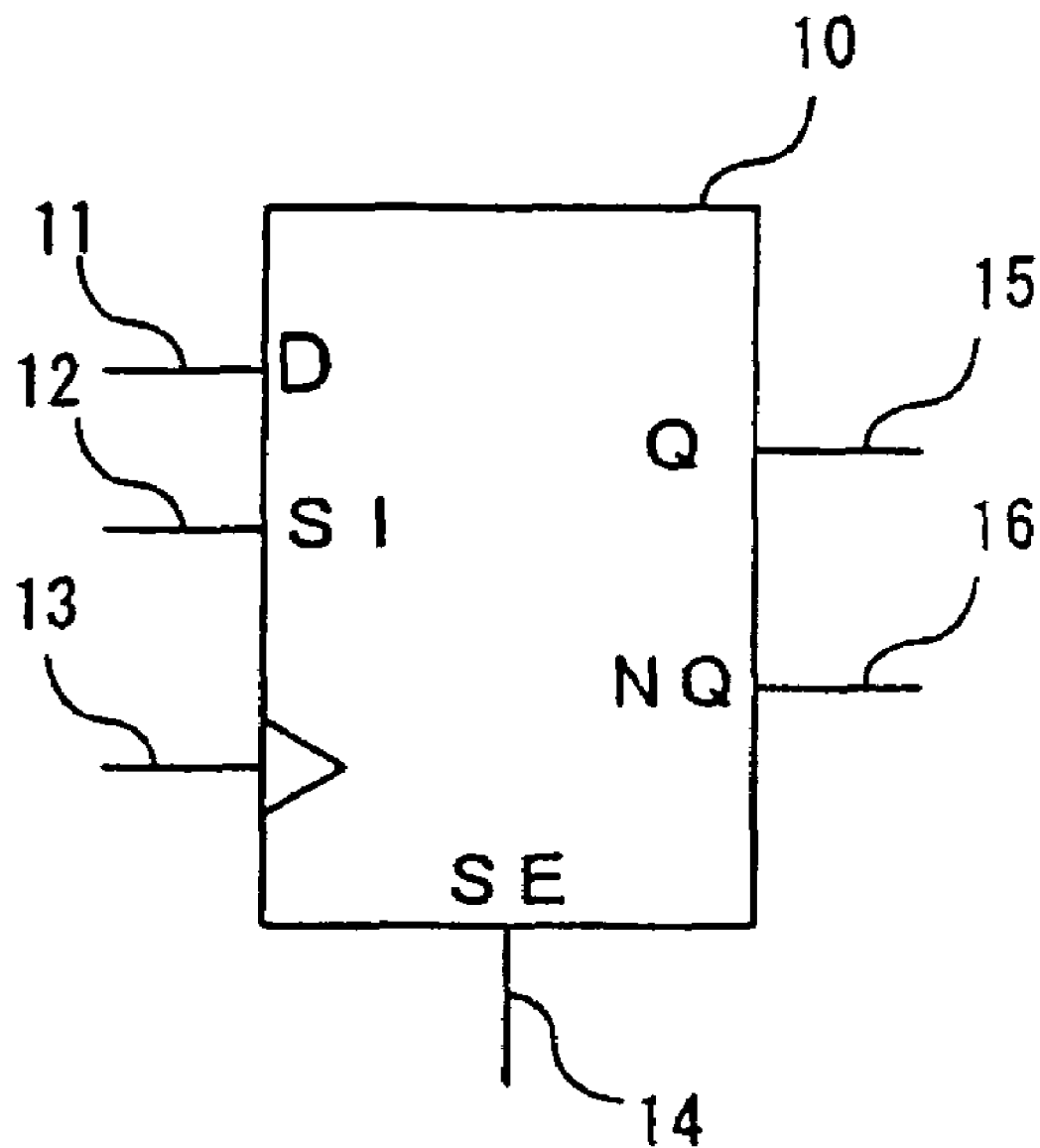
FIG. 20 is a circuit diagram of a scan register for conducting a scan test.

A method of designing a semiconductor integrated circuit according to a first embodiment of the invention will now be described with reference to the accompanying drawings. FIG. 20 is a circuit diagram of a scan register also referred to in the description of the conventional method of designing a semiconductor integrated circuit. Description on respective terminals of the scan register 10 of FIG. 20 is herein omitted. Also, in the scan register shown in each drawing hereafter referred to, a scan data input terminal 12 is indicated as SI, a positive logic output terminal 15 is indicated as Q and a negative logic output terminal 16 is indicated as NQ, and the scan data input terminal SI, the positive logic output terminal Q and the negative logic output terminal NQ alone are shown in the drawing.

Figure 1:
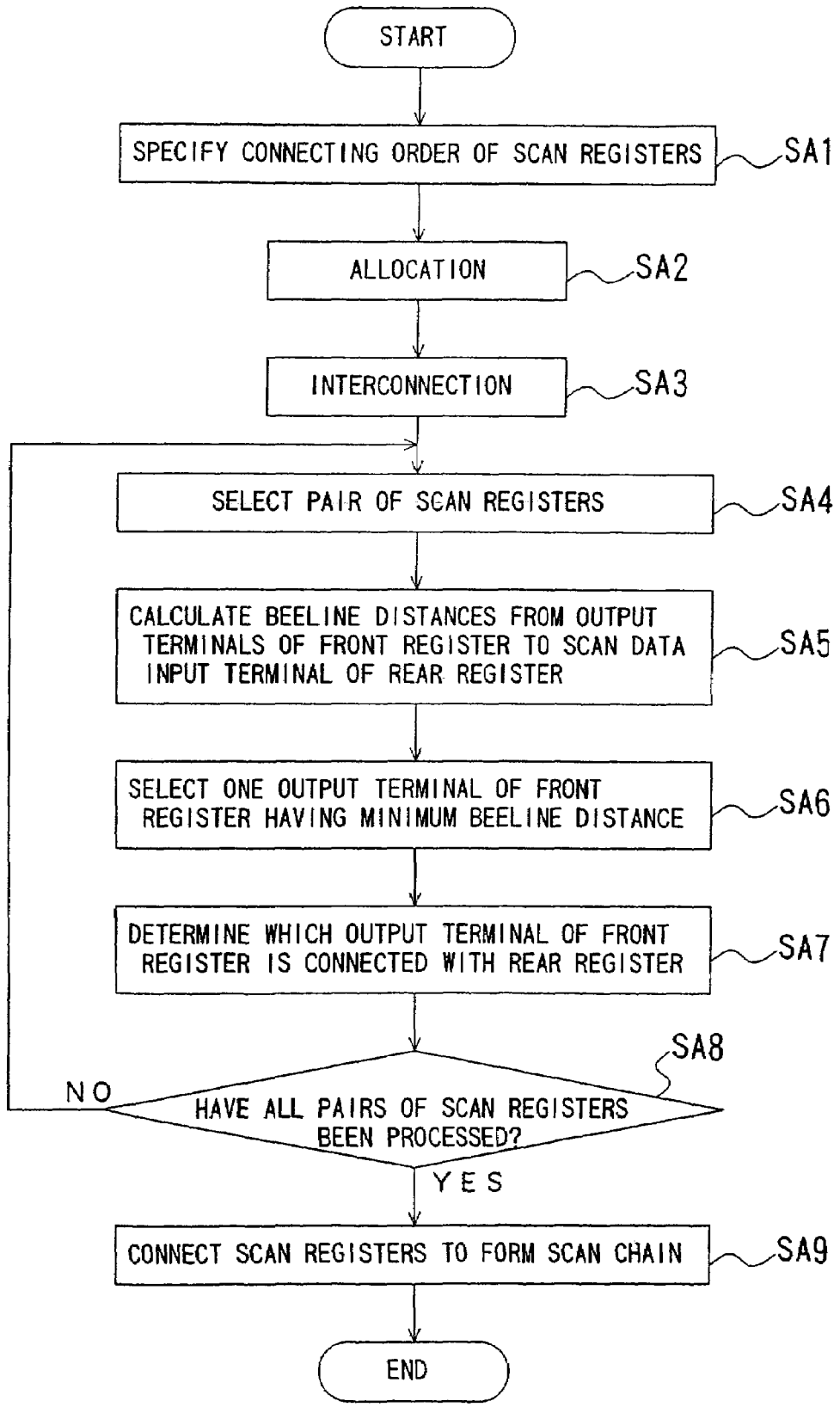
FIG. 1 is a flow chart for showing a method of designing a semiconductor integrated circuit according to a first embodiment of the invention.

FIG. 1 is a flow chart for showing the method of designing a semiconductor integrated circuit of this embodiment. In the flow chart of FIG. 1, the connecting order of scan registers is specified in step SA1; respective elements of the semiconductor integrated circuit are allocated in step SA2; signal lines except wires for forming a scan chain are connected in step SA3; a pair of scan registers adjacent in the scan chain is selected in step SA4; beeline distances from output terminals, namely, terminals working as scan-in terminals, of the scan register at the front stage of the pair of scan registers selected in step SA4 to a scan data input terminal, namely, a terminal working as a scan-out terminal, of the scan register at the rear stage on hardware corresponding to a substrate of the semiconductor integrated circuit are calculated in step SA5; one of the output terminals of the scan register at the front stage having the minimum beeline distance to the scan data input terminal of the scan register at the rear stage is selected in step SA6; it is determined which output terminal of the scan register at the front stage is connected with the scan data input terminal of the scan register at the rear stage in step SA7; it is determined whether or not all pairs of scan registers in the scan chain are completed to be processed in step SA8; and in step SA9, the output terminal of the scan register at the front stage is connected with the scan data input terminal of the scan register at the rear stage as determined in step SA7.

In step SA4, a combination of the scan register at the last stage and a scan-out terminal is also treated as a pair of scan registers in the scan chain. In step SA7, the output terminal having the minimum beeline distance selected in step SA6 is uniformly determined to be connected.

Figure 2:
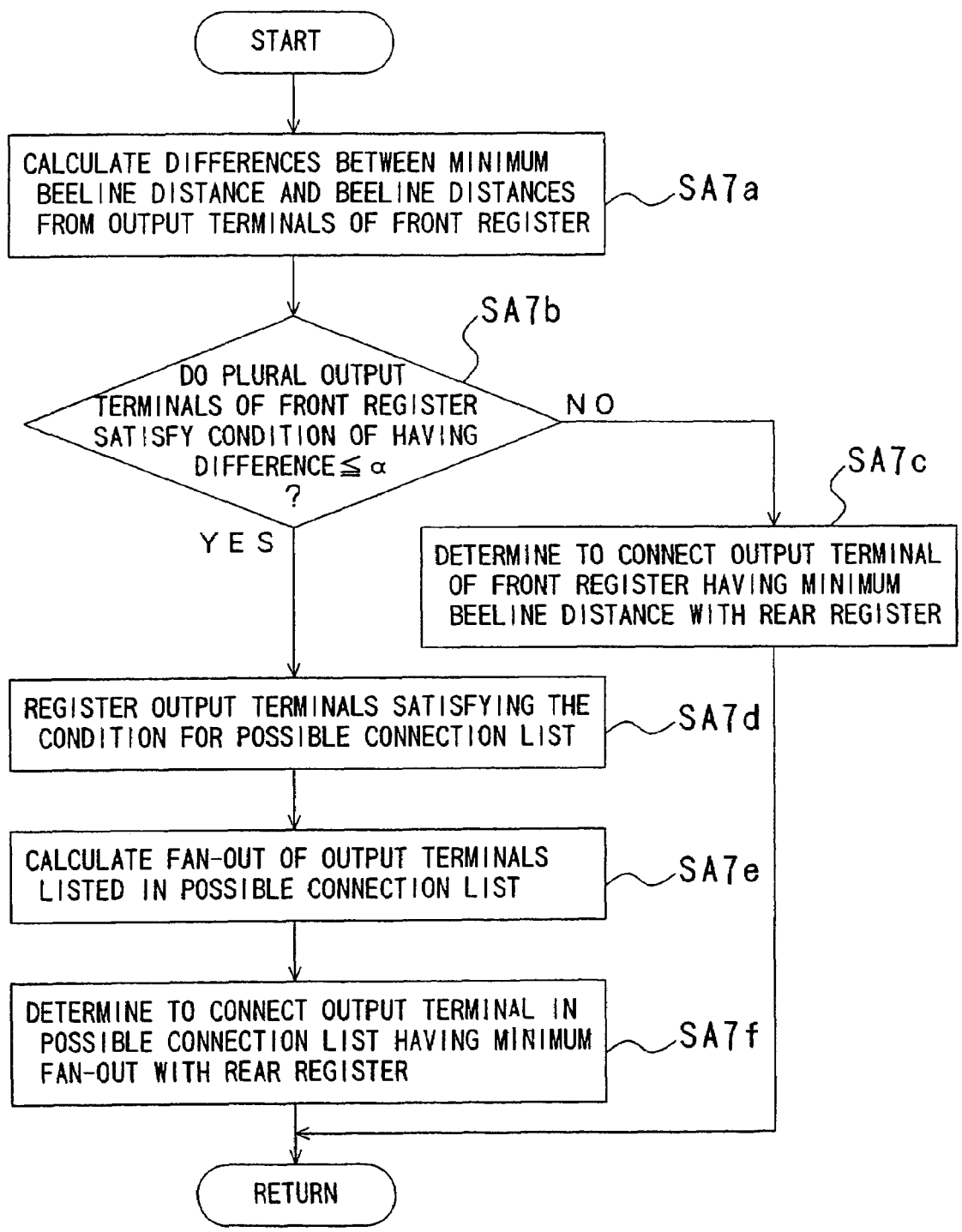
FIG. 2 is a flow chart for showing procedures for discriminating fan-out adoptable in the method of designing a semiconductor integrated circuit of the first embodiment.

FIG. 2 is a flow chart to be used in the case where any other output terminal has a beeline distance with a difference, from the minimum beeline distance selected in step SA6 of FIG. 1, equal to or smaller than a predetermined value. Fan-out of each terminal is further discriminated by using this flow chart, for the purpose of decreasing not only an interconnecting area but also a load capacitance. Accordingly, when step SA7 of FIG. 1 is replaced with the flow chart of FIG. 2, the purpose can be attained. In the flow chart of FIG. 2, a difference in the beeline distance to the scan data input terminal of the scan register at the rear stage between the output terminal having the minimum beeline distance and another output terminal of the scan register at the front stage is calculated in step SA7a; it is discriminated whether or not the differences in the beeline distance calculated in step SA7a of two or more output terminals of the scan register at the front stage are equal to or smaller than a predetermined value α, including the output terminal having the minimum beeline distance, in step SA7b; the output terminal of the scan register at the front stage having the minimum beeline distance is determined to be connected with the scan data input terminal of the scan register at the rear stage in step SA7c; the output terminals of the scan register at the front stage satisfying the condition of step SA7b are registered for a possible connection list in step SA7d; the fan-out of each output terminal in the possible connection list is calculated in step SA7e; and the output terminal having the minimum fan-out in the possible connection list is determined to be connected with the scan data input terminal of the scan register at the rear stage in step SA7f. In this embodiment, the predetermined value α for defining the range of the difference from the minimum beeline distance is 3 μm.

Figure 21:
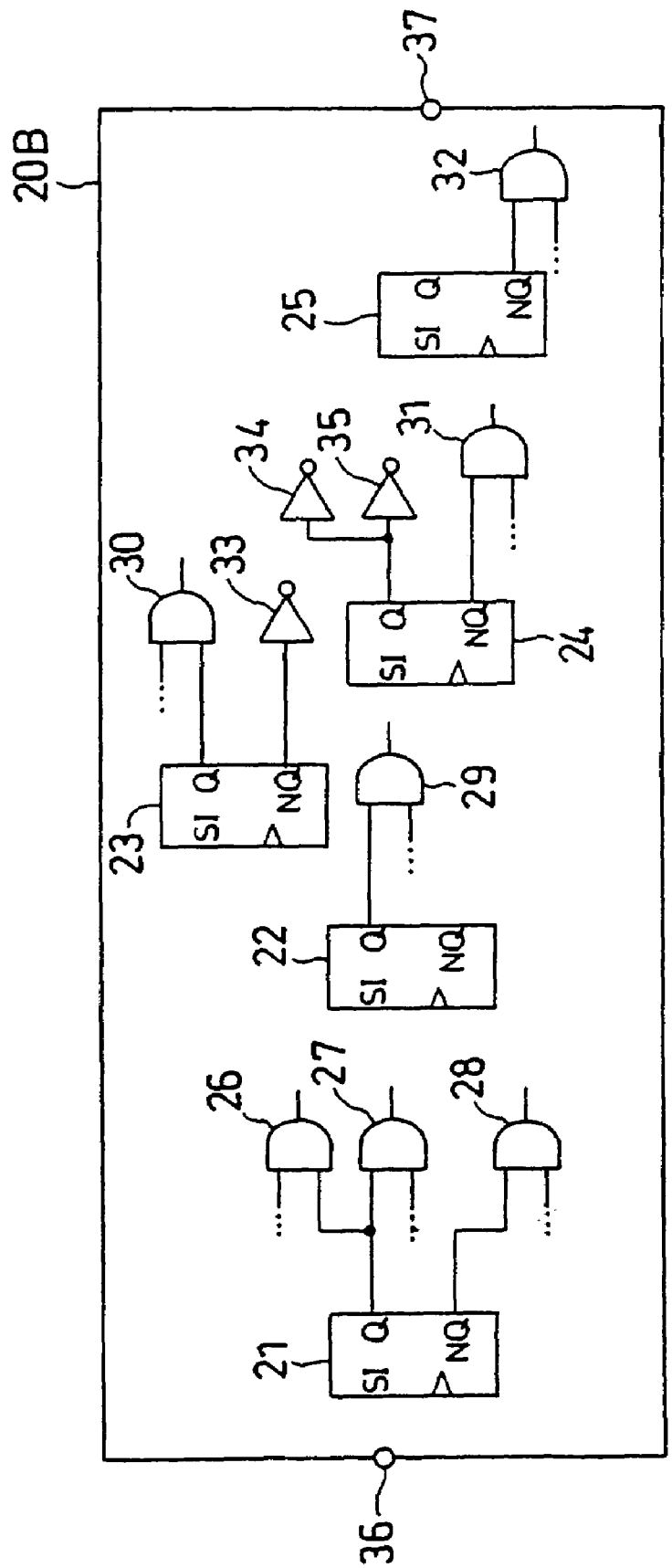
FIG. 21 is a diagram for showing a semiconductor integrated circuit before forming a scan chain.

FIG. 21 is a circuit diagram of the semiconductor integrated circuit before connecting the scan registers. Since the circuit diagram of the semiconductor integrated circuit of FIG. 21 is also referred to in the description of the conventional method of designing a semiconductor integrated circuit, description of the respective elements is herein omitted.

Figure 22:
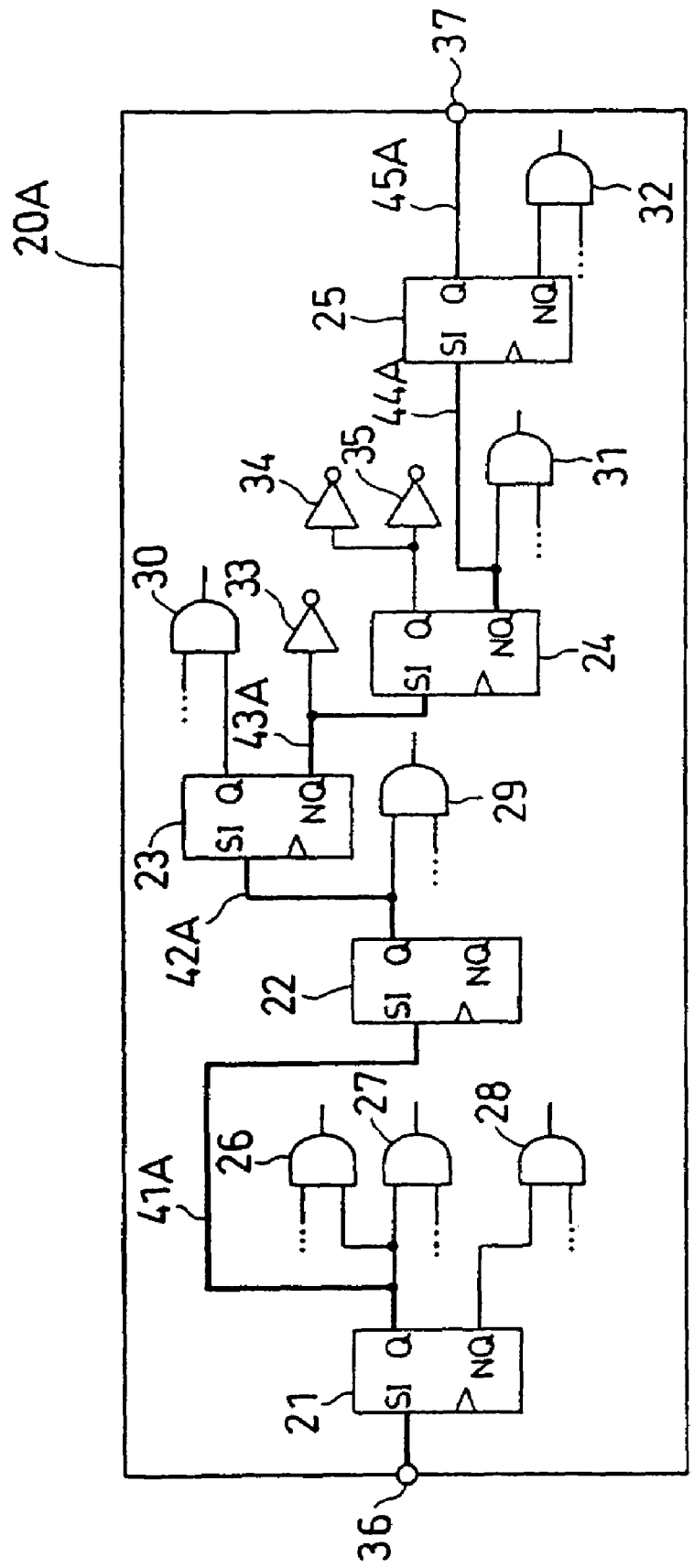
FIG. 22 is a circuit diagram obtained by the method of designing a semiconductor integrated circuit of the first or eighth embodiment.

FIG. 22 is a circuit diagram of the semiconductor integrated circuit obtained through the allocating and interconnecting procedures of FIG. 1. In FIG. 22, a reference numeral 20A denotes an area for allocating and interconnecting the semiconductor integrated circuit after the formation of the scan chain, and the positions and the dimensions of the respective elements reflect those of actual hardware. Reference numerals 21 through 25 denote scan registers serving as shift registers in the scan test, reference numeral 26 through 32 denote AND gates each outputting "1" merely when two input signals are both "1", reference numerals 33 through 35 denote inverters each outputting an inverted signal of an input signal, a reference numeral 36 denotes a scan-in terminal for receiving a signal for the scan test, and a reference numeral 37 denotes a scan-out terminal for outputting the signal for the scan test. A reference numeral 41A denotes a wire for connecting the positive logic output terminal Q of the scan register 21 with the scan data input terminal SI of the scan register 22, a reference numeral 42A denotes a wire for connecting the positive logic output terminal Q of the scan register 22 with the scan data input terminal SI of the scan register 23, a reference numeral 43A denotes a wire for connecting the negative logic output terminal NQ of the scan register 23 with the scan data input terminal SI of the scan register 24, a reference numeral 44A denotes a wire for connecting the negative logic output terminal NQ of the scan register 24 with the scan data input terminal SI of the scan register 25, and a reference numeral 45A denotes a wire for connecting the positive logic output terminal Q of the scan register 25 with the scan-out terminal 37.

By successively conducting the procedures of FIGS. 1 and 2 on the semiconductor integrated circuit before the formation of the scan chain shown in FIG. 21, the scan registers are connected with one another as follows: First, in step SA1, it is specified that the scan registers are connected in the order of the scan register 21, the scan register 22, the scan register 23, the scan register 24, the scan register 25 and the scan-out terminal 37.

Then, in step SA2, the scan registers 21 through 25, the AND gates 26 through 32 and the inverters 33 through 35 are allocated, and in step SA3, the elements excluding the scan registers 21 through 25 are connected.

Next, in step SA4, the scan registers 21 and 22 are selected as a first pair.

Subsequently, in step SA5, the beeline distances from the positive output terminal Q and the negative output terminal NQ of the scan register 21 to the scan data input terminal SI of the scan register 22 are calculated. It is herein assumed that the beeline distance from the positive logic output terminal Q is 100 μm and that from the negative logic output terminal NQ is 110 μm.

Then, in step SA6, on the basis of the calculation in step SA5, the positive logic output terminal Q having the minimum beeline distance is selected, and in subsequent step SA7, the procedures of FIG. 2 are successively conducted.

First, in step SA7a of FIG. 2, a difference between the minimum beeline distance and the beeline distance from the negative logic output terminal NQ of the scan register 21 to the scan data input terminal SI of the scan register 22 is calculated. As a result, a value of 10 μm is obtained.

Next, in step SA7b, since the difference in the beeline distance is larger than the predetermined value α, namely, 3 μm, the procedure is determined to proceed to step SA7c.

In step SA7c, it is determined that the positive logic output terminal Q having the minimum beeline distance is connected with the scan data input terminal SI of the scan register 22.

Then, the procedure returns to step SA8 of FIG. 1, and since four pairs of scan registers remain, the procedure returns to step SA4.

Next, in step SA4, the scan registers 22 and 23 are selected as a next pair.

Table 1 below lists respective beeline distances on the substrate from the positive logic output terminal Q and the negative logic output terminal NQ of the scan register at the front stage to the scan data input terminal SI of the scan register at the rear stage with regard to each pair of adjacent scan registers, wherein the unit of the distance is μm. For example, the leftmost column of Table 1 shows that the beeline distance from the positive logic output terminal Q of the scan register 21 at the front stage to the scan data input terminal SI of the scan register 22 at the rear stage is 100 μm.

TABLE 1

|  | SCAN REGISTER | | | | |
| --- | --- | --- | --- | --- | --- |
|  | 21 | 22 | 23 | 24 | 25 37 |
| POSITIVE LOGIC OUTPUT TERMINAL Q | 100 | 40 | 40 | 60 | 40 |
| NEGATIVE LOGIC OUTPUT TERMINAL NQ | 110 | 45 | 35 | 61 | 45 |

Thereafter, the procedures of steps SA5 through SA8 are conducted on the pair of scan registers 22 and 23. As is listed in Table 1, the beeline distances from the positive logic output terminal Q and the negative logic output terminal NQ of the scan register 22 to the scan data input terminal SI of the scan register 23 are 40 μm and 45 μm, respectively. Therefore, a difference in the beeline distance is 5 μm, which is larger than the predetermined value α, i.e., 3 μm. As a result, the positive logic output terminal Q having the minimum beeline distance is determined to be connected.

Next, the procedures of steps SA5 through SA8 are conducted on a pair of scan registers 23 and 24. As is listed in Table 1, the beeline distances from the positive logic output terminal Q and the negative logic output terminal NQ of the scan register 23 to the scan data input terminal SI of the scan register 24 are 40 μm and 35 μm, respectively. Therefore, a difference in the beeline distance is 5 μm, which is larger than the predetermined value α, i.e., 3 μm. As a result, the negative logic output terminal NQ having the minimum beeline distance is determined to be connected.

Next, the procedures of steps SA5 through SA8 are conducted on a pair of scan registers 24 and 25. As is listed in Table 1, the beeline distances from the positive logic output terminal Q and the negative logic output terminal NQ of the scan register 24 to the scan data input terminal SI of the scan register 25 are 60 μm and 61 μm, respectively. Therefore, a difference in the beeline distance is 1 μm, which is smaller than the predetermined value α, i.e., 3 μm. As a result, in step SA7b of FIG. 2, the procedure is determined to proceed to step SA7d.

In step SA7d, the positive logic output terminal Q and the negative logic output terminal NQ of the scan register 24 are registered for the possible connection list. Then, in step SA7e, the fan-out of the positive logic output terminal Q and the negative logic output terminal NQ listed in the possible connection list are respectively calculated. Since the positive logic output terminal Q is connected with two elements, i.e., the inverters 34 and 35, the fan-out is two. Since the negative logic output terminal NQ is connected with the AND gate 31 alone, the fan-out is one. Accordingly, in step SA7e, the negative logic output terminal NQ having the minimum fan-out is determined to be connected with the scan data input terminal SI of the scan register 25.

Next, the procedures of steps SA5 through SA8 are conducted on a pair of scan register 25 and the scan-out terminal 37. As is listed in Table 1, the beeline distances from the positive logic output terminal Q and the negative logic output terminal NQ of the scan register 23 to the scan-out terminal 37 are 40 µm and 45 µm, respectively. Therefore, a difference in the beeline distance is 5 µm, which is larger than the predetermined value α, i.e., 3 µm. As a result, the positive logic output terminal Q having the minimum beeline distance is determined to be connected.

Then, the procedure proceeds to step SA8, and since all the pairs of scan registers have been processed, the procedure further proceeds to step SA9. In step SA9, the output terminals Q or NQ of the scan registers at the front stages are connected with the scan data input terminals SI of the scan registers at the rear stages or the scan-out terminal 37 as determined in step SA7. Thus, the scan chain connected through the wires 41A through 45A can be formed as shown in FIG. 22.

Figure 26:
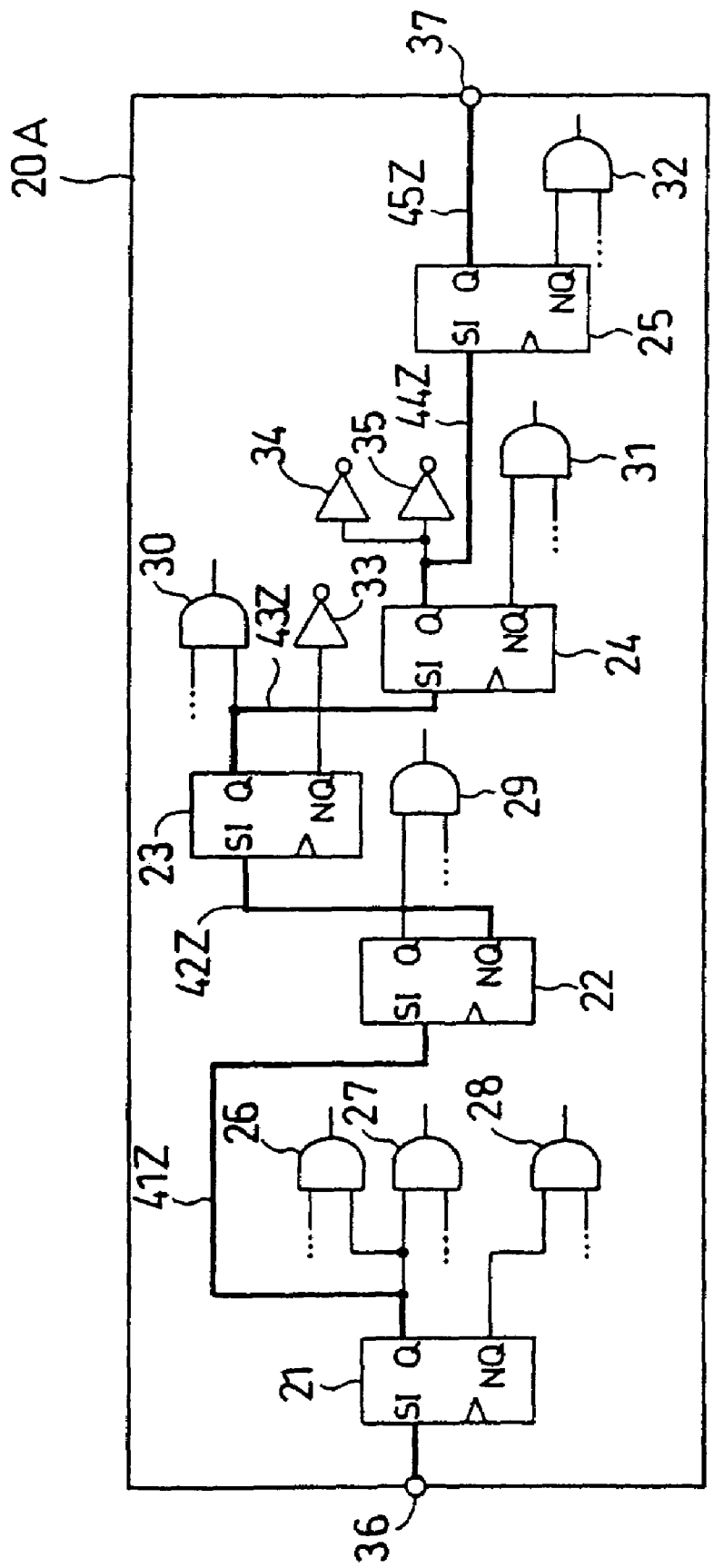
FIG. 26 is a circuit diagram obtained by the conventional method of designing a semiconductor integrated circuit.
Figure 27:
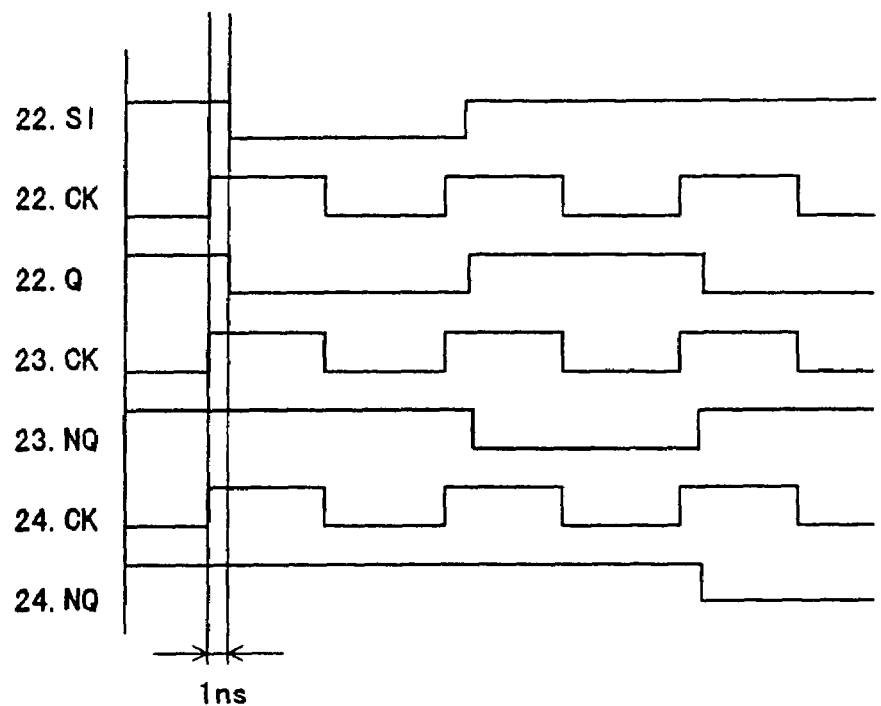
FIG. 27 is an ideal timing chart of a clock signal in the semiconductor integrated circuit designed by the conventional method.
Figure 28:
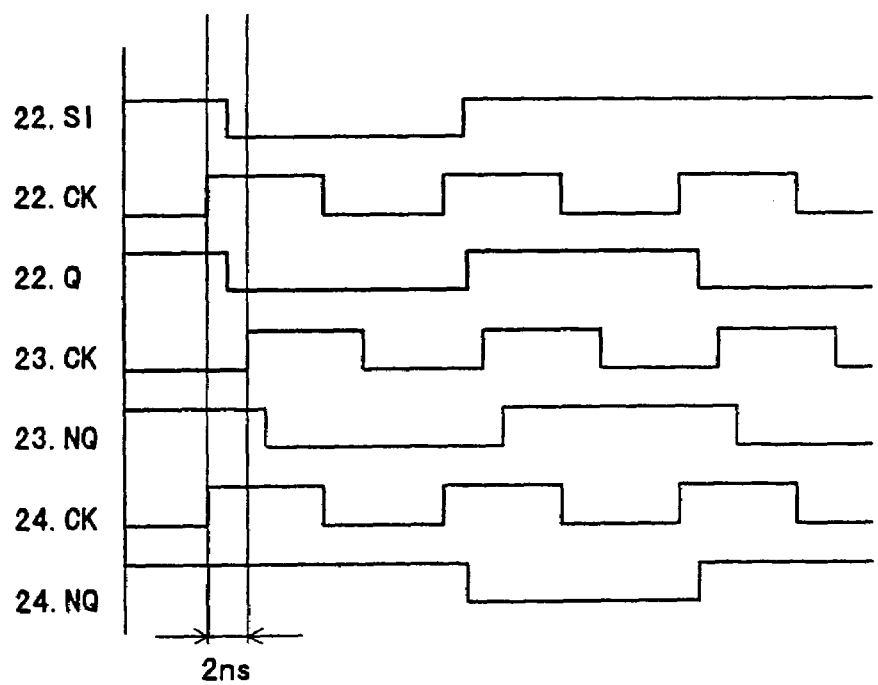
FIG. 28 is a timing chart in which there is fluctuation of a clock signal in the semiconductor integrated circuit designed by the conventional method.

The wires 42A and 43A shown in FIG. 22 resulting from the aforementioned allocating and interconnecting procedures have smaller lengths than the wires 42Z and 43Z correspondingly used in the conventional method of designing a semiconductor integrated circuit shown in FIG. 26. Accordingly, the interconnecting area can be decreased.

Furthermore, since the scan register 24 is connected with the scan register 25 via the negative logic output terminal NQ having the smaller fan-out than the positive logic output terminal Q, the load of the positive logic output terminal Q of the scan register 24 can be prevented from increasing differently from the application of the conventional method. As a result, delay time of a signal from the positive logic output terminal Q to the inverters 34 and 35 can be prevented from largely increasing.

When step SA7 of FIG. 1 is not replaced with the procedures of FIG. 2, the output terminals of the scan registers at the front stages are connected with the scan data input terminals of the scan registers at the rear stages with the beeline distances therebetween minimized. Therefore, a similar scan chain to that shown in FIG. 22 can be formed except that the negative logic output terminal NQ of the scan register 24 is connected with the scan data input terminal SI of the scan register 25. Accordingly, the wire lengths can be decreased as compared with lengths of the corresponding wires 42Z and 43Z obtained in the conventional method shown in FIG. 26, resulting in decreasing the interconnecting area.

Figure 3:
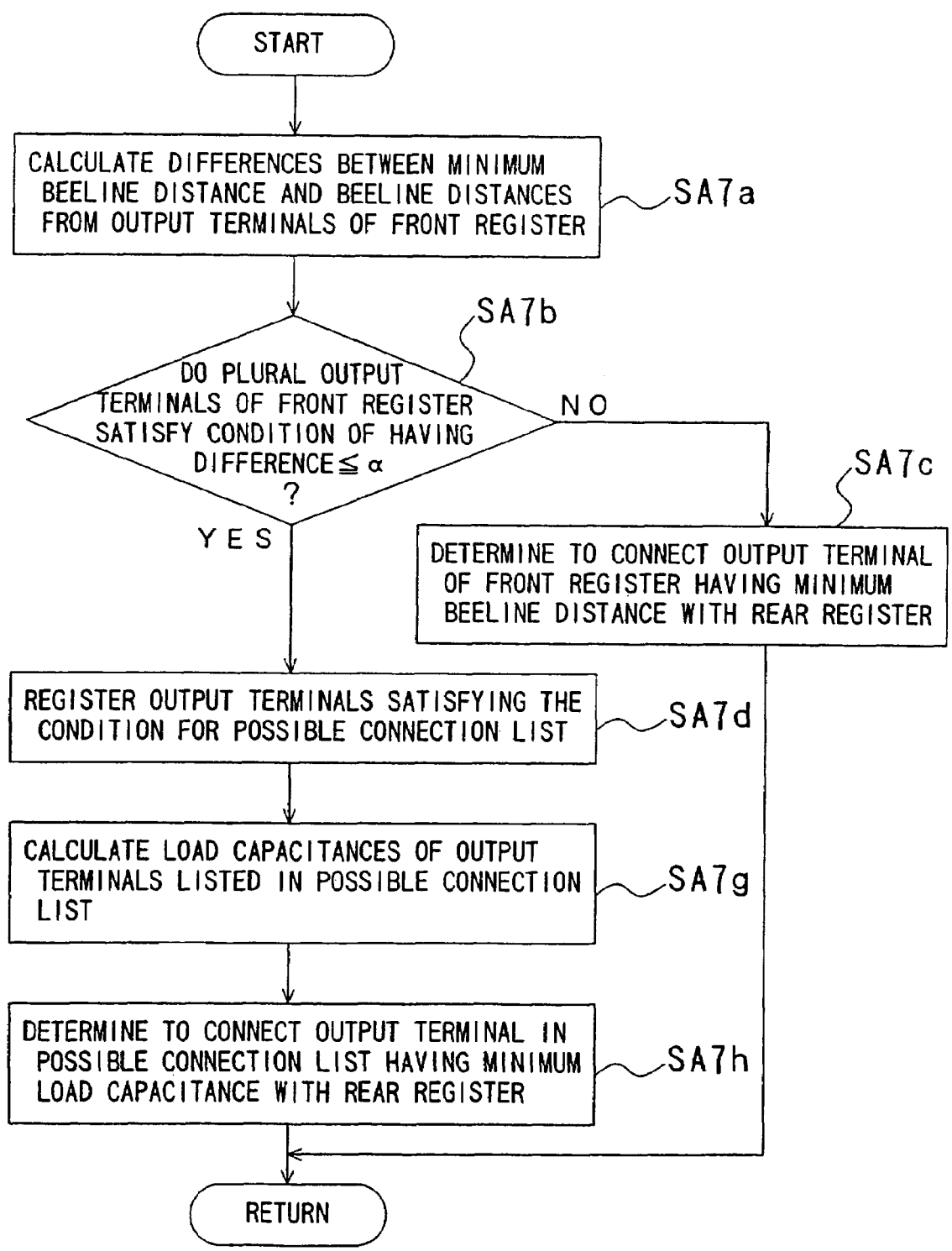
FIG. 3 is a flow chart for showing procedures for discriminating a load capacitance adoptable in the method of designing a semiconductor integrated circuit of the first embodiment.

FIG. 3 is a flow chart for procedures for selecting an output terminal having a smaller load capacitance by calculating the load capacitance of each output terminal of the scan register at the front stage, adoptable in stead of the flow chart of FIG. 2 for selecting an output terminal having a smaller load capacitance by calculating the fan-out of each output terminal of the scan register at the front stage. In FIG. 3, the same steps as those of FIG. 2 are referred to by using the same step numbers, and the description is omitted. In the flow chart of FIG. 3, the load capacitance of each output terminal listed in the possible connection list is calculated in step SA7g, and the output terminal of the scan register at the front stage having the minimum load capacitance is determined to be connected with the scan data input terminal of the scan register at the rear stage in step SA7h. The load capacitance of an output terminal is herein defined as a sum of a load capacitance of an input terminal of an element connected with the output terminal and a load capacitance of a connected wire.

Now, an interconnecting method by adopting the procedures of FIG. 3 in stead of step SA7 of FIG. 1 will be described.

In step SA4 of FIG. 1, when the pair of scan registers 24 and 25 is selected, the difference in the beeline distance is calculated to be 1 µm in step SA7a of FIG. 3.

Then, in step SA7b, since the difference in the beeline distance is smaller than the predetermined value α, i.e. 3 µm, the procedure is determined to proceed to step SA7d.

Next, in step SA7d, the positive logic output terminal Q and the negative logic output terminal NQ are registered for the possible connection list. In step SA7g, the load capacitances of the positive logic output terminal Q and the negative logic output terminal NQ listed in the possible connection list are calculated. The positive logic output terminal Q is connected with the two elements, i.e., the inverters 34 and 35, and hence has a load capacitance of 1.5 pF as the sum of the load capacitance of the connected wire and the load capacitances of the input terminals of the inverters 34 and 35, and the negative logic output terminal NQ has a load capacitance of 0.5 pF.

Then, in step SA7h, the negative logic output terminal NQ having the minimum load capacitance is determined to be connected with the scan data input terminal SI of the scan register 25. As a result, the ultimate circuit diagram is obtained as the same scan chain as that shown in FIG. 22.

Accordingly, the wires 42A and 43A shown in FIG. 22 have smaller lengths than the wires 42Z and 43Z correspondingly used in the application of the conventional method of designing a semiconductor integrated circuit shown in FIG. 26, resulting in decreasing the interconnecting area. Also, since the scan register 24 is connected with the scan register 25 via the negative logic output terminal NQ having the smaller load capacitance than the positive logic output terminal Q, the load of the positive logic output terminal Q of the scan register 24 can be prevented from increasing differently from the application of the conventional method. Therefore, the delay time of a signal from the positive logic output terminal Q to the inverters 34 and 35 can be prevented from largely increasing.

In this embodiment and following other embodiments, description is made on a scan register having two output terminals, i.e., a positive logic output terminal Q and a negative logic output terminal NQ. However, the invention can exhibit the same effects on a scan register having three or more output terminals, for example, including a positive logic output terminal Q, a negative logic output terminal NQ and another output terminal for a scan data.

The predetermined value α is specified as 3 µm in this embodiment, but the same effects can be attained when the predetermined value α is any arbitrary value larger than 0 µm.

EMBODIMENT 2

Figure 4:
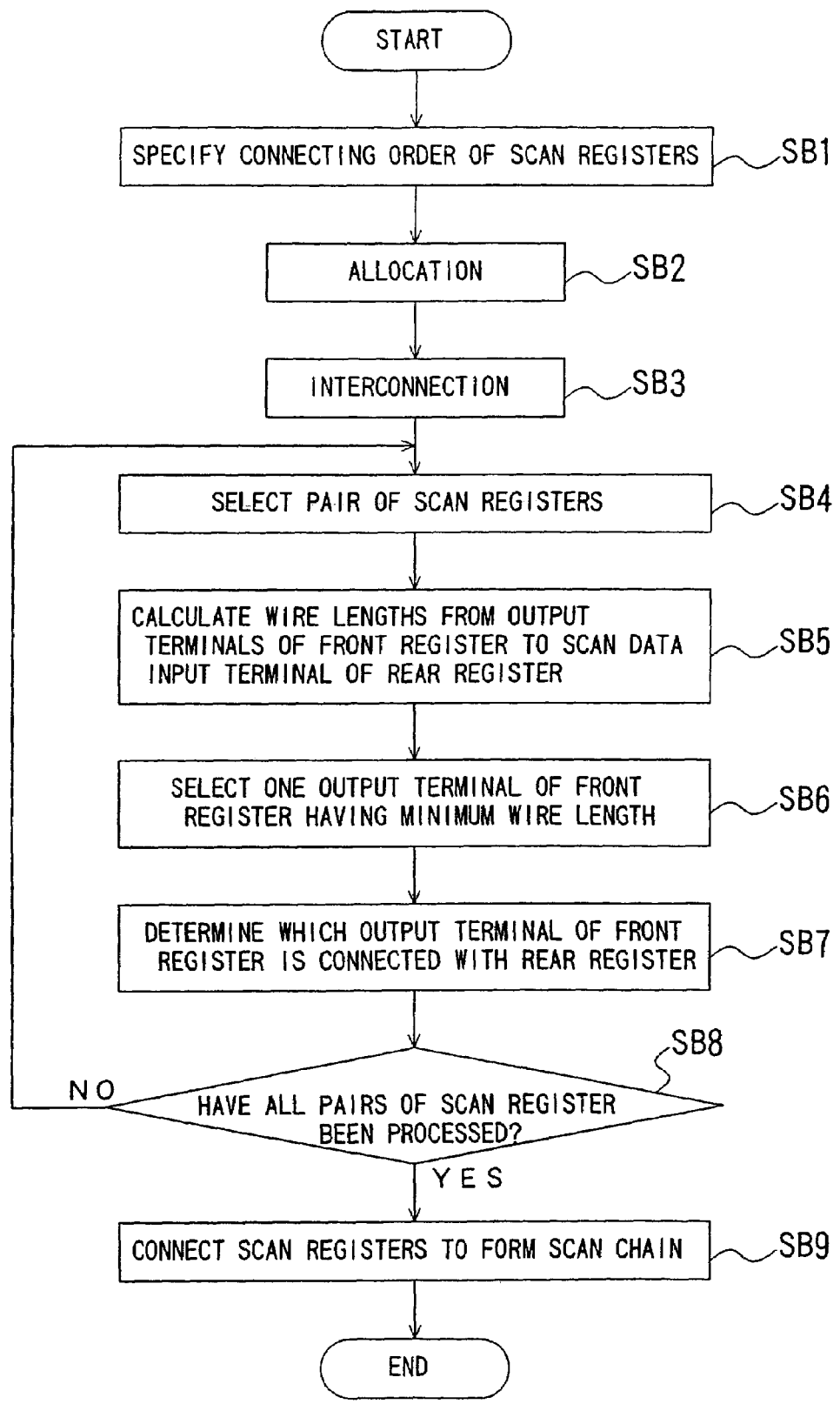
FIG. 4 is a flow chart for showing a method of designing a semiconductor integrated circuit according to a second embodiment of the invention.

A method of designing a semiconductor integrated circuit according to a second embodiment will now be described with reference to the accompanying drawings. FIG. 4 is a flow chart for showing the method of designing a semiconductor integrated circuit of this embodiment. In the flow chart of FIG. 4, steps SB1 through SB4, SB8 and SB9 respectively correspond to steps SA1 through SA4, SA8 and SA9 of the flow chart of FIG. 1, and the corresponding steps have the same contents. In step SB5 of FIG. 4, wire lengths for connecting the respective output terminals of a scan register at the front stage with the scan data input terminal of a scan register at the rear stage are calculated; in step SB6, one of the output terminals of the scan register at the front stage having the minimum wire length is selected; and in step SB7, it is determined which output terminal of the scan register at the front stage is connected with the scan data input terminal of the scan register at the rear stage. In step SB7, the output terminal of the scan register at the front stage selected in step SB6 is determined to be connected.

Figure 5:
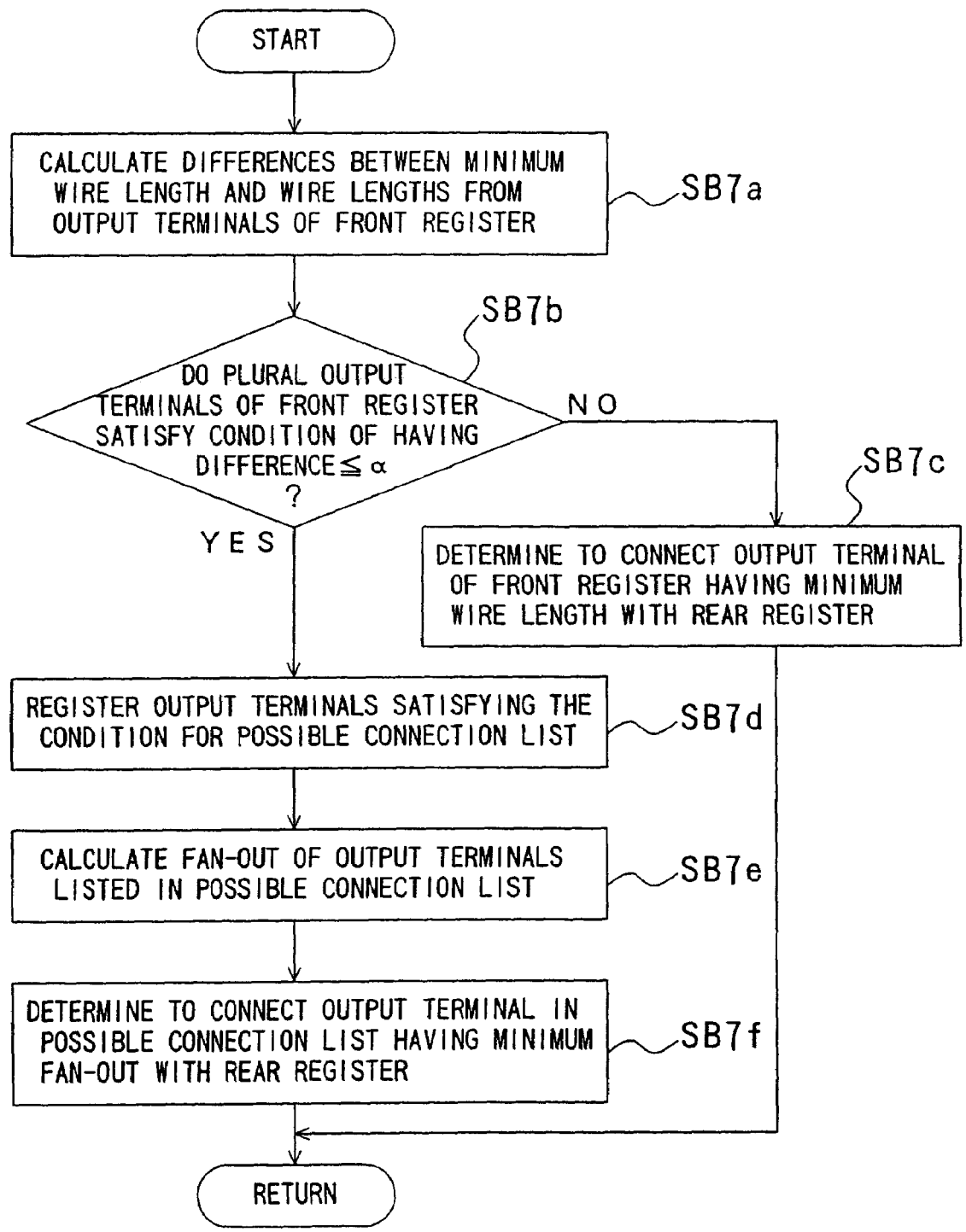
FIG. 5 is a flow chart for showing procedures for discriminating fan-out adoptable in the method of designing a semiconductor integrated circuit of the second embodiment.

FIG. 5 is a flow chart used in the case where any other output terminal has a wire length with a difference, from the minimum wire length selected in step SB6 of FIG. 4, equal to or smaller than a predetermined value. By using this flow chart, the fan-out is further discriminated for the purpose of decreasing not only the interconnecting area but also the load capacitance. Accordingly, when step SB7 of FIG. 4 is replaced with the flow chart of FIG. 5, the purpose can be achieved. In the flow chart of FIG. 5, a difference in the wire length to the scan data input terminal of the scan register at the rear stage between the output terminals having the minimum wire length and another output terminal of the scan register at the front stage is calculated in step SB7a; it is discriminated whether or not the differences calculated in step SB7a of two or more output terminals are equal to or smaller than a predetermined value α, including the output terminal having the minimum wire length, in step SB7b; it is determined that the output terminal having the minimum wire length of the scan register at the front stage is connected with the scan data input terminal of the scan register at the rear stage in step SB7c; the output terminals of the scan register at the front stage satisfying the condition of step SB7b are registered for a possible connection list in step SB7d; the fan-out of each output terminal listed in the possible connection list is calculated in step SB7e; and it is determined that the output terminal having the minimum fan-out is connected with the scan data input terminal of the scan register at the rear stage in step SB7f. In this embodiment, the predetermined value α for defining the range of the difference from the minimum wire length is 3 µm.

Figure 23:
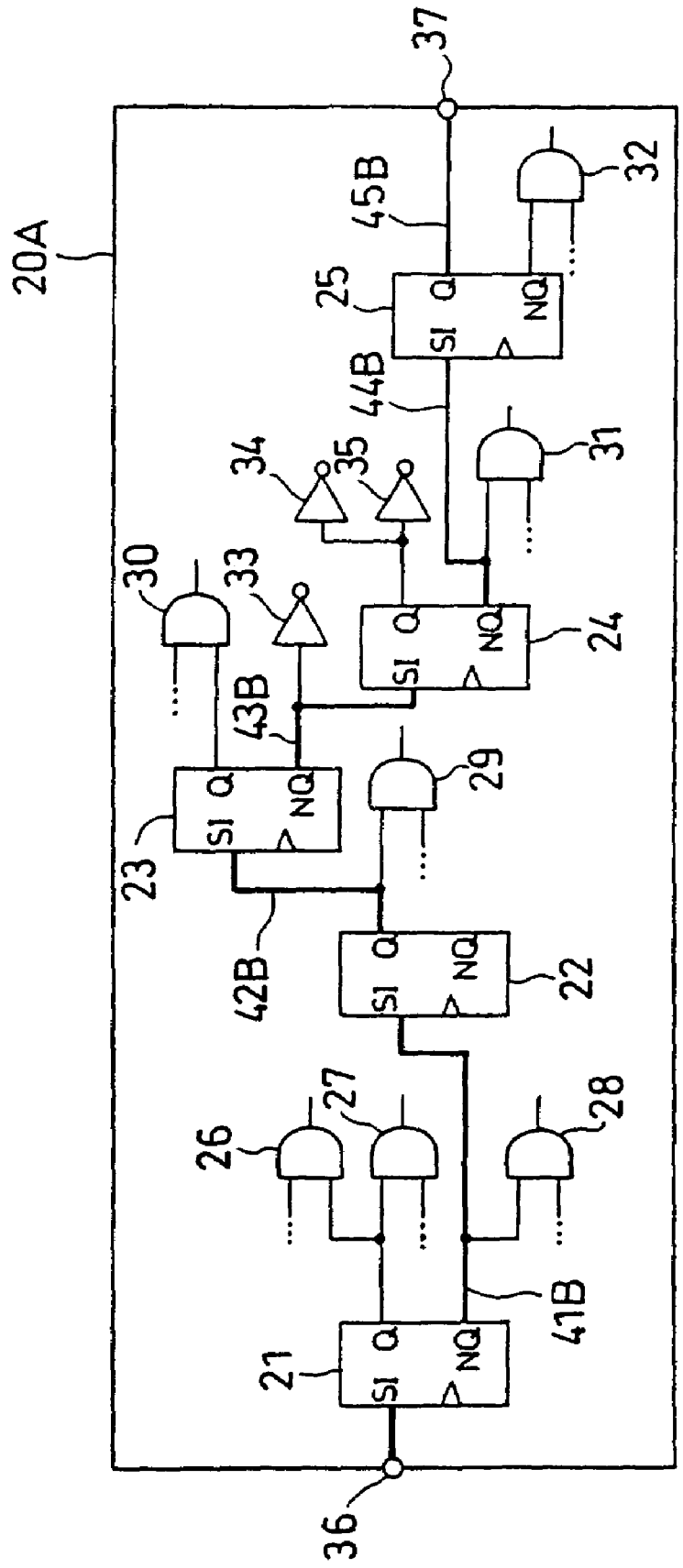
FIG. 23 is a circuit diagram obtained by the method of designing a semiconductor integrated circuit of the second embodiment.

FIG. 23 is a circuit diagram obtained by conducting the allocating and interconnecting procedures of FIGS. 4 and 5 on a semiconductor integrated circuit of FIG. 21. In FIG. 23, a reference numeral 20A denotes an area for allocating and interconnecting the semiconductor integrated circuit after the formation of a scan chain, and the positions and the dimensions of respective elements reflect those of actual hardware. Reference numerals 21 through 25 are scan registers working as shift registers in the scan test, reference numerals 26 through 32 denote AND gates each outputting "1" when two input signals are both "1", reference numerals 33 through 35 denote inverters each outputting an inverted signal of an input signal, a reference numeral 36 denotes a scan-in terminal for inputting a signal for the scan test, and a reference numeral 37 denotes a scan-out terminal for outputting the signal for the scan test. A reference numeral 41B denotes a wire for connecting the negative logic output terminal NQ of the scan register 21 with the scan data input terminal SI of the scan register 22, a reference numeral 42B denotes a wire for connecting the positive logic output terminal Q of the scan register 22 with the scan data input terminal SI of the scan register 23, a reference numeral 43B denotes a wire for connecting the negative logic output terminal NQ of the scan register 23 with the scan data input terminal SI of the scan register 24, a reference numeral 44B denotes a wire for connecting the negative logic output terminal NQ of the scan register 24 with the scan data input terminal SI of the scan register 25, and a reference numeral 45B denotes a wire for connecting the positive logic output terminal Q of the scan register 25 with the scan-out terminal 37.

The procedures of FIGS. 4 and 5 are successively conducted on the semiconductor integrated circuit before the formation of the scan chain shown in FIG. 21 so as to connect the scan registers with one another as follows: First, in step SB1, it is specified that the scan registers are connected in the order of the scan register 21, the scan register 22, the scan register 23, the scan register 24, the scan register 25 and the scan-out terminal 37.

Next, in step SB2, the scan registers 21 through 25, the AND gates 26 through 32 and the inverters 33 through 35 are allocated, and in step SB3, the elements excluding the scan registers 21 through 25 are connected.

Then, in step SB4, the scan registers 21 and 22 are selected as a first pair.

Subsequently in step SB5, the wire lengths from the positive logic output terminal Q and the negative logic output terminal NQ of the scan register 21 to the scan data input terminal SI of the scan register 22 are respectively calculated. It is herein assumed that the wire length from the positive logic output terminal Q is 200 µm and that from the negative logic output terminal NQ is 130 µm.

Next, in step SB6, the negative logic output terminal NQ having the minimum wire length is selected on the basis of the calculation in step SB5, and in step SB7, the procedures of FIG. 5 are successively conducted.

First, in step SB7a of FIG. 5, a difference between the minimum wire length and that from the positive logic output terminal Q of the scan register 21 to the scan data input terminal SI of the scan register 22 is calculated, resulting in obtaining 70 µm in this embodiment.

Then, in step SB7b, since the difference in the wire length is larger than the predetermined value α, i.e., 3 µm, the procedure is determined to proceed to step SB7c.

In step SB7c, it is determined that the negative logic output terminal NQ having the minimum wire length is connected with the scan data input terminal SI of the scan register 22.

Next, the procedure returns to step SB8 of FIG. 4, and since there remain four pairs of scan registers, the procedure returns to step SB4.

Then, in step SB4, the scan registers 22 and 23 are selected as a next pair.

Table 2 below lists respective wire lengths on the substrate from the positive logic output terminal Q and the negative logic output terminal NQ of the scan register at the front stage to the scan data input terminal SI of the scan register at the rear stage with regard to each pair of adjacent scan registers, wherein the unit of the distance is µm.

TABLE 2

| | SCAN REGISTER | | | | |
|---|---|---|---|---|---|
| | 21 | 22 | 23 | 24 | 25 | 37 |
| POSITIVE LOGIC OUTPUT TERMINAL Q | 200 | 60 | 60 | 80 | 40 |
| NEGATIVE LOGIC OUTPUT TERMINAL NQ | 130 | 70 | 50 | 83 | 60 |

Thereafter, the procedures of steps SB5 through SB8 are conducted on the pair of scan registers 22 and 23. As is listed in Table 2, the wire lengths from the positive logic output terminal Q and the negative logic output NQ of the scan register 22 to the scan data input terminal SI of the scan register 23 are 60 μm and 70 μm, respectively. Therefore, a difference in the wire length is 10 μm, which is larger than the predetermined value α, i.e., 3 μm. As a result, the positive logic output terminal Q having the minimum wire length is determined to be connected.

Next, the procedures of steps SB5 through SB8 are conducted on a pair of scan registers 23 and 24. As is listed in Table 2, the wire lengths from the positive logic output terminal Q and the negative logic output terminal NQ of the scan register 23 to the scan data input terminal SI of the scan register 24 are 60 μm and 50 μm, respectively. Therefore, a difference in the wire length is 10 μm, which is larger than the predetermined value α, i.e., 3 μm. As a result, the negative logic output terminal NQ having the minimum wire length is determined to be connected.

Next, the procedures of steps SB5 through SB8 are conducted on a pair of scan registers 24 and 25. As is listed in Table 2, the wire lengths from the positive logic output terminal Q and the negative logic output terminal NQ of the scan register 24 to the scan data input terminal SI of the scan register 25 are 80 μm and 83 μm, respectively. Therefore, a difference in the wire length is 3 μm, which is equal to the predetermined value α, i.e., 3 μm. As a result, in step SB7$b$ of FIG. 5, the procedure is determined to proceed to step SB7$d$.

In step SB7$d$, the positive logic output terminal Q and the negative logic output terminal NQ of the scan register 24 are registered for the possible connection list. Then, in step SB7$e$, the fan-out of the positive logic output terminal Q and the negative logic output terminal NQ listed in the possible connection list are respectively calculated. Since the positive logic output terminal Q is connected with two elements; i.e., the inverters 34 and 35, the fan-out is two. Since the negative logic output terminal NQ is connected with the AND gate 31 alone, the fan-out is one. Accordingly, in step SB7$f$, the negative logic output terminal NQ having the minimum fan-out is determined to be connected with the scan data input terminal SI of the scan register 25.

Next, the procedures of steps SB5 through SB8 are conducted on a pair of the scan register 25 and the scan-out terminal 37. As is listed in Table 2, the wire lengths from the positive logic output terminal Q and the negative logic output terminal NQ of the scan register 25 to the scan-out terminal 37 are 40 μm and 60 μm, respectively. Therefore, a difference in the wire length is 20 μm, which is larger than the predetermined value α, i.e., 3 μm. As a result, the positive logic output terminal Q having the minimum wire length is determined to be connected.

Then, the procedure proceeds to step SB8, and since all the pairs of scan registers have been processed, the procedure further proceeds to step SB9. In step SB9, the output terminals Q or NQ of the scan registers at the front stages are connected with the scan data input terminals SI of the scan registers at the rear stages or the scan-out terminal 37 as determined in step SB7. Thus, the scan chain connected through the wires 41B through 45B can be formed as shown in FIG. 23.

The wires 41B, 42B and 43B shown in FIG. 23 resulting from the aforementioned allocating and interconnecting procedures have smaller lengths than the wires 41Z, 42Z and 43Z correspondingly used in the conventional method of designing a semiconductor integrated circuit shown in FIG. 26. Accordingly, the interconnecting area can be decreased.

Furthermore, since the scan register 24 is connected with the scan register 25 via the negative logic output terminal NQ having the smaller fan-out than the positive logic output terminal Q, the load of the positive logic output terminal Q of the scan register 24 can be prevented from increasing differently from the application of the conventional method. As a result, delay time of a signal from the positive logic output terminal Q to the inverters 34 and 35 can be prevented from largely increasing.

Moreover, as a characteristic of this embodiment, the wire length of the wire 41B of FIG. 23 is 130 μm, which is smaller than the wire length of the wire 41A of FIG. 22, namely, 200 μm. Thus, this embodiment can further decrease the interconnecting area as compared with the first embodiment.

When step SB7 of FIG. 4 is not replaced with the procedures of FIG. 5, the output terminals of the scan registers at the front stages are connected with the scan data input terminals of the scan registers at the rear stages with the wire lengths therebetween minimized. Therefore, a similar scan chain to that shown in FIG. 23 can be formed except that the positive logic output terminal Q of the scan register 24 is connected with the scan data input terminal SI of the scan register 25. Accordingly, the wire lengths can be decreased as compared with those of the corresponding wires 41Z, 42Z and 43Z obtained by the conventional method shown in FIG. 26, resulting in decreasing the interconnecting area.

Figure 6:
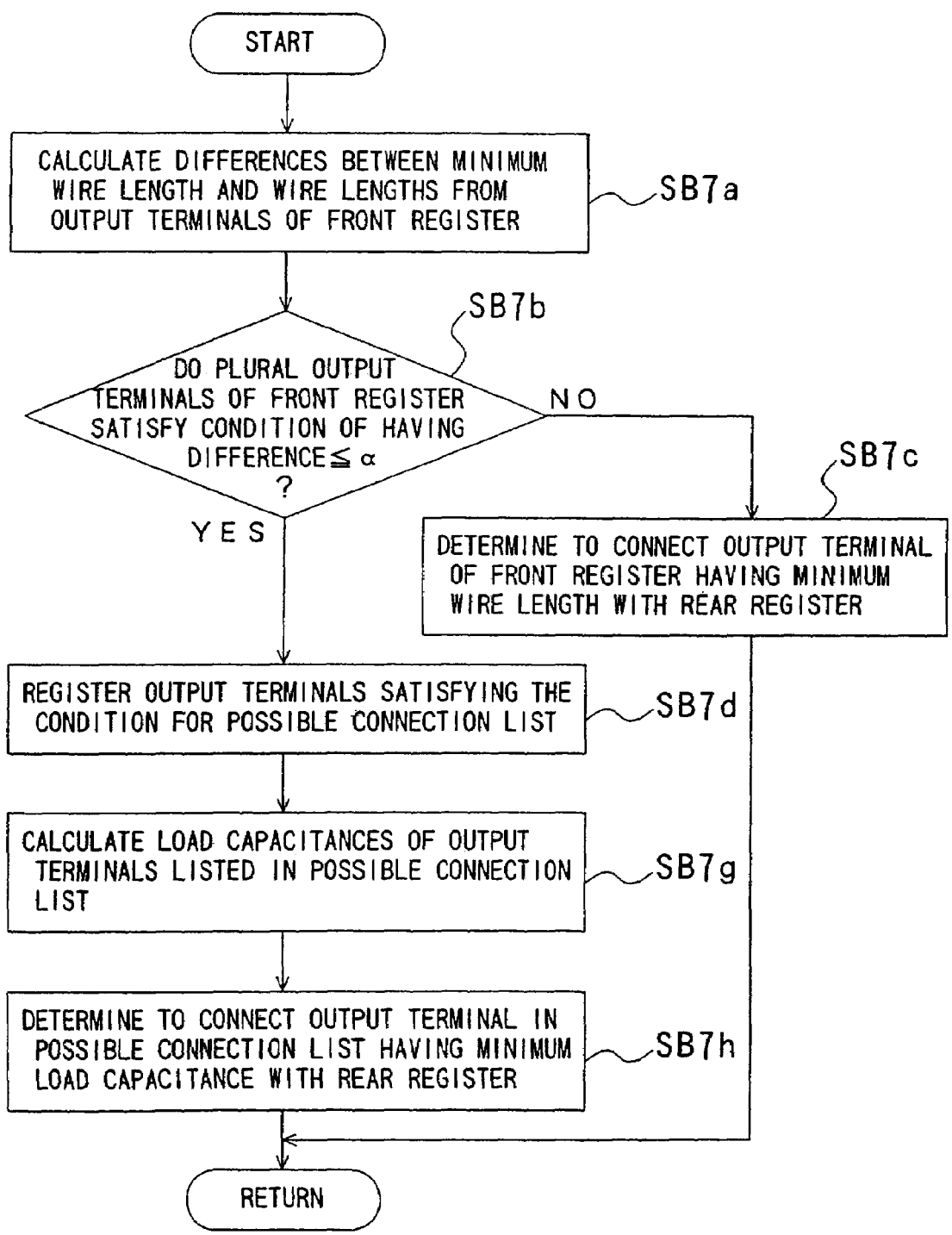
FIG. 6 is a flow chart for showing procedures for discriminating a load capacitance adoptable in the method of designing a semiconductor integrated circuit of the second embodiment.

FIG. 6 is a flow chart for procedures for selecting an output terminal having a smaller load capacitance by calculating the load capacitance of each output terminal of the scan register at the front stage, adoptable in stead of the flow chart of FIG. 5 for selecting an output terminal having a smaller load capacitance by calculating the fan-out of each output terminal of the scan register at the front stage. In FIG. 6, the same steps as those of FIG. 5 are referred to by using the same step numbers, and the description is omitted. In the flow chart of FIG. 6, the load capacitance of each output terminal listed in the possible connection list is calculated in step SB7$g$, and the output terminal of the scan register at the front stage having the minimum load capacitance is determined to be connected with the scan data input terminal of the scan register at the rear stage in step SB7$h$. The load capacitance of an output terminal is herein defined as a sum of the load capacitance of an input terminal of an element connected with the output terminal and the load capacitance of a connected wire.

Now, an interconnecting method by adopting the procedures of FIG. 6 in stead of step SB7 of FIG. 4 will be described.

In step SB4 of FIG. 4, when the pair of scan registers 24 and 25 is selected, the difference in the wire length is calculated to be 3 μm in step SB7$a$ of FIG. 6. Then, in step SB7$b$, since the difference in the wire length is equal to the predetermined value α, i.e. 3 μm, the procedure is determined to proceed to step SB7$d$.

Next, in step SB7$d$, the positive logic output terminal Q and the negative logic output terminal NQ are registered for the possible connection list. In step SB7$g$, the load capacitances of the positive logic output terminal Q and the negative logic output terminal NQ listed in the possible connection list are calculated. The positive logic output terminal Q is connected with the two elements, i.e., the inverters 34 and 35, and hence has a load capacitance of 1.5 pF as the sum of the load capacitance of the connected wire and the load capacitances of the input terminals of the inverters 34 and 35, and the negative logic output terminal NQ has a load capacitance of 0.5 pF.

Then, in step SB7$h$, the negative logic output terminal NQ having the minimum load capacitance is determined to be connected with the scan data input terminal SI of the scan register 25. As a result, the ultimate circuit diagram is obtained as the same scan chain as that shown in FIG. 23.

Accordingly, the wires 41B, 42B and 43B shown in FIG. 23 have smaller lengths than the wires 41Z, 42Z and 43Z correspondingly used in the application of the conventional method of designing a semiconductor integrated circuit shown in FIG. 26, resulting in decreasing the interconnecting area. Also, since the scan register 24 of FIG. 23 is connected with the scan register 25 via the negative logic output terminal NQ having the smaller load capacitance than the positive logic output terminal Q, the load of the positive logic output terminal Q of the scan register 24 can be prevented from increasing differently from the application of the conventional method. Therefore, the delay time of a signal from the positive logic output terminal Q to the inverters 34 and 35 can be prevented from largely increasing.

The wire 41B of FIG. 23 has a wire length of 130 μm, which is smaller than the wire length of the wire 41A of FIG. 22, i.e., 200 μm. Accordingly, the interconnecting area can be further decreased as compared with the method of the first embodiment.

The predetermined value α is specified as 3 μm in this embodiment, but the same effects can be attained when the predetermined value α is any arbitrary value larger than 0 μm.

EMBODIMENT 3

Figure 7:
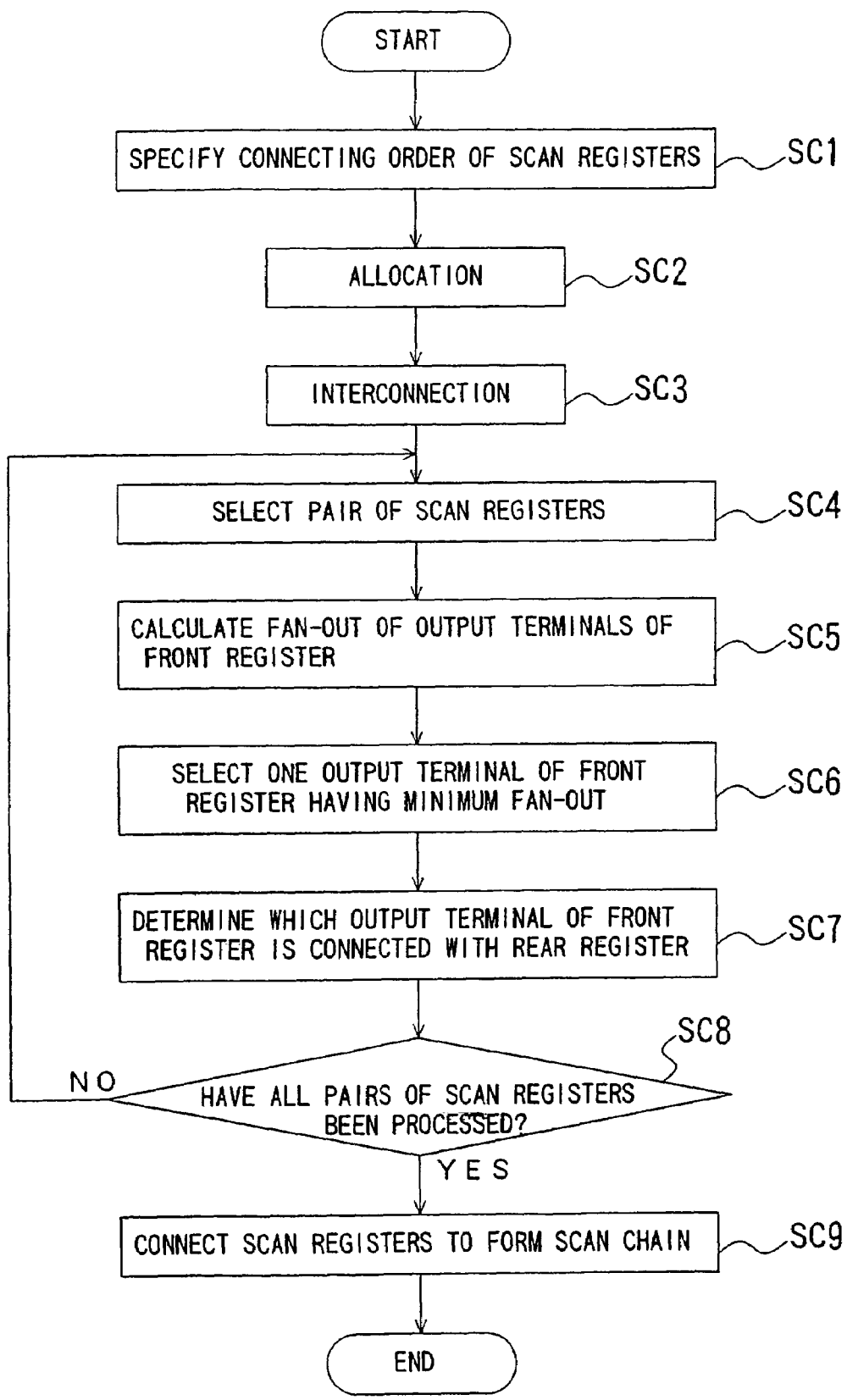
FIG. 7 is a flow chart for showing a method of designing a semiconductor integrated circuit according to a third embodiment of the invention.

A method of designing a semiconductor integrated circuit according to a third embodiment will now be described with reference to the accompanying drawings. FIG. 7 is a flow chart for showing the method of designing a semiconductor integrated circuit of this embodiment. In FIG. 7, steps SC1 through SC4, SC8 and SC9 respectively correspond to steps SA1 through SA4, SA8 and SA9 of FIG. 1, and the corresponding steps have the same contents. In step SC5, the fan-out of each output terminal of a scan register at the front stage is calculated; in step SC6, one of the output terminals having the minimum fan-out of the scan register at the front stage is selected; and in step SC7, it is determined which output terminal of the scan register at the front stage is connected with the scan data input terminal of the scan register at the rear stage. In step SC7, the output terminal of the scan register at the front stage selected in step SC6 is determined to be connected.

Figure 8:
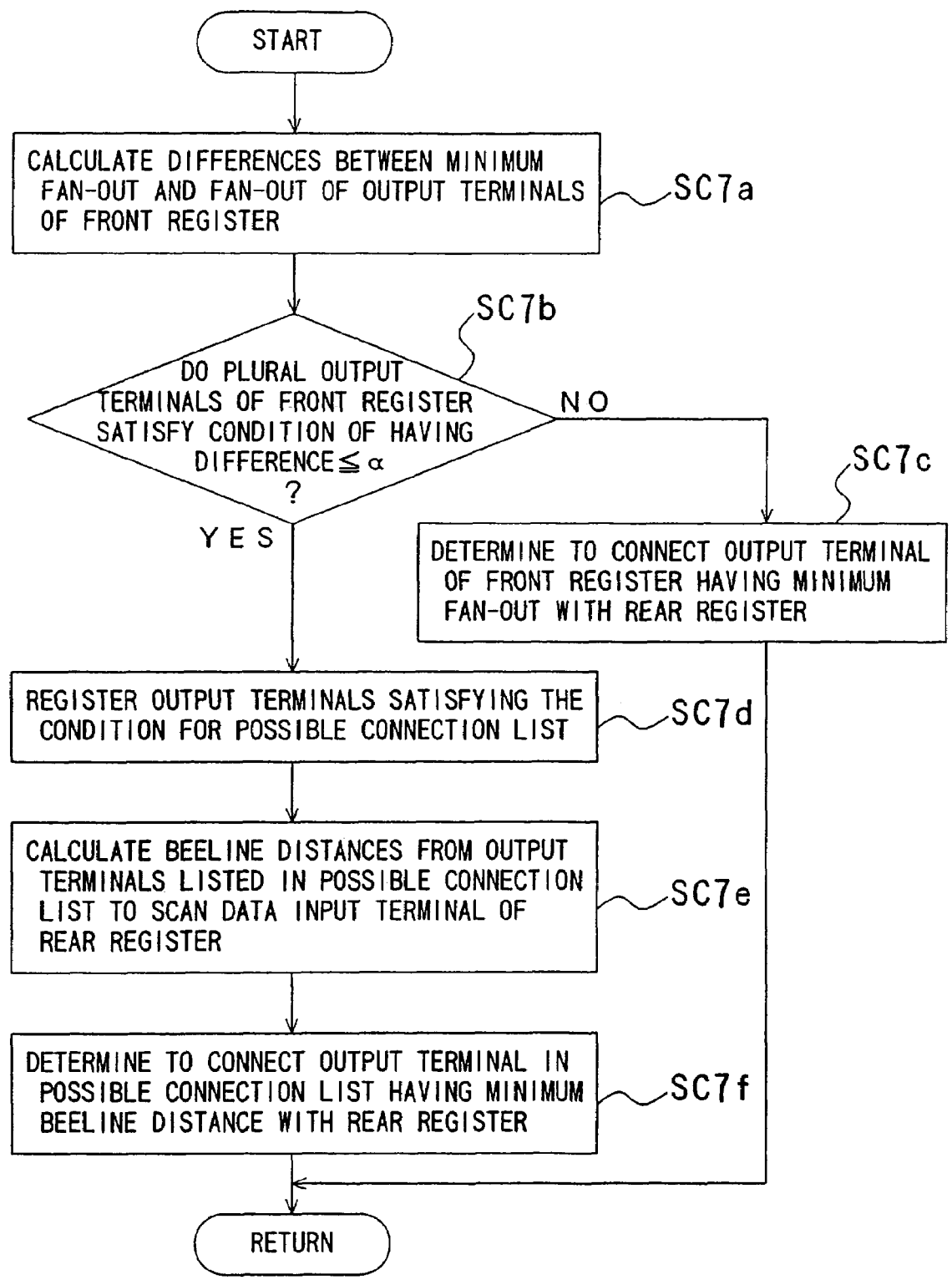
FIG. 8 is a flow chart for showing procedures for discriminating a beeline distance between terminals adoptable in the method of designing a semiconductor integrated circuit of the third embodiment.

FIG. 8 is a flow chart used in the case where any other output terminal has fan-out with a difference, from the minimum fan-out selected in step SC6 of FIG. 7, equal to or smaller than a predetermined value. By using this flow chart, a beeline distance on the substrate from each output terminal to the scan data input terminal of the scan register at the rear stage is further discriminated for the purpose of decreasing not only the interconnecting area but also the load capacitance. Accordingly, when step SC7 of FIG. 7 is replaced with the flow chart of FIG. 8, the purpose can be achieved.

In the flow chart of FIG. 8, a difference in the fan-out between the output terminal having the minimum fan-out and another output terminal of the scan register at the front stage is calculated in step SC7a; it is discriminated whether or not the differences calculated in step SC7a of two or more output terminals are equal to or smaller than a predetermined value α, including the output terminal having the minimum fan-out in step SC7b; it is determined that the output terminal having the minimum fan-out of the scan register at the front stage is connected with the scan data input terminal of the scan register at the rear stage in step SC7c; the output terminals of the scan register at the front stage satisfying the condition of step SC7b are registered for a possible connection list in step SC7d; the beeline distance from each output terminal listed in the possible connection list to the scan data input terminal of the scan register at the rear stage is calculated in step SC7e; and it is determined that the output terminal having the minimum beeline distance is connected with the scan data input terminal of the scan register at the rear stage in step SC7f. In this embodiment, the predetermined value α for defining the range of the difference from the minimum fan-out is 0.

Figure 24:
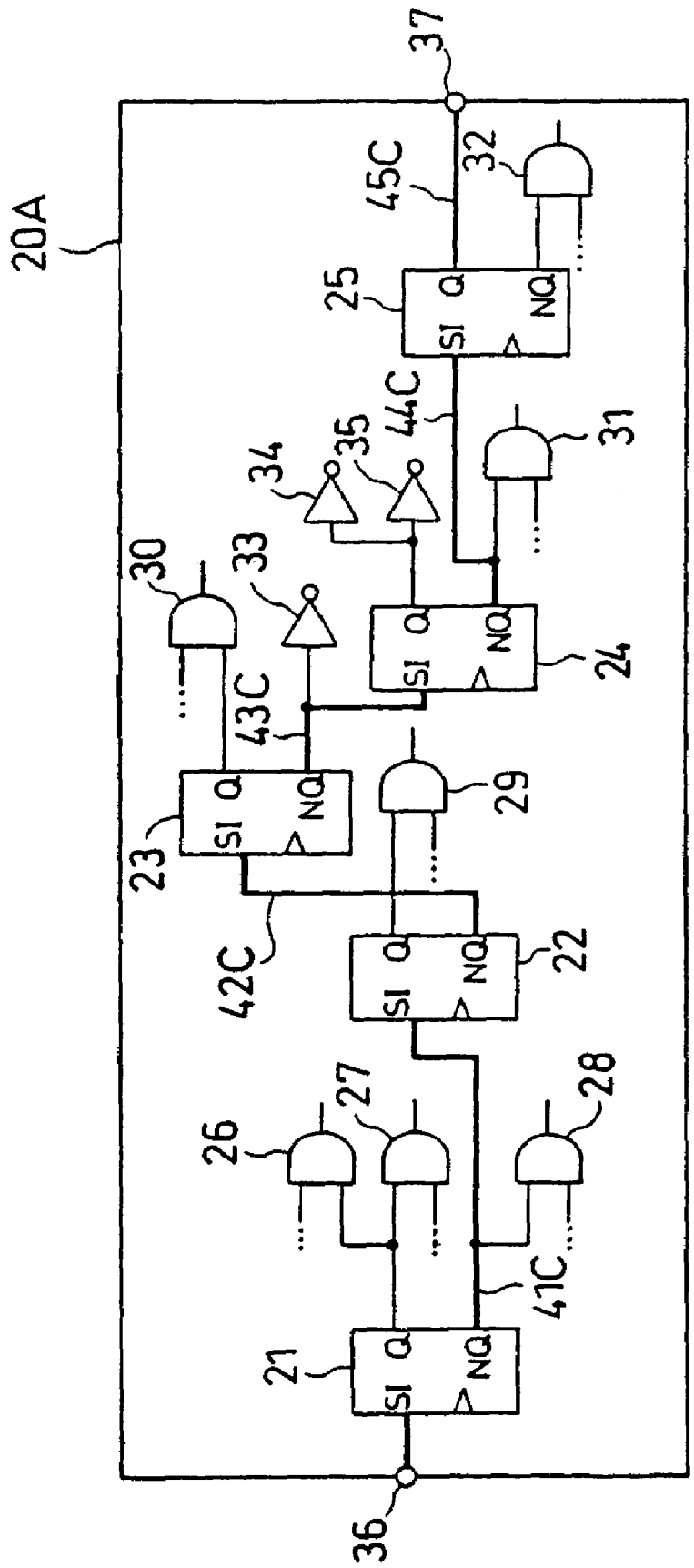
FIG. 24 is a circuit diagram obtained by the method of designing a semiconductor integrated circuit of any of the third through seventh embodiments.
Figure 25:
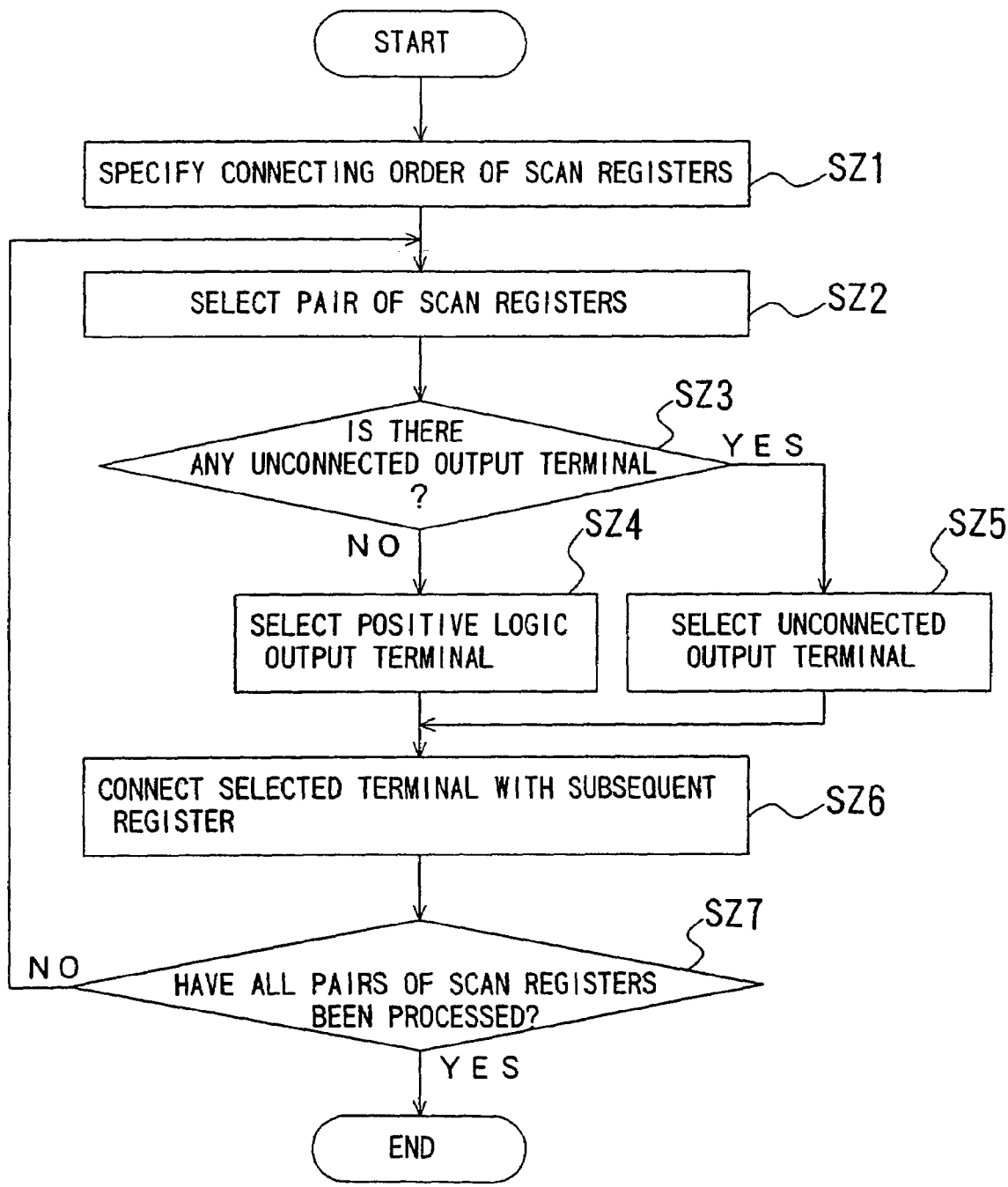
FIG. 25 is a flow chart for showing a conventional method of designing a semiconductor integrated circuit.

FIG. 24 is a circuit diagram obtained by conducting the allocating and interconnecting procedures of FIGS. 7 and 8 on a semiconductor integrated circuit of FIG. 21. In FIG. 24, a reference numeral 20A denotes an area for allocating and interconnecting the semiconductor integrated circuit after the formation of a scan chain, and the positions and the dimensions of respective elements reflect those of actual hardware. Reference numerals 21 through 25 are scan registers working as shift registers in the scan test, reference numerals 26 through 32 denote AND gates each outputting "1" when two input signals are both "1", reference numerals 33 through 35 denote inverters each outputting an inverted signal of an input signal, a reference numeral 36 denotes a scan-in terminal for inputting a signal for the scan test, and a reference numeral 37 denotes a scan-out terminal for outputting the signal for the scan test. A reference numeral 41C denotes a wire for connecting the negative logic output terminal NQ of the scan register 21 with the scan data input terminal SI of the scan register 22, a reference numeral 42C denotes a wire for connecting the negative logic output terminal NQ of the scan register 22 with the scan data input terminal SI of the scan register 23, a reference numeral 43C denotes a wire for connecting the negative logic output terminal NQ of the scan register 23 with the scan data input terminal SI of the scan register 24, a reference numeral 44C denotes a wire for connecting the negative logic output terminal NQ of the scan register 24 with the scan data input terminal SI of the scan register 25, and a reference numeral 45C denotes a wire for connecting the positive logic output terminal Q of the scan register 25 with the scan-out terminal 37.

The procedures of FIGS. 7 and 8 are successively conducted on the semiconductor integrated circuit before the formation of the scan chain shown in FIG. 21 so as to connect the scan registers with one another as follows: First, in step SC1, it is specified that the scan registers are connected in the order of the scan register 21, the scan register 22, the scan register 23, the scan register 24, the scan register 25 and the scan-out terminal 37.

Next, in step SC2, the scan registers 21 through 25, the AND gates 26 through 32 and the inverters 33 through 35 are allocated, and in step SC3, the elements excluding the scan registers 21 through 25 are connected.

Then, in step SC4, the scan registers 21 and 22 are selected as a first pair.

Subsequently in step SC5, the fan-out of the positive logic output terminal Q and the negative logic output terminal NQ of the scan register 21 are respectively calculated. In this embodiment, the positive logic output terminal Q has fan-out of two, and the negative logic output terminal NQ has fan-out of one.

Next, in step SC6, the negative logic output terminal NQ having the minimum fan-out is selected on the basis of the calculation in step SC5, and in step SC7, the procedures of FIG. 8 are successively conducted.

First, in step SC7a of FIG. 8, a difference between the minimum fan-out and the fan-out of the positive logic output terminal Q of the scan register 21 is calculated, resulting in obtaining 1 in this embodiment.

Then, in step SC7b, since the difference in the fan-out is larger than the predetermined value α, i.e., 0, the procedure is determined to proceed to step SC7c.

In step SC7c, it is determined that the negative logic output terminal NQ having the minimum fan-out is connected with the scan data input terminal SI of the scan register 22.

Next, the procedure returns to step SC8 of FIG. 7, and since there remain four pairs of scan registers, the procedure returns to step SC4.

Then, in step SC4, the scan registers 22 and 23 are selected as a next pair. Table 3 below lists respective fan-out of the positive logic output terminal Q and the negative logic output terminal NQ of the scan register at the front stage with regard to each pair of adjacent scan registers.

TABLE 3

| | SCAN REGISTER | | | | | |
|---|---|---|---|---|---|---|
| | 21 | 22 | 23 | 24 | 25 | 37 |
| POSITIVE LOGIC OUTPUT TERMINAL Q | 2 | 1 | 1 | 2 | 0 | |
| NEGATIVE LOGIC OUTPUT TERMINAL NQ | 1 | 0 | 1 | 1 | 1 | |

Thereafter, the procedures of steps SC5 through SC8 are conducted on the pair of scan registers 22 and 23. As is listed in Table 3, the fan-out of the positive logic output terminal Q and the negative logic output terminal NQ of the scan register 22 are 1 and 0, respectively. Therefore, a difference in the fan-out is 1, which is larger than the predetermined value α, i.e., 0. As a result, the negative logic output terminal NQ having the minimum fan-out is determined to be connected.

Next, the procedures of steps SC5 through SC8 are conducted on a pair of scan registers 23 and 24. As is listed in Table 3, the fan-out of the positive logic output terminal Q and the negative logic output terminal NQ of the scan register 23 are both 1. Therefore, a difference in the fan-out is 0, which is equal to the predetermined value α, i.e., 0. As a result, the procedure is determined to proceed to step SC7d.

In step SC7d, the positive logic output terminal Q and the negative logic output terminal NQ of the scan register 24 are registered for the possible connection list, and in step SC7e, the beeline distances on the substrate from the positive logic output terminal Q and the negative logic output terminal NQ listed in the possible connection list to the scan data input terminal SI of the scan register 24 at the rear stage are calculated. It is assumed that the positive logic output terminal Q has a beeline distance of 40 μm and the negative logic output terminal NQ has a beeline distance of 35 μm. As a result, in step SC7f, the negative logic output terminal NQ having the minimum beeline distance is determined to be connected with the scan data input terminal SI of the scan register 24.

Next, the procedures of steps SC5 through SC8 are conducted on a pair of scan registers 24 and 25. As is listed in Table 3, the fan-out of the positive logic output terminal Q and the negative logic output terminal NQ of the scan register 24 are 2 and 1, respectively. Therefore, a difference in the fan-out is 1, which is larger than the predetermined value α, i.e., 0. As a result, the negative logic output terminal NQ having the minimum fan-out is determined to be connected.

Next, the procedures of steps SC5 through SC8 are conducted on a pair of the scan register 25 and the scan-out terminal 37. As is listed in Table 3, the fan-out of the positive logic output terminal Q and the negative logic output terminal NQ of the scan register 25 are 0 and 1, respectively. Therefore, a difference in the fan-out is 1, which is larger than the predetermined value α, i.e., 0. As a result, the positive logic output terminal Q having the minimum fan-out is determined to be connected.

Then, the procedure proceeds to step SC8, and since all the pairs of scan registers have been processed, the procedure further proceeds to step SC9. In step SC9, the output terminals Q or NQ of the scan registers at the front stages are connected with the scan data input terminals SI of the scan registers at the rear stages or the scan-out terminal 37 as determined in step SC7. Thus, the scan chain connected through the wires 41C through 45C can be formed as shown in FIG. 24.

The wire 43C shown in FIG. 24 resulting from the aforementioned allocating and interconnecting procedures has a smaller length than the wire 43Z correspondingly used in the conventional method of designing a semiconductor integrated circuit shown in FIG. 26. Accordingly, the interconnecting area can be decreased.

Furthermore, since the scan register 21 is connected with the scan register 22 via the negative logic output terminal NQ having the smaller fan-out than the positive logic output terminal Q, the load of the positive logic output terminal Q of the scan register 21 can be prevented from increasing differently from the application of the conventional method. As a result, delay time of a signal from the positive logic output terminal Q to the AND gates 26 and 27 can be prevented from largely increasing. In addition, since the scan register 24 is connected with the scan register 25 via the negative logic output terminal NQ having the smaller fan-out than the positive logic output terminal Q, the load of the positive logic output terminal Q of the scan register 24 can be prevented from increasing. As a result, delay time of a signal from the positive logic output terminal Q to the inverters 34 and 35 can be prevented from largely increasing.

When step SC7 of FIG. 7 is not replaced with the procedures of FIG. 8, the output terminals of the scan registers at the front stages are connected with the scan data input terminals of the scan registers at the rear stages with the fan-out minimized. Therefore, since the output terminals of the scan register 23 of FIG. 24 have the same fan-out, a similar scan chain to that shown in FIG. 24 can be formed except that the positive logic output terminal Q can be connected with the scan data input terminal SI of the scan register 24 even when the previously selected output terminal Q is ultimately selected. Accordingly, delay time of not only a signal from the positive logic output terminal Q of the scan register 21 to the AND gates 26 and 27 but also a signal from the positive logic output terminal Q of the scan register 24 to the inverters 34 and 35 can be prevented from largely increasing.

Figure 9:
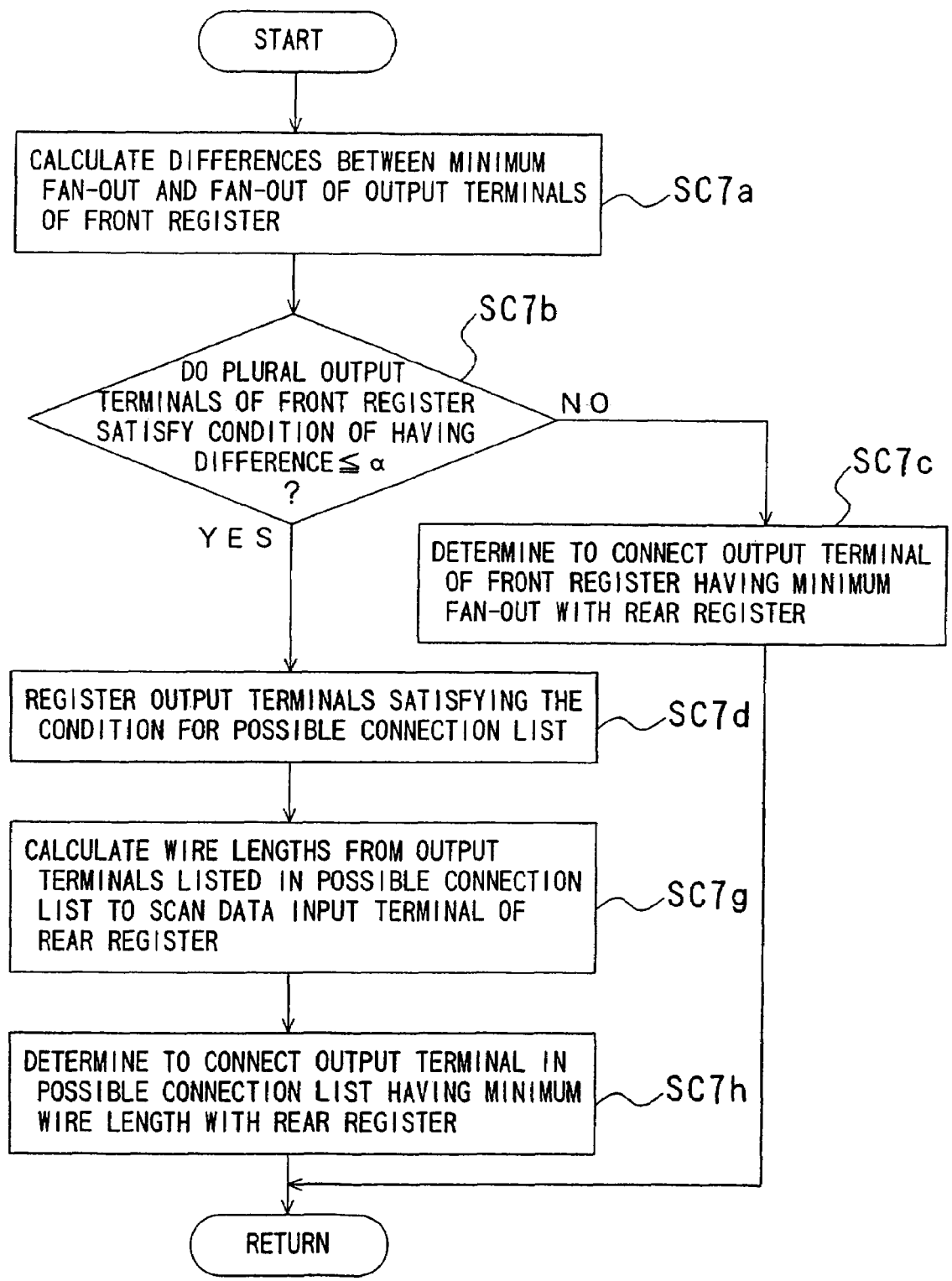
FIG. 9 is a flow chart for showing procedures for discriminating a wire length between terminals adoptable in the method of designing a semiconductor integrated circuit of the third embodiment.

FIG. 9 is a flow chart for procedures for selecting an output terminal having a smaller wire length by calculating the wire length on the substrate from each output terminal of the scan register at the front stage, adoptable in stead of the flow chart of FIG. 8 for selecting an output terminal having a smaller beeline distance by calculating the beeline distance from each output terminal of the scan register at the front stage to the scan data input terminal of a scan register at the rear stage. In FIG. 9, the same steps as those of FIG. 8 are referred to by using the same step numbers, and the description is omitted. In the flow chart of FIG. 9, the wire length from each output terminal listed in the possible connection list to the scan data input terminal of the scan register at the rear stage is calculated in step SC7g, and the output terminal of the scan register at the front stage having the minimum wire length is determined to be connected with the scan data input terminal of the scan register at the rear stage in step SC7h.

Now, an interconnecting method by adopting the procedures of FIG. 9 in stead of step SC7 of FIG. 7 will be described.

In step SC4 of FIG. 7, when the pair of scan registers 23 and 24 is selected, the difference in the fan-out is calculated to be 0 in step SC7a of FIG. 9. Then, in step SC7b, since the difference in the fan-out is equal to the predetermined value $\alpha$, i.e. 0, the procedure is determined to proceed to step SC7d.

Next, in step SC7d, the positive logic output terminal Q and the negative logic output terminal NQ are registered for the possible connection list. In step SC7g, the wire lengths from the positive logic output terminal Q and the negative logic output terminal NQ listed in the possible connection list to the scan data input terminal SI of the scan register 24 at the rear stage are calculated. It is herein assumed that the positive logic output terminal Q has a wire length of 60 μm and the negative logic output terminal NQ has a wire length of 50 μm.

Then, in step SC7h, the negative logic output terminal NQ having the minimum wire length is determined to be connected with the scan data input terminal SI of the scan register 24. As a result, the ultimate circuit diagram is obtained as the same scan chain as that shown in FIG. 24.

Accordingly, the wire 43C shown in FIG. 24 has a smaller length than the wire 43Z correspondingly used in the application of the conventional method of designing a semiconductor integrated circuit shown in FIG. 26, resulting in decreasing the interconnecting area.

Furthermore, since the load of the positive logic output terminal Q of the scan register 21 is prevented from increasing, the delay time of a signal from the positive logic output terminal Q of the scan register 21 to the AND gates 26 and 27 can be prevented from largely increasing. In addition, since the load of the positive logic output terminal Q of the scan register 24 is prevented from increasing, the delay time of a signal from the positive logic output terminal Q to the inverters 34 and 35 can be prevented from largely increasing.

The predetermined value $\alpha$ is specified as 0 in this embodiment, but the same effects can be attained when the predetermined value $\alpha$ is any arbitrary integer larger than 1.

EMBODIMENT 4

Figure 10:
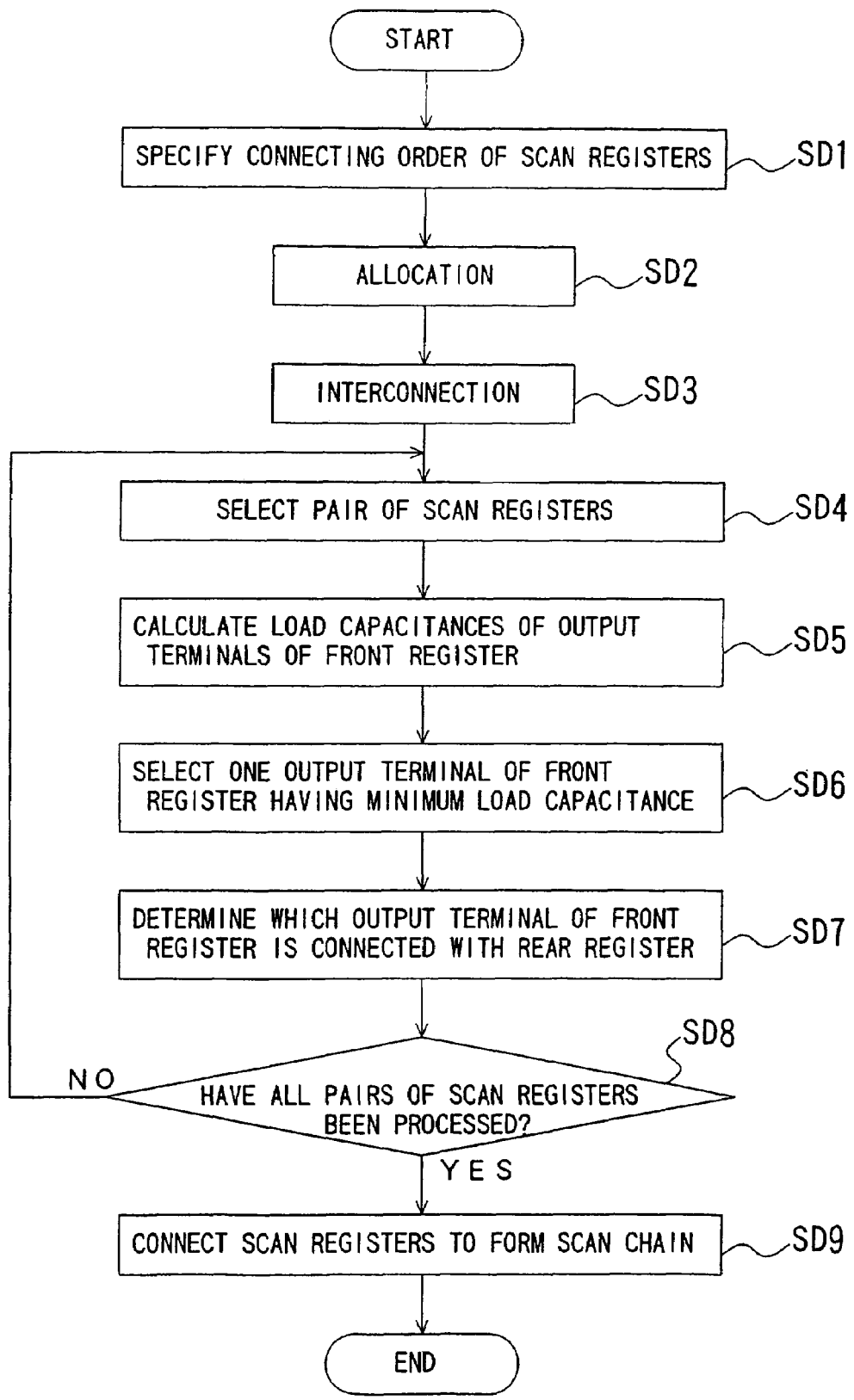
FIG. 10 is a flow chart for showing a method of designing a semiconductor integrated circuit according to a fourth embodiment of the invention.

A method of designing a semiconductor integrated circuit according to a fourth embodiment will now be described with reference to the accompanying drawings. FIG. 10 is a flow chart for showing the method of designing a semiconductor integrated circuit of this embodiment. In FIG. 10, steps SD1 through SD4, SD8 and SD9 respectively correspond to steps SA1 through SA4, SA8 and SA9 of FIG. 1, and the corresponding steps have the same contents. In step SD5, the load capacitance of each output terminal of a scan register at the front stage is calculated; in step SD6, the output terminal having the minimum load capacitance of the scan register at the front stage is selected; and in step SD7, it is determined which output terminal of the scan register at the front stage is connected with the scan data input terminal of the scan register at the rear stage. In step SD7, the output terminal of the scan register at the front stage selected in step SD6 is determined to be connected.

Figure 11:
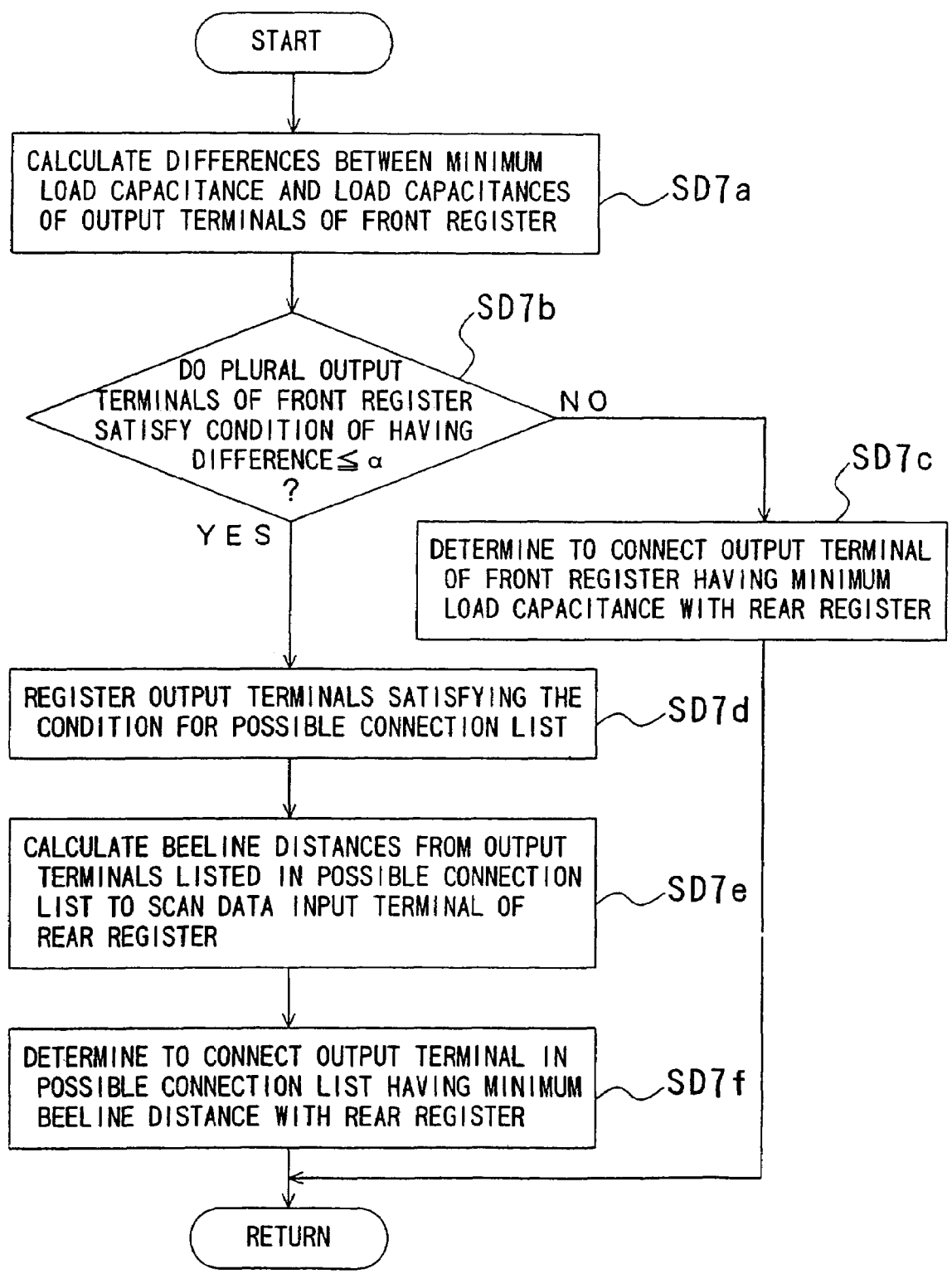
FIG. 11 is a flow chart for showing procedures for discriminating a beeline distance between terminals adoptable in the method of designing a semiconductor integrated circuit of the fourth embodiment.

FIG. 11 is a flow chart used in the case where any other output terminal has a load capacitance with a difference, from the minimum load capacitance selected in step SD6 of FIG. 10, equal to or smaller than a predetermined value. By using this flow chart, a beeline distance on the substrate from each output terminal to the scan data input terminal of the scan register at the rear stage is further discriminated for the purpose of decreasing not only the interconnecting area but also the load capacitance. Accordingly, when step SD7 of FIG. 10 is replaced with the flow chart of FIG. 11, the purpose can be achieved.

In the flow chart of FIG. 11, a difference in the load capacitance between the output terminal having the minimum load capacitance and another output terminal of the scan register at the front stage is calculated in step SD7a; it is discriminated whether or not the differences calculated in step SD7a of two or more output terminals are equal to or smaller than a predetermined value $\alpha$, including the output terminal having the minimum load capacitance, in step SD7b; it is determined that the output terminal having the minimum load capacitance of the scan register at the front stage is connected with the scan data input terminal of the scan register at the rear stage in step SD7c; the output terminals of the scan register at the front stage satisfying the condition of step SD7b are registered for a possible connection list in step SD7d; the beeline distance from each output terminal listed in the possible connection list to the scan data input terminal of the scan register at the rear stage is calculated in step SD7e; and it is determined that the output terminal having the minimum beeline distance is connected with the scan data input terminal of the scan register at the rear stage in step SD7f. In this embodiment, the predetermined value $\alpha$ for defining the range of the difference from the minimum load capacitance is 0.2 pF.

FIG. 24 is a circuit diagram obtained by conducting the allocating and interconnecting procedures of FIGS. 10 and 11 on a semiconductor integrated circuit of FIG. 21. FIG. 24 is referred to and described in the third embodiment, and hence is not described in detail in this embodiment.

The procedures of FIGS. 10 and 11 are successively conducted on the semiconductor integrated circuit before the formation of the scan chain shown in FIG. 21 so as to connect the scan registers with one another as follows: First, in step SD1, it is specified that the scan registers are connected in the order of the scan register 21, the scan register 22, the scan register 23, the scan register 24, the scan register 25 and the scan-out terminal 37.

Next, in step SD2, the scan registers 21 through 25, the AND gates 26 through 32 and the inverters 33 through 35 are allocated, and in step SD3, the elements excluding the scan registers 21 through 25 are connected.

Then, in step SD4, the scan registers 21 and 22 are selected as a first pair. Subsequently in step SD5, the load capacitances of the positive logic output terminal Q and the negative logic output terminal NQ of the scan register 21 are respectively calculated. In this embodiment, the positive logic output terminal Q is connected with the AND gates 26 and 27, and hence has a load capacitance of 2.0 pF. The negative logic output terminal NQ is connected with the AND gate 28, and hence has a load capacitance of 0.7 pF.

Next, in step SD6, the negative logic output terminal NQ having the minimum load capacitance is selected on the basis of the calculation in step SD5, and in step SD7, the procedures of FIG. 11 are successively conducted.

First, in step SD7a of FIG. 11, a difference between the minimum load capacitance and the load capacitance of the positive logic output terminal Q of the scan register 21 is calculated, resulting in obtaining 1.3 pF in this embodiment.

Then, in step SD7b, since the difference in the load capacitance is larger than the predetermined value $\alpha$, i.e., 0.2 pF, the procedure is determined to proceed to step SD7c.

In step SD7c, it is determined that the negative logic output terminal NQ having the minimum load capacitance is connected with the scan data input terminal SI of the scan register 22.

Next, the procedure returns to step SD8 of FIG. 10, and since there remain four pairs of scan registers, the procedure returns to step SD4.

Then, in step SD4, the scan registers 22 and 23 are selected as a next pair.

Table 4 below lists respective load capacitances of the positive logic output terminal Q and the negative logic output terminal NQ of the scan register at the front stage to the scan data input terminal SI of the scan register at the rear stage with regard to each pair of adjacent scan registers, wherein the unit of the load capacitance is pF.

TABLE 4

|  | SCAN REGISTER | | | | |
| --- | --- | --- | --- | --- | --- |
|  | 21 | 22 | 23 | 24 | 25 | 37 |
| POSITIVE LOGIC OUTPUT TERMINAL Q | 2.0 | 0.5 | 0.5 | 1.2 | 0 |
| NEGATIVE LOGIC OUTPUT TERMINAL NQ | 0.7 | 0 | 0.5 | 0.5 | 0.4 |

Thereafter, the procedures of steps SD5 through SD8 are conducted on the pair of scan registers 22 and 23. As is listed in Table 4, the load capacitances of the positive logic output terminal Q and the negative logic output terminal NQ of the scan register 22 are 0.5 pF and 0 pF, respectively. Therefore, a difference in the load capacitance is 0.5 pF, which is larger than the predetermined value $\alpha$, i.e., 0.2 pF. As a result, the negative logic output terminal NQ having the minimum load capacitance is determined to be connected.

Next, the procedures of steps SD5 through SD8 are conducted on a pair of scan registers 23 and 24. As is listed in Table 4, the load capacitances of the positive logic output terminal Q and the negative logic output terminal NQ of the scan register 23 are both 0.5 pF. Therefore, a difference in the load capacitance is 0, which is smaller than the predetermined value $\alpha$, i.e. 0.2 pF. As a result, the procedure is determined to proceed to step SD7d.

In step SD7d, the positive logic output terminal Q and the negative logic output terminal NQ of the scan register 23 are registered for the possible connection list, and in step SD7e, the beeline distances on the substrate from the positive logic output terminal Q and the negative logic output terminal NQ listed in the possible connection list to the scan data input terminal SI of the scan register 24 at the rear stage are calculated. It is assumed that the positive logic output terminal Q has a beeline distance of 40 µm and the negative logic output terminal NQ has a beeline distance of 35 µm. As a result, in step SD7f, the negative logic output terminal NQ having the minimum beeline distance is determined to be connected with the scan data input terminal of the scan register 24.

Next, the procedures of steps SD5 through SD8 are conducted on a pair of scan registers 24 and 25. As is listed in Table 4, the load capacitances of the positive logic output terminal Q and the negative logic output terminal NQ of the scan register 24 are 1.2 pF and 0.5 pF, respectively. Therefore, a difference in the load capacitance is 0.7 pF, which is larger than the predetermined value $\alpha$, i.e., 0.2 pF. As a result, the negative logic output terminal NQ having the minimum load capacitance is determined to be connected.

Next, the procedures of steps SD5 through SD8 are conducted on a pair of the scan register 25 and the scan-out terminal 37. As is listed in Table 4, the load capacitances of the positive logic output terminal Q and the negative logic output terminal NQ of the scan register 25 are 0 pF and 0.4 pF, respectively. Therefore, a difference in the load capacitance is 0.4 pF, which is larger than the predetermined value $\alpha$, i.e., 0.2 pF. As a result, the positive logic output terminal Q having the minimum load capacitance is determined to be connected.

Then, the procedure proceeds to step SD8, and since all the pairs of scan registers have been processed, the procedure further proceeds to step SD9. In step SD9, the output terminals Q or NQ of the scan registers at the front stages are connected with the scan data input terminals SI of the scan registers at the rear stages or the scan-out terminal 37 as determined in step SD7. Thus, the scan chain connected through the wires 41C through 45C can be formed as shown in FIG. 24.

The wire 43C shown in FIG. 24 resulting from the aforementioned allocating and interconnecting procedures has a smaller length than the wire 43Z correspondingly used in the conventional method of designing a semiconductor integrated circuit shown in FIG. 26. Accordingly, the interconnecting area can be decreased.

Furthermore, since the scan register 21 is connected with the scan register 22 via the negative logic output terminal NQ having the smaller load capacitance than the positive logic output terminal Q, the load of the positive logic output terminal Q of the scan register 21 can be prevented from increasing differently from the application of the conventional method. As a result, delay time of a signal from the positive logic output terminal Q to the AND gates 26 and 27 can be prevented from largely increasing. In addition, since the scan register 24 is connected with the scan register 25 via the negative logic output terminal NQ having the smaller load capacitance than the positive logic output terminal Q, the load of the positive logic output terminal Q of the scan register 24 can be prevented from increasing. As a result, delay time of a signal from the positive logic output terminal Q to the inverters 34 and 35 can be prevented from largely increasing.

When step SD7 of FIG. 11 is not replaced with the procedures of FIG. 10, the output terminals of the scan registers at the front stages are connected with the scan data input terminals of the scan registers at the rear stages with the load capacitances minimized. Therefore, a similar scan chain to that shown in FIG. 24 can be formed except that the positive logic output terminal Q can be connected with the scan data input terminal SI of the scan register 24 when the previously selected output terminal Q is ultimately selected in the case where the output terminals of the scan register 23 of FIG. 24 have the same load capacitance. Accordingly, delay time of not only a signal from the positive logic output terminal Q of the scan register 21 to the AND gates 26 and 27 but also a signal from the positive logic output terminal Q of the scan register 24 to the inverters 34 and 35 can be prevented from largely increasing.

Figure 12:
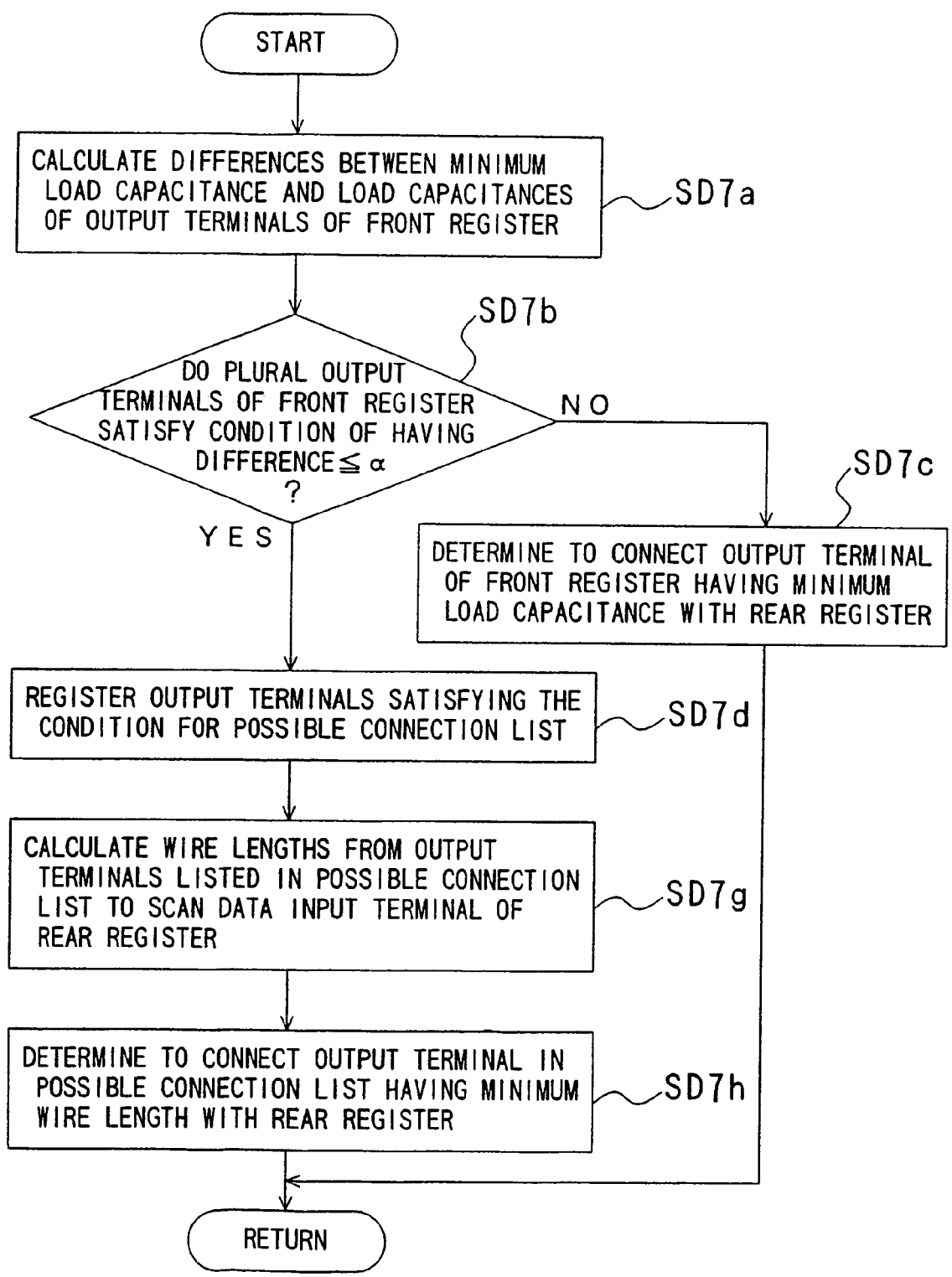
FIG. 12 is a flow chart for showing procedures for discriminating a wire length between terminals adoptable in the method of designing a semiconductor integrated circuit of the fourth embodiment.

FIG. 12 is a flow chart for procedures for selecting an output terminal having a smaller wire length by calculating the wire length on the substrate from each output terminal of the scan register at the front stage, adoptable in stead of the flow chart of FIG. 11 for selecting an output terminal having a smaller beeline distance by calculating the beeline distance from each output terminal of the scan register at the front stage to the scan data input terminal of a scan register at the rear stage. In FIG. 12, the same steps as those of FIG. 11 are referred to by using the same step numbers, and the description is omitted. In the flow chart of FIG. 12, the wire length from each output terminal listed in the possible connection list to the scan data input terminal of a scan register at the rear stage is calculated in step SD7g, and the output terminal of the scan register at the front stage having the minimum wire length is determined to be connected with the scan data input terminal of the scan register at the rear stage in step SD7h.

Now, an interconnecting method by adopting the procedures of FIG. 12 in stead of step SD7 of FIG. 10 will be described.

In step SD4 of FIG. 10, when the pair of scan registers 23 and 24 is selected, the difference in the load capacitance is calculated to be 0 in step SD7a of FIG. 12. Then, in step SD7b, since the difference in the load capacitance is smaller than the predetermined value α, i.e. 0.2 pF, the procedure is determined to proceed to step SD7d.

Next, in step SD7d, the positive logic output terminal Q and the negative logic output terminal NQ are registered for the possible connection list. In step SD7g, the wire lengths from the positive logic output terminal Q and the negative logic output terminal NQ listed in the possible connection list to the scan data input terminal SI of the scan register 24 at the rear stage are calculated. It is herein assumed that the positive logic output terminal Q has a wire length of 60 μm and the negative logic output terminal NQ has a wire length of 50 μm. Therefore, in step SD7h, the negative logic output terminal NQ having the minimum wire length is determined to be connected with the scan data input terminal SI of the scan register 24. As a result, the ultimate circuit diagram is obtained as the same scan chain as that shown in FIG. 24.

Accordingly, the wire 43C shown in FIG. 24 has a smaller length than the wire 43Z correspondingly used in the application of the conventional method of designing a semiconductor integrated circuit shown in FIG. 26, resulting in decreasing the interconnecting area.

Furthermore, since the load of the positive logic output terminal Q of the scan register 21 is prevented from increasing, the delay time of a signal from the positive logic output terminal Q of the scan register 21 to the AND gates 26 and 27 can be prevented from largely increasing. In addition, since the load of the positive logic output terminal Q of the scan register 24 is prevented from increasing, the delay time of a signal from the positive logic output terminal Q to the inverters 34 and 35 can be prevented from largely increasing.

The predetermined value α is specified as 0.2 pF in this embodiment, but the same effects can be attained when the predetermined value α is any arbitrary value larger than 0 pF.

EMBODIMENT 5

Figure 13:
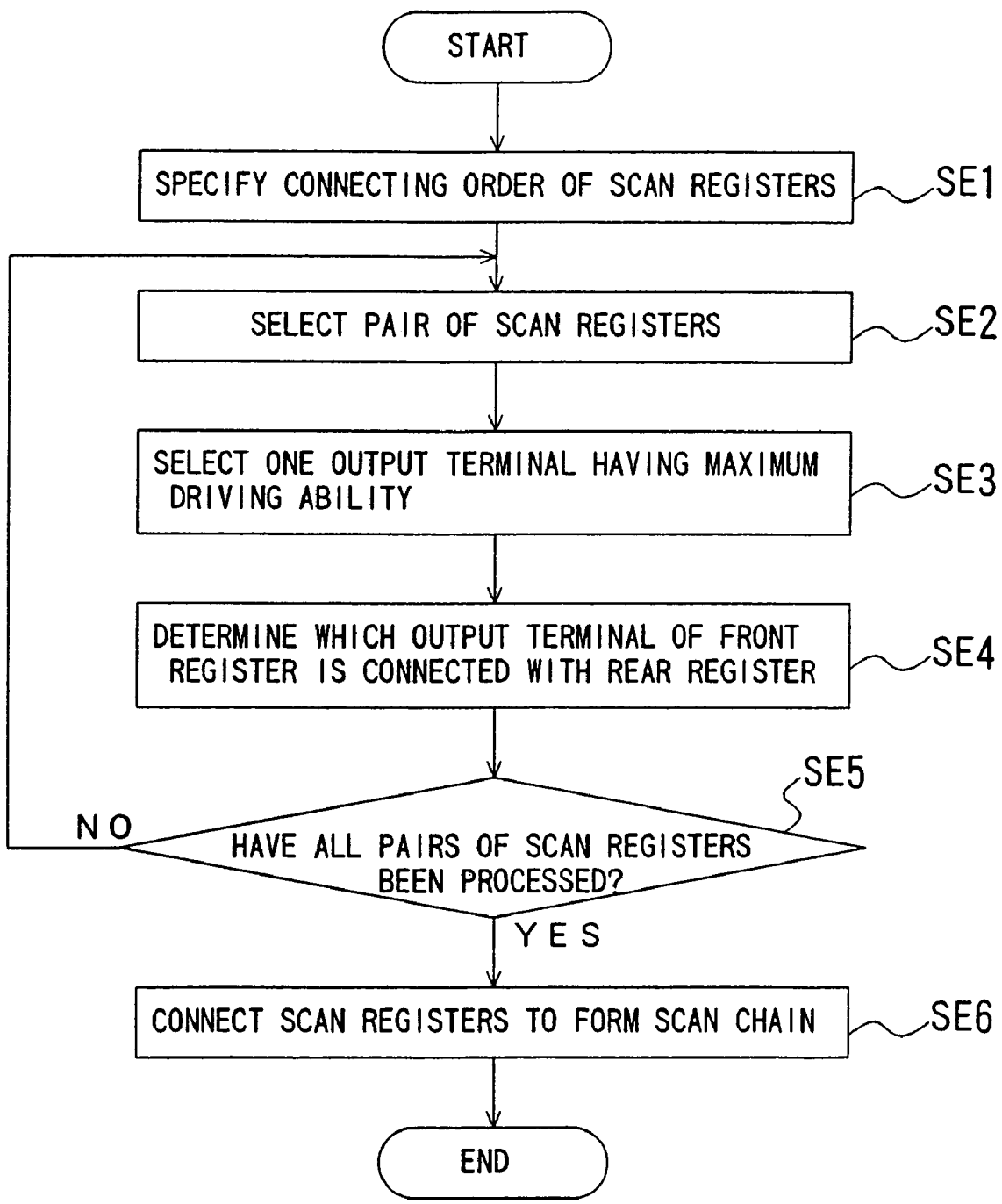
FIG. 13 is a flow chart for showing a method of designing a semiconductor integrated circuit according to a fifth embodiment of the invention.

A method of designing a semiconductor integrated circuit according to a fifth embodiment will now be described with reference to the accompanying drawings. FIG. 13 is a flow chart for showing the method of designing a semiconductor integrated circuit of this embodiment. In the flow chart of FIG. 13, the connecting order of scan registers is specified in step SE1; a pair of scan registers at adjacent stages are selected in step SE2; one of the output terminals of the scan register at the front stage having the maximum driving ability is selected in step SE3; it is determined which output terminal of the scan register at the front stage is connected with the scan data input terminal of the scan register at the rear stage in step SE4; it is discriminated whether or not all pairs of the scan registers have been processed in step SE5; and the terminals are connected as determined in step SE4 so as to form a scan chain in step SE6.

The driving ability of an element used in this embodiment is indicated by unit of ns/pF and corresponds to a parameter having a characteristic that a larger driving ability decreases propagation time of a signal. The data of respective elements contained in a library are used as the driving abilities of the elements.

FIG. 24 is a circuit diagram obtained by conducting the allocating and interconnecting procedures of FIG. 13 on a semiconductor integrated circuit of FIG. 21. FIG. 24 is referred to and described in the third embodiment, and is not described in detail in this embodiment.

The procedures of FIG. 13 are successively conducted on the semiconductor integrated circuit before the formation of the scan chain shown in FIG. 21 so as to connect the scan registers with one another as follows: First, in step SE1, it is specified that the scan registers are connected in the order of the scan register 21, the scan register 22, the scan register 23, the scan register 24, the scan register 25 and the scan-out terminal 37.

Next, in step SE2, the scan registers 21 and 22 are selected as a first pair.

Subsequently in step SE3, one having a larger driving ability among the positive logic output terminal Q and the negative logic output terminal NQ of the scan register 21 is selected. For example, in this embodiment, it is assumed that the negative logic output terminal NQ has a larger driving ability than the positive logic output terminal Q in each of the scan registers 21 through 25.

Next, in step SE4, the negative logic output terminal NQ having the maximum driving ability is determined to be connected with the scan data input terminal SI of the scan register 22.

Next, in step SE5, since there remain four pairs of scan registers, the procedure returns to step SE2.

Then, in step SE2, the scan registers 22 and 23 are selected as a next pair.

Thereafter, the procedures of steps SE3 through SE5 are conducted on the pair of scan registers 22 and 23. Since the negative logic output terminal NQ of the scan register 22 has a larger driving ability than the positive logic output terminal Q, the negative logic output terminal NQ is determined to be connected.

Next, the procedures of steps SE3 through SE5 are respectively conducted on pairs of scan registers 23 and 24, and scan registers 24 and 25. Since the negative logic output terminals NQ of the scan registers 23 and 24 have larger driving ability than their positive logic output terminals Q, the negative logic output terminals NQ of the scan registers 23 and 24 are respectively determined to be connected.

Then, the procedures of step SE3 through SE5 are conducted on a pair of the scan register 25 and the scan-out terminal 37. Since the negative logic output terminal NQ of the scan register 25 has a larger driving ability than the positive logic output terminal Q, the negative logic output terminal NQ is determined to be connected.

Then, the procedure proceeds to step SE5, and since all the pairs of scan registers have been processed, the procedure further proceeds to step SE6.

In step SE6, the output terminals Q or NQ of the scan registers at the front stages are connected with the scan data input terminals SI of the scan registers at the rear stages or the scan-out terminal 37 as determined in step SE4. Thus, the scan chain connected through the wires 41C through 45C can be formed as shown in FIG. 24.

In the scan register 23 of FIG. 24 obtained through the aforementioned interconnecting procedures, even when the positive logic output terminal Q and the negative logic output terminal NQ have the same load capacitance, the negative logic output terminal NQ having the larger driving ability is used to be connected with the scan data input terminal SI of the scan register 24. Accordingly, the load of the positive logic output terminal Q of the scan register 24 can be prevented from increasing. As a result, delay time of a signal from the positive logic output terminal Q to the AND gate 30 and a signal from the negative logic output terminal NQ to the inverter 33 can be prevented from increasing.

Figure 14:
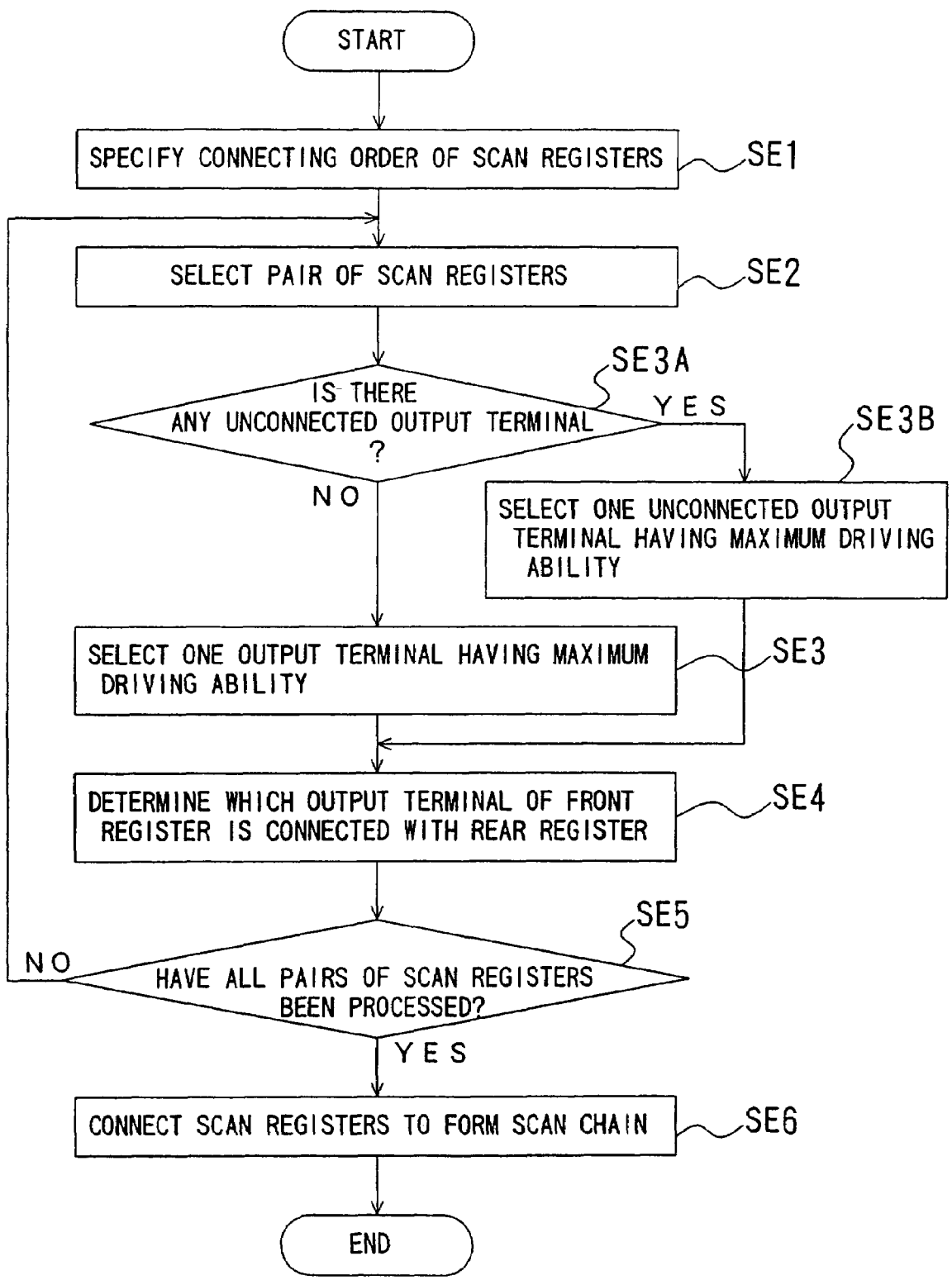
FIG. 14 is a flow chart for showing procedures for discriminating an unconnected output terminal adoptable in the method of designing a semiconductor integrated circuit of the fifth embodiment.

A flow chart of FIG. 14 additionally includes, before selecting an output terminal having the maximum driving ability among the output terminals of the scan register at the front stage in step SE3 of FIG. 13, step SE3A of discriminating whether or not there is any unconnected output terminal and step SE3B of selecting one having the maximum driving ability among the unconnected output terminals when there are any unconnected output terminals. In the case where this flow chart is used, when the scan register at the front stage has any unconnected output terminals, it is possible to definitely suppress the increase of delay time of a signal in the scan register without discriminating the driving ability of the scan register at the front stage.

When the procedures of FIG. 14 are conducted on the semiconductor integrated circuit before the formation of the scan chain shown in FIG. 21, the interconnecting procedures are different from those of FIG. 13 merely as follows:

In selecting the pair of scan registers 22 and 23, the negative logic output terminal NQ of the scan register 22 is connected with the scan data input terminal SI of the scan register 23 at the rear stage regardless of the driving ability of the unconnected negative output terminal NQ. In selecting the pair of scan register 25 and the scan-out terminal 37, the positive logic output terminal Q of the scan register 25 is connected with the scan-out terminal 37 regardless of the driving ability of the unconnected positive logic output terminal Q.

EMBODIMENT 6

A method of designing a semiconductor integrated circuit according to a sixth embodiment will now be described with reference to the accompanying drawings. In this embodiment, in connecting paths in a combinational circuit from one output terminal of a scan register to another register, an external output port, a ROM or a RAM, a difference between delay time of a signal in the connecting path having the largest delay time and one cycle time of a clock signal is designated as a design margin of the output terminal of the scan register. Also, in this embodiment, it is assumed, for convenience, that the design margin of an output terminal of a scan register at the front stage is decreased uniformly by 1 ns through the connection of the output terminal of the scan register at the front stage with the scan data input terminal of a scan register at the rear stage. At this point, the delay time of a signal in a connecting path is assumed to be a value obtained by multiplying propagation time of respective elements registered in a library, and an unconnected output terminal is assumed to have a design margin of infinity.

Figure 15:
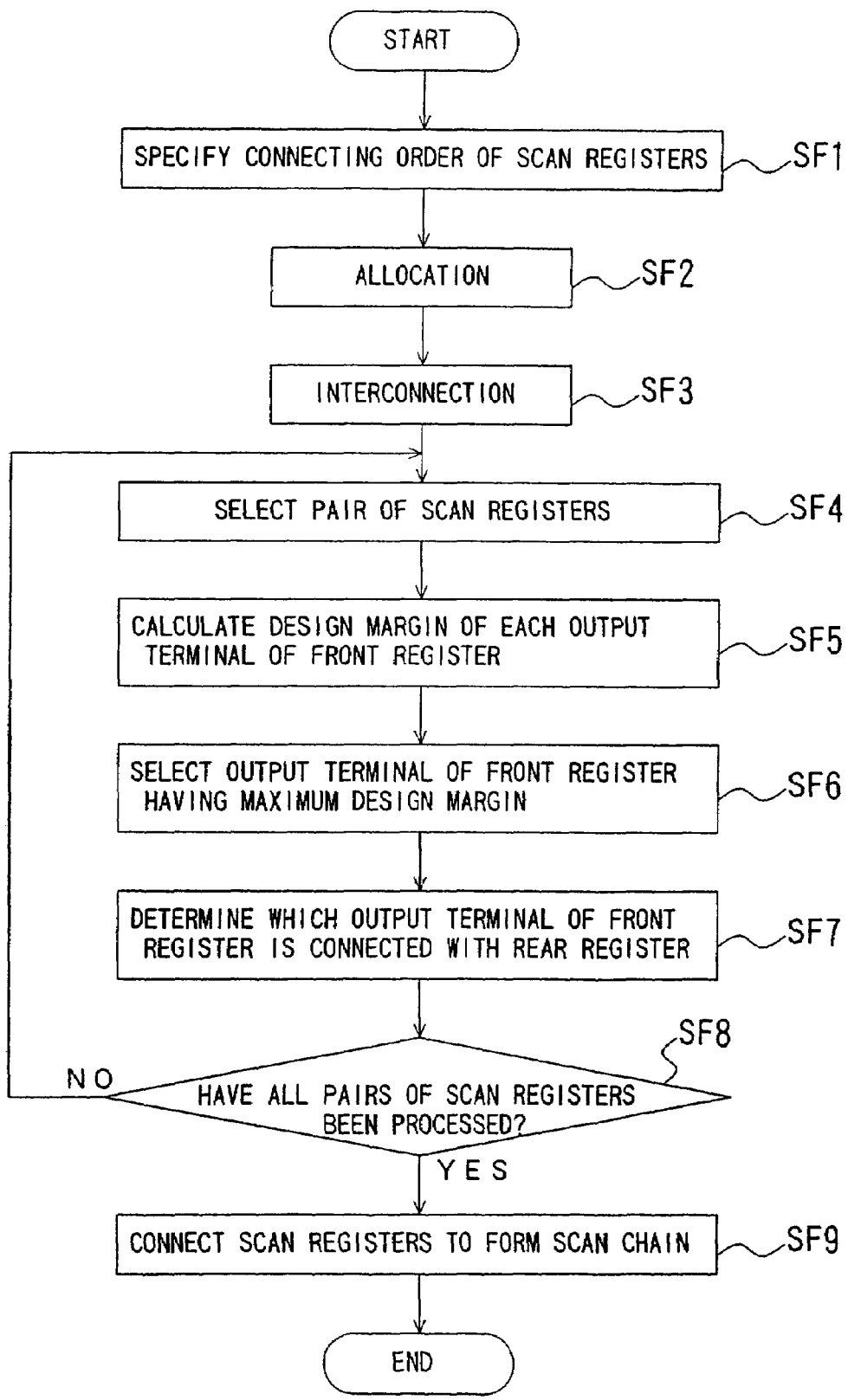
FIG. 15 is a flow chart for showing a method of designing a semiconductor integrated circuit according to a sixth embodiment of the invention.

FIG. 15 is a flow chart for showing the method of designing a semiconductor integrated circuit of this embodiment. In FIG. 15, steps SF1 through SF4, SF8 and SF9 respectively correspond to steps SA1 through SA4, SA8 and SA9 of FIG. 1, and the corresponding steps have the same contents. In step SF5, the design margin of each output terminal of a scan register at the front stage is calculated; in step SF6, one of the output terminals having the maximum design margin of the scan register at the front stage is selected; and in step SF7, it is determined which output terminal of the scan register at the front stage is connected with the scan data input terminal of the scan register at the rear stage. In step SF7, the output terminal of the scan register at the front stage selected in step SF6 is determined to be connected.

FIG. 24 is a circuit diagram obtained by conducting the allocating and interconnecting procedures of FIG. 15 on a semiconductor integrated circuit of FIG. 21. FIG. 24 is referred to and described in the third embodiment, and hence is not described in detail in this embodiment.

The procedures of FIG. 15 are successively conducted on the semiconductor integrated circuit before the formation of the scan chain shown in FIG. 21 so as to connect the scan registers with one another as follows: First, in step SF1, it is specified the scan registers are connected in the order of the scan register 21, the scan register 22, the scan register 23, the scan register 24, the scan register 25 and the scan-out terminal 37.

Next, in step SF2, the scan registers 21 through 25, the AND gates 26 through 32 and the inverters 33 through 35 are allocated, and in step SF3, the elements excluding the scan registers 21 through 25 are connected.

Then, in step SF4, the scan registers 21 and 22 are selected as a first pair. Subsequently in step SF5, the design margins of the positive logic output terminal Q and the negative logic output terminal NQ of the scan register 21 are respectively calculated. In this embodiment, it is assumed that the positive logic output terminal Q has a design margin of 1 ns and the negative logic output terminal NQ has a design margin of 3 ns.

Next, in step SF6, the negative logic output terminal NQ having the maximum design margin is selected on the basis of the calculation in step SF5, and in step SF7, the selected negative logic output terminal NQ is determined to be connected with the scan data input terminal SI of the scan register 22 at the rear stage.

Next, in step SF8, since there remain four pairs of scan registers, the procedure returns to step SF4.

Then, in step SF4, the scan registers 22 and 23 are selected as a next pair.

Table 5 below lists respective design margins of the positive logic output terminal Q and the negative logic output terminal NQ of a scan register at the front stage with regard to each pair of adjacent scan registers, wherein the unit of the design margin is ns.

TABLE 5

| | SCAN REGISTER | | | | | |
| --- | --- | --- | --- | --- | --- | --- |
| | 21 | 22 | 23 | 24 | 25 | 37 |
| POSITIVE LOGIC OUTPUT TERMINAL Q | 1 | 4 | 2 | 0.5 | | ∞ |
| NEGATIVE LOGIC OUTPUT TERMINAL NQ | 3 | ∞ | 4 | 2 | | 5 |

Thereafter, the procedures of steps SF5 through SF8 are conducted on the pair of scan registers 22 and 23. As is listed in Table 5, the design margins of the positive logic output terminal Q and the negative logic output terminal NQ of the scan register 22 are 4 ns and infinity, respectively. Therefore, the negative logic output terminal NQ having the maximum design margin is determined to be connected.

Next, the procedures of steps SF5 through SF8 are conducted on a pair of scan registers 23 and 24. As is listed in Table 5, the design margins of the positive logic output terminal Q and the negative logic output terminal NQ of the scan register 23 are 2 ns and 4 ns, respectively. Therefore, the negative logic output terminal NQ having the maximum design margin is determined to be connected.

Next, the procedures of steps SF5 through SF8 are conducted on a pair of scan registers 24 and 25. As is listed in Table 5, the design margins of the positive logic output terminal Q and the negative logic output terminal NQ of the scan register 24 are 0.5 ns and 2 ns, respectively. Therefore, the negative logic output terminal NQ having the maximum design margin is determined to be connected.

Next, the procedures of steps SF5 through SF8 are conducted on a pair of the scan register 25 and the scan-out terminal 37. As is listed in Table 5, the design margins of the positive logic output terminal Q and the negative logic output terminal NQ of the scan register 25 are infinity and 5 ns, respectively. Therefore, the positive logic output terminal Q having the maximum design margin is determined to be connected.

Then, the procedure proceeds to step SF8, and since all the pairs of scan registers have been processed, the procedure further proceeds to step SF9.

In step SF9, the output terminals Q or NQ of the scan registers at the front stages are connected with the scan data input terminals SI of the scan registers at the rear stages or the scan-out terminal 37 as determined in step SF7. Thus, the scan chain connected through the wires 41C through 45C can be formed as shown in FIG. 24.

In this embodiment, it is assumed that the design margin is decreased by 1 ns through the connection of the scan registers. Therefore, the negative logic output terminals NQ of the scan registers 21, 23 and 24 shown in FIG. 24 after the formation of the scan chain respectively have the design margins of 2 ns, 3 ns and 1 ns.

In contrast, in the scan chain formed by the conventional method shown in FIG. 26, the positive logic output terminals Q of the scan registers 21, 23 and 24 respectively have the design margins of 0 ns, 1 ns and −0.5 ns. This means that the scan register 21 has no margin at all and that violation in timing can be caused in the scan register 24.

In this manner, the method of designing a semiconductor integrated circuit of this embodiment can prevent occurrence of a timing constraining problem due to the formation of a scan chain.

Furthermore, since the design margin is decreased by 1 ns through the connection of the scan registers, any output terminals having a design margin of 1 ns or more listed in Table 5 can attain a design margin of 0 ns or more after the formation of the scan chain, so as to achieve the same effects. Accordingly, it is not always necessary to select the output terminals having the maximum design margins.

EMBODIMENT 7

A method of designing a semiconductor integrated circuit according to a seventh embodiment will now be described with reference to the accompanying drawings. This embodiment is different from the sixth embodiment as follows: In the sixth embodiment, it is assumed that the design margin is decreased uniformly by 1 ns through the connection between the output terminal of a scan register at the front stage and the scan data input terminal of a scan register at the rear stage. In this embodiment, the decrease amount of the design margin is calculated through assumed connection between each output terminal of a scan register at the front stage and the scan data input terminal of scan register at the rear stage.

Figure 16:
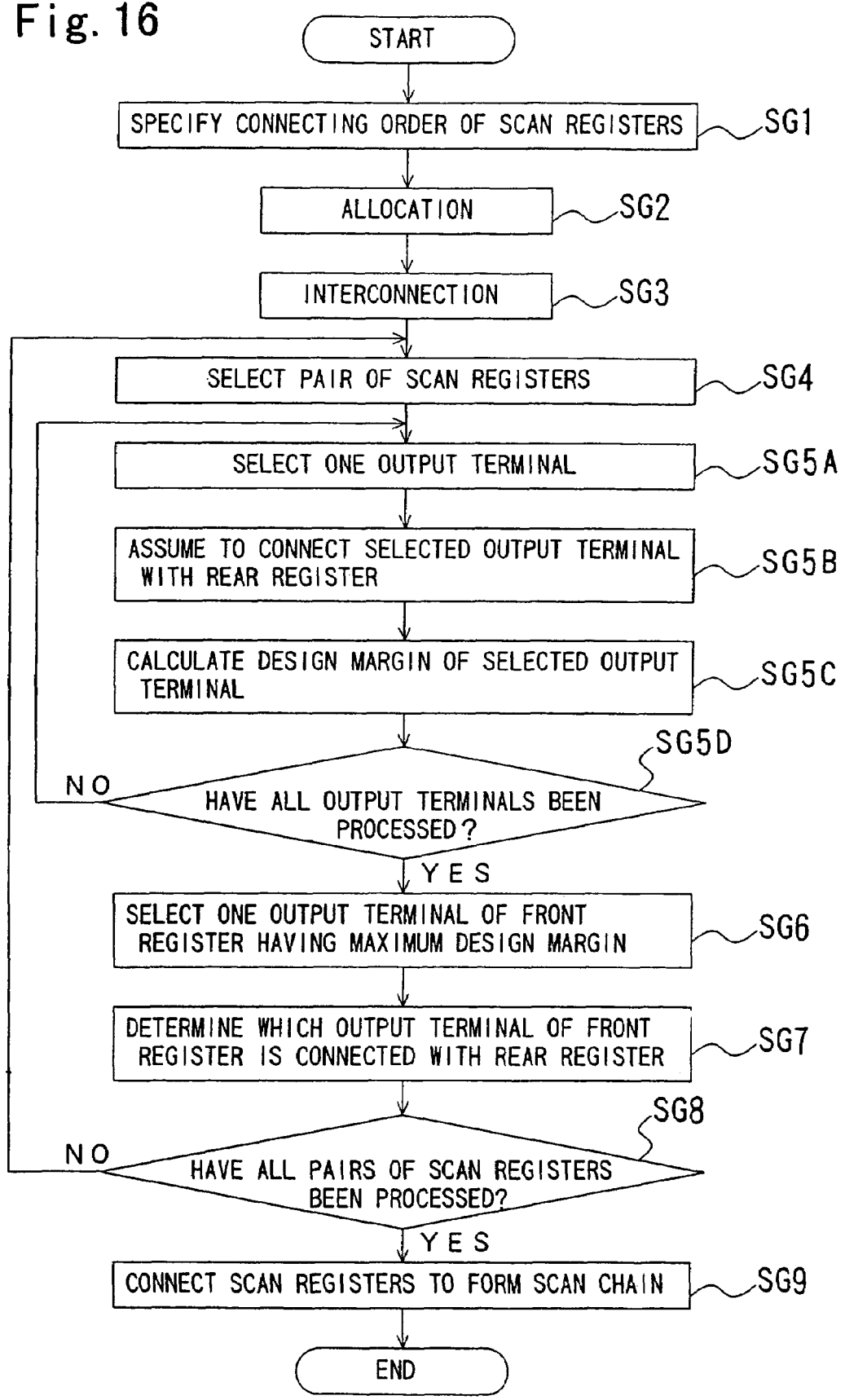
FIG. 16 is a flow chart for showing a method of designing a semiconductor integrated circuit according to a seventh embodiment of the invention.

FIG. 16 is a flow chart for showing the method of designing a semiconductor integrated circuit of this embodiment. In FIG. 16, steps SG1 through SG4, SG8 and SG9 respectively correspond to steps SA1 through SA4, SA8 and SA9 of FIG. 1, and the corresponding steps have the same contents. In step SG5A, one of output terminals of a scan register is selected; in step SG5B, the output terminal selected in step SG5A is assumed to be connected with the scan data input terminal of a scan register at the rear stage; in step SG5C, the design margin of the output terminal assumed to be connected in step SG5B is calculated; in step SG5D, it is discriminated whether or not the calculation on all the output terminals of the scan register under consideration is completed; in step SG6, one of the output terminals having the maximum design margin of the scan register at the front stage is selected; and in step SG7, it is determined which output terminal of the scan register at the front stage is connected with the scan data input terminal of the scan register at the rear stage. In step SG7, the output terminal of the scan register at the front stage selected in step SG6 is determined to be connected.

FIG. 24 is a circuit diagram obtained by conducting the allocating and interconnecting procedures of FIG. 16 on a semiconductor integrated circuit of FIG. 21. FIG. 24 is referred to and described in the third embodiment, and hence is not described in detail in this embodiment.

The procedures of FIG. 16 are successively conducted on the semiconductor integrated circuit before the formation of the scan chain shown in FIG. 21 so as to connect the scan registers with one another as follows: First, in step SG1, it is specified that the scan registers are connected in the order of the scan register 21, the scan register 22, the scan register 23, the scan register 24, the scan register 25 and the scan-out terminal 37.

Next, in step SG2, the scan registers 21 through 25, the AND gates 26 through 32 and the inverters 33 through 35 are allocated, and in step SG3, the elements excluding the scan registers 21 through 25 are connected.

Then, in step SG4, the scan registers 21 and 22 are selected as a first pair. Subsequently in step SG5A, the positive logic output terminal Q of the scan register 21 is selected.

Next, in step SG5B, it is assumed that the selected positive logic output terminal Q is connected with the scan data input terminal SI of the scan register 22, and in step SG5C, the design margin of the positive logic output terminal Q of the scan register 21 is calculated. In this embodiment, it is assumed that the design margin of the positive logic output terminal Q is calculated to be 1 ns.

Then, in discrimination in step SG5D, since there remains a negative logic output-terminal NQ, the procedure returns to step SG5A.

In step SG5A, the negative logic output terminal NQ is selected, and in step SG5B, it is assumed that the negative logic output terminal NQ is connected with the scan data input terminal SI of the scan register 22.

Then, in step SG5C, the design margin of the negative logic output terminal NQ of the scan register 21, which has been assumed to be connected, is calculated. In this embodiment, it is assumed that the design margin is calculated to be 3 ns.

Subsequently, in discrimination in step SG5D, there remains no other output terminal, the procedure proceeds to step SG6.

Next, in step SG6, the negative logic output terminal NQ having the maximum design margin is selected on the basis of the calculation in step SG5C, and in step SG7, the selected negative logic output terminal NQ is determined to be connected with the scan data input terminal SI of the scan register 22 at the rear stage.

Next, in step SG8, since there remain four pairs of scan registers, the procedure returns to step SG4.

Then, in step SG4, the scan registers 22 and 23 are selected as a next pair.

Table 6 below lists respective design margins of the positive logic output terminal Q and the negative logic output terminal NQ of the scan register at the front stage calculated through the assumption that the respective output terminals are connected with the scan data input terminal SI of the scan register at the rear stage, with regard to each pair of adjacent scan registers, wherein the unit of the design margin is ns.

TABLE 6

| | SCAN REGISTER | | | | |
|---|---|---|---|---|---|
| | 21 | 22 | 23 | 24 | 25 | 37 |
| POSITIVE LOGIC OUTPUT TERMINAL Q | 0 | 3 | 1 | −0.5 | ∞ | |
| NEGATIVE LOGIC OUTPUT TERMINAL NQ | 2 | ∞ | 3 | 1 | 4 | |

Thereafter, the procedures of steps SG5 through SG8 are conducted on the pair of scan registers 22 and 23. As is listed in Table 6, the design margins of the positive logic output terminal Q and the negative logic output terminal. NQ of the scan register 22 are 3 ns and infinity, respectively. Therefore, the negative logic output terminal NQ having the maximum design margin is determined to be connected.

Next, the procedures of steps SG5 through SG8 are conducted on a pair of scan registers 23 and 24. As is listed in Table 6, the design margins of the positive logic output terminal Q and the negative logic output terminal NQ of the scan register 23 are 1 ns and 3 ns, respectively. Therefore, the negative logic output terminal NQ having the maximum design margin is determined to be connected.

Next, the procedures of steps SG5 through SG8 are conducted on a pair of scan registers 24 and 25. As is listed in Table 6, the design margins of the positive logic output terminal Q and the negative logic output terminal NQ of the scan register 24 are −0.5 ns and 1 ns, respectively. Therefore, the negative logic output terminal NQ having the maximum design margin is determined to be connected.

Next, the procedures of steps SG5 through SG8 are conducted on a pair of the scan register 25 and the scan-out terminal 37. As is listed in Table 6, the design margins of the positive logic output terminal Q and the negative logic output terminal NQ of the scan register 25 are infinity and 3 ns, respectively. Therefore, the positive logic output terminal Q having the maximum design margin is determined to be connected.

Then, the procedure proceeds to step SG8, and since all the pairs of scan registers have been processed, the procedure further proceeds to step SG9.

In step SG9, the output terminals Q or NQ of the scan registers at the front stages are connected with the scan data input terminals SI of the scan registers at the rear stages or the scan-out terminal 37 as determined in step SG7. Thus, the scan chain connected through the wires 41C through 45C can be formed as shown in FIG. 24.

In this embodiment, the negative logic output terminals NQ of the scan registers 21, 23 and 24 shown in FIG. 24 after the formation of the scan chain respectively have the design margins of 2 ns, 3 ns and 1 ns.

In contrast, in the scan chain formed by the conventional method shown in FIG. 26, the positive logic output terminals Q of the scan registers 21, 23 and 24 respectively have the design margins of 0 ns, 1 ns and −0.5 ns. This means that the scan register 21 has no margin at all and that violation in timing can be caused in the scan register 24.

In this manner, the method of designing a semiconductor integrated circuit of this embodiment can further prevent occurrence of a timing constraining problem due to the formation of a scan chain because the design margin of a scan register at the front stage is calculated on the assumption that each output terminal of the scan register at the front stage is connected with the input terminal of a scan register at the rear stage.

Furthermore, in Table 6 which shows the design margins after the formation of the scan chain, any output terminal having a design margin of 0 ns or more can achieve the same effects. Accordingly, it is not always necessary to select the output terminals having the maximum design margins.

EMBODIMENT 8

Figure 17:
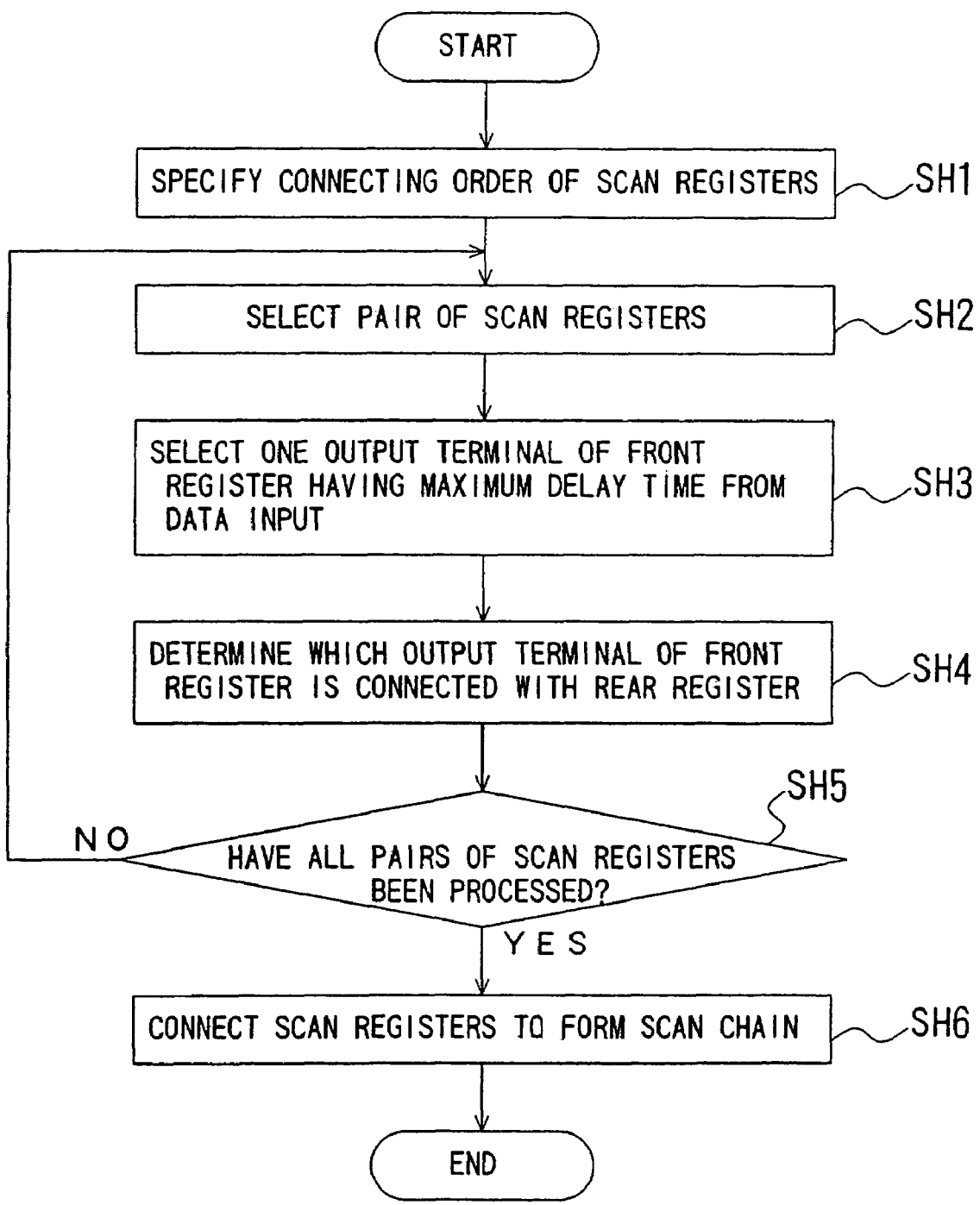
FIG. 17 is a flow chart for showing a method of designing a semiconductor integrated circuit according to an eighth embodiment of the invention.

A method of designing a semiconductor integrated circuit according to an eighth embodiment of the invention will now be described with reference to the accompanying drawings. FIG. 17 is a flow chart for showing the method of designing a semiconductor integrated circuit of this embodiment. In the flow chart of FIG. 1, the connecting order of scan registers is specified in step SH1; a pair of scan registers at adjacent stages is selected in step SH2; one of the output terminals of the scan register at the front stage having the maximum delay time from the scan data input terminal to the output terminal is selected in step SH3; it is determined which output terminal of the scan register at the front stage is connected with the scan data input terminal of the scan register at the rear stage in step SH4; it is discriminated whether or not all pairs of scan registers in the scan chain are completed to be processed in step SH5; and in step SH6, the output terminals of the scan registers at the front stage are connected with the scan data input terminals of the scan registers at the rear stages as determined in step SH4. It is noted that a combination of a scan register at the last stage and a scan-out terminal is also treated as a pair of scan registers in the scan chain in step SH2.

Figure 18:
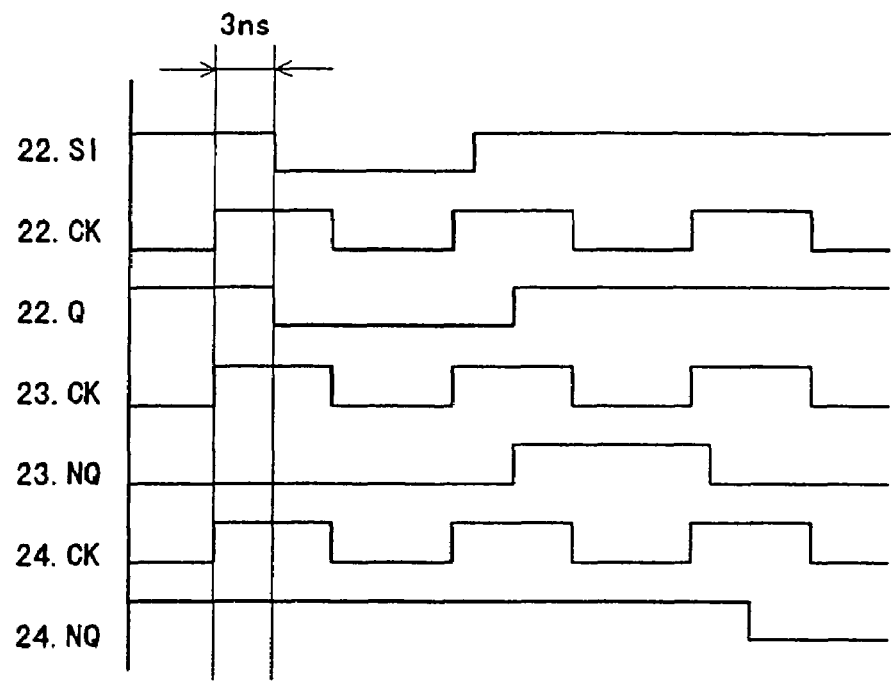
FIG. 18 is an ideal timing chart of a clock signal in the semiconductor integrated circuit designed by the method of the eighth embodiment.
Figure 19:
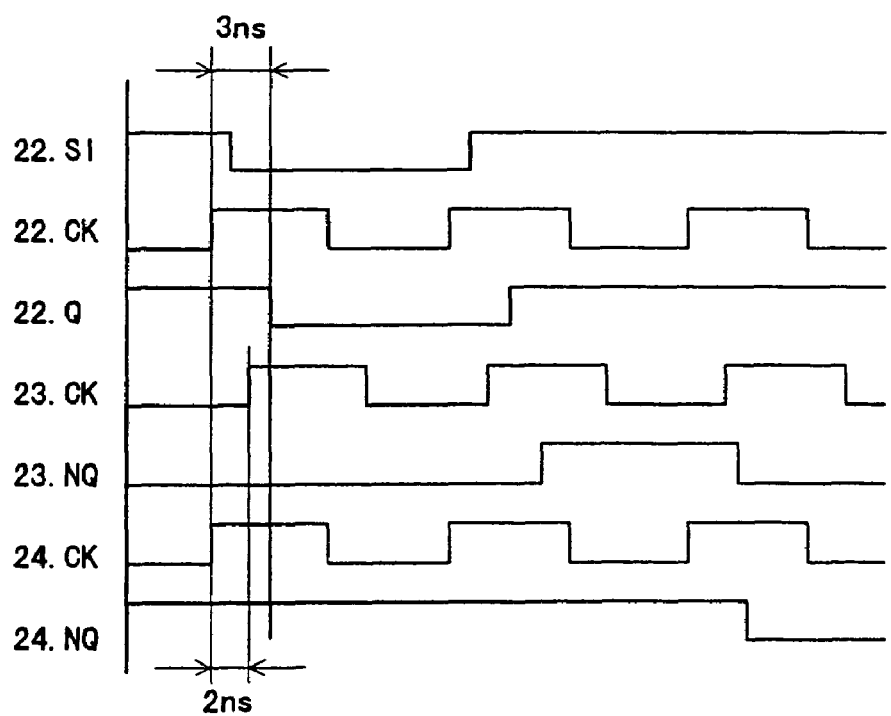
FIG. 19 is a timing chart in which there is fluctuation of a clock signal in the semiconductor integrated circuit designed by the method of the eighth embodiment.

FIGS. 18 and 19 are timing charts for showing the change of signals at the respective terminals of the scan registers 22, 23 and 24 in the circuit diagram of FIG. 22. In these charts, the change of a signal at the scan data input terminal SI of the scan register 22 is shown as 22.SI, the change of signals at the clock input terminals of the scan registers 22, 23 and 24 are shown as 22.CK, 23.CK and 24.CK, respectively, the change of signals at the negative logic output terminals NQ of the scan registers 22, 23 and 24 are shown as 22.NQ, 23.NQ and 24.NQ, respectively, and the change of signals at the positive logic output terminals Q of the scan registers 22, 23 and 24 are shown as 22.Q, 23.Q and 24.Q, respectively. It is assumed that macrocells A are used as the scan registers 21, 22 and 25, and macrocells B are used as the scan registers 23 and 24 in FIG. 21. Each of the macrocells A and B is logically identical to the scan register shown in FIG. 20. In the macrocell A, the delay time of a signal from the scan data input terminal SI to the positive logic output terminal Q and the negative logic output terminal NQ are 3 ns and 1 ns, respectively, and in the macrocell B, the delay time of a signal from the scan data input terminal SI to the positive logic output terminal Q and the negative logic output terminal NQ are 1 ns and 3 ns, respectively. In this embodiment, the description will be made on assumption that each wire has no delay time for convenience.

FIG. 22 is a circuit diagram obtained by conducting the procedures of FIG. 17 on the semiconductor integrated circuit before the formation of a scan chain shown in FIG. 21, wherein reference numerals 41A through 45A denote wires for forming the scan chain.

On the semiconductor integrated circuit of FIG. 21, first in step SH1, it is specified that the scan registers are connected in the order of the scan register 21, the scan register 22, the scan register 23, the scan register 24, and the scan register 25. Then, in step SH2, a pair of the scan registers 21 and 22 is selected. Next, in step SH3, among the output terminals Q and NQ of the scan register 21, the positive logic output terminal Q having the maximum delay time, namely, 3 ns, of a signal received at the scan data input terminal SI is selected. Then, in step SH4, the positive logic output terminal Q of the scan register 21 selected in step SH3 is determined to be connected with the scan data input terminal SI of the scan register 22. Subsequently, in step SH5, there still remain four pairs, namely, the scan registers 22 and 23, 23 and 24, 24 and 25, and the scan register 25 and the scan-out terminal 37, and hence, the procedure proceeds to step SH2.

In step SH2, the pair of the scan register 22 and 23 is selected. Then, in step SH3, among the output terminals Q and NQ of the scan register 22, the positive logic output terminal Q having the maximum delay time, namely, 3 ns, of a signal received at the scan data input terminal SI is selected. Next, in step SH4, the positive logic output terminal Q of the scan register 22 selected in step SH3 is determined to be connected with the scan data input terminal SI of the scan register 23. Subsequently, in step SH5, there still remain three pairs, namely, the scan registers 23 and 24, 24 and 25, and the scan register 25 and the scan-out terminal 37, and hence, the procedure proceeds to step SH2.

Similarly, with regard to the pair of scan registers 23 and 24, the negative logic output terminal NQ of the scan register 23 is determined to be connected with the scan data input terminal SI of the scan register 24. With regard to the pair of the scan registers 24 and 25, the negative logic output terminal NQ of the scan register 24 is determined to be connected with the scan data input terminal SI of the scan register 25. With regard to the pair of the scan register 25 and the scan-out terminal 37, the positive logic output terminal Q of the scan register 25 is determined to be connected with the scan-out terminal 37. Then, in step SH5, since all the pairs have been processed, the procedure proceeds to step SH6.

In step SH6, the output terminals determined to be connected in step SH4 are connected with the scan data input terminals SI of the scan registers at the rear stages or the scan-out terminal 37. Thus, the scan chain is formed.

As a result of the aforementioned procedures, the delay time of a signal received at the scan data input terminal SI of the scan register 22 to reach the scan data input terminal SI of the scan register 23 is 3 ns in this embodiment, while that obtained by the conventional method shown in FIG. 26 is 1 ns. Thus, the timing problem due to the skew of a clock signal can be suppressed in this embodiment. Similarly, the delay time of a signal received at the scan data input terminal SI of the scan register 23 to reach the scan data input terminal SI of the scan register 24 and the delay time of a signal received at the scan data input terminal SI of the scan register 24 to reach the scan data input terminal SI of the scan register 25 are 3 ns, respectively in this embodiment, while those obtained by the conventional method of FIG. 26 are 1 ns, respectively. Accordingly, the timing problem owing to the fluctuation of a clock signal can be suppressed in this embodiment. It is noted that delay of scan data input to each scan register cannot cause any problem such as a failure in fetching scan data because every scan data is fetched at the input of a clock signal.

Now, detailed description will be made with reference to the timing charts. FIG. 18 is an ideal timing chart where there is no fluctuation in timing of a clock signal reaching the clock input terminal of each of the scan registers 22 through 24. It is assumed that data of 1, 0 and 1 in this order are input to the scan data input terminal SI of the scan register 22 from the positive logic output terminal Q of the scan register 21 at the previous stage synchronously with the clock signal. Each of the positive logic output terminal Q of the scan register 22 and the negative logic output terminals NQ of the scan registers 23 and 24 outputs a data, received 3 ns after the input of the clock signal, to the scan data input terminal SI of the scan register at the subsequent stage. Accordingly, the input data is shifted by the scan registers 22, 23 and 24 in accordance with the clock signal, so that the signals at the positive logic output terminal Q of the scan register 22 and the negative logic output terminals NQ of the scan registers 23 and 24 attain values of 1, 0 and 0, respectively after three cycles of the clock signal.

FIG. 19 is a timing chart wherein the time of the clock signal reaching the scan register 23 is delayed by 2 ns as compared with that reaching the scan registers 22 and 24. In this case, since the signal at the positive logic output terminal Q of the scan register 22 is changed 3 ns later than the clock signal input to the scan register 22, the scan data input terminal SI of the scan register 23 receives the data 1 ns later than the clock signal of the scan register 23. Therefore, a subsequent data immediately after the change is not fetched. As a result, the signals at the positive logic output terminal Q of the scan register 22 and the negative logic output terminals NQ of the scan registers 23 and 24 attain values of 1, 0 and 0, respectively after three cycles of the clock signal. Thus, the circuit can be normally operated.

In this manner, the timing problem due to the fluctuation of the clock signal can be suppressed in this embodiment as compared with the conventional method.

In this embodiment, description is made on a scan register having two output terminals, i.e., a positive logic output terminal Q and a negative logic output terminal NQ. However, the invention can exhibit the same effects on a scan register having three or more output terminals, for example, including a positive logic output terminal Q, a negative logic output terminal NQ and another output terminal for a scan data.

Furthermore, any output terminal having the delay time of 2 ns or more in the fluctuation of a clock signal can attain the same effects, and hence, it is not always necessary to select the output terminal having the maximum delay time.

The data in a library are used as the delay time of a signal from the scan data input terminal SI of a scan register to respective output terminals, but the delay time can be that of a signal from the data input terminal 11 of FIG. 20 to the respective output terminals.

What is claimed is:

1. A method of designing a semiconductor integrated circuit comprising:
   an element connecting step of connecting one of plural output terminals of a first memory element with a scan data input terminal of a second memory element having a scan test function,
   wherein said element connecting step includes a step of:
      connecting one of said output terminals of said first memory element having a design margin larger than a predetermined value with said scan data input terminal of said second memory element, said design margin being obtained as a difference between one cycle time of a clock signal and propagation time required for a signal to travel from each of said output terminals of said first memory element to another memory element or an external output port.

* * * * *